(12) United States Patent
Kobayashi

(10) Patent No.: US 7,397,819 B2
(45) Date of Patent: Jul. 8, 2008

(54) PACKET COMPRESSION SYSTEM, PACKET RESTORATION SYSTEM, PACKET COMPRESSION METHOD, AND PACKET RESTORATION METHOD

(75) Inventor: Yoshikazu Kobayashi, Kanagawa (JP)

(73) Assignee: NEC Infrontia Corporation, Kanagawa (JP)

( * ) Notice: Subject to any disclaimer, the term of this patent is extended or adjusted under 35 U.S.C. 154(b) by 959 days.

(21) Appl. No.: 10/701,689

(22) Filed: Nov. 6, 2003

(65) Prior Publication Data

US 2004/0090989 A1 May 13, 2004

(30) Foreign Application Priority Data

| Nov. 8, 2002 | (JP) | ............... 2002-325455 |
| Nov. 8, 2002 | (JP) | ............... 2002-325456 |
| Jul. 22, 2003 | (JP) | ............... 2003-277668 |

(51) Int. Cl.
*H04J 3/16* (2006.01)
*H04J 3/24* (2006.01)

(52) U.S. Cl. ............ 370/469; 370/471; 370/474

(58) Field of Classification Search ............ 370/469, 370/471, 474
See application file for complete search history.

(56) References Cited

U.S. PATENT DOCUMENTS

| 5,627,829 | A * | 5/1997 | Gleeson et al. ............ 370/230 |
| 6,134,245 | A * | 10/2000 | Scarmalis ............ 370/474 |
| 6,594,276 | B1 * | 7/2003 | Le ............ 370/465 |
| 6,618,397 | B1 * | 9/2003 | Huang ............ 370/474 |
| 6,707,819 | B1 * | 3/2004 | Fraser et al. ............ 370/395.1 |
| 7,006,472 | B1 * | 2/2006 | Immonen et al. ............ 370/332 |
| 7,130,314 | B2 * | 10/2006 | Bunn et al. ............ 370/474 |
| 7,164,665 | B2 * | 1/2007 | Tourunen ............ 370/329 |
| 7,212,511 | B2 * | 5/2007 | Jonsson et al. ............ 370/338 |

(Continued)

FOREIGN PATENT DOCUMENTS

EP   1 056 259 A1   11/2000

(Continued)

OTHER PUBLICATIONS

Lars-Erik Jonsson and Ghyslain Pelletier Ericsson; "A Link-Layer Assisted ROHC Profile for IP/UDP/RTP"; IETF Standard-Working-Draft; Internet Engineering Task Force; vol. ROHC; Aug. 15, 2001.

(Continued)

*Primary Examiner*—Alpus H Hsu
(74) *Attorney, Agent, or Firm*—Sughrue Mion, PLLC

(57) ABSTRACT

A packet compression system of this invention includes: a reception unit for receiving at least one uncompressed packet, the uncompressed packet including a header and a payload of a second OSI layer, the payload of the second OSI layer including a header and a payload of a third OSI layer, the payload of the third OSI layer including a header and a payload of a fourth OSI layer, the payload of the fourth OSI layer including a codec signal; a compression unit for generating a compressed packet in which at least one the codec signal is inserted into the payload of the second layer without interposition of the third OSI layer and the fourth OSI layer by deleting the header of the third OSI layer and the header of the fourth OSI layer from the uncompressed packet; and a transmission unit for transmitting the compressed packet.

36 Claims, 44 Drawing Sheets

U.S. PATENT DOCUMENTS

| | | |
|---|---|---|
| 2002/0064164 A1 | 5/2002 | Barany et al. |
| 2002/0064190 A1* | 5/2002 | Sikora et al. ............... 370/537 |
| 2002/0105943 A1 | 8/2002 | Womack et al. |
| 2002/0146026 A1 | 10/2002 | Unitt et al. |
| 2004/0037317 A1* | 2/2004 | Zalitzky et al. ............. 370/466 |

FOREIGN PATENT DOCUMENTS

| | | |
|---|---|---|
| EP | 1 284 552 A2 | 2/2003 |
| JP | 59-112744 A | 6/1984 |
| JP | 8-97858 A | 4/1996 |
| JP | 10-224392 A | 8/1998 |
| JP | 11-234338 A | 8/1999 |
| JP | 11-261648 A | 9/1999 |
| JP | 2000-232455 A | 8/2000 |
| JP | 2001-57560 A | 2/2001 |
| JP | 2001-325166 A | 11/2001 |
| JP | 2002-9832 A | 1/2002 |
| JP | 2002-223246 A | 8/2002 |
| WO | WO 01/30045 A1 | 4/2001 |

OTHER PUBLICATIONS

Peter J. McCann and Tom Hiller, Lucent Technologies; "Requirements and Architecture for Header Stripping and Generation"; IETF Standard-Working-Draft; Internet Engineering Task Force; No. 2; Jun. 2001.

T. Hoshi, et al.; "Voice Stream Multiplexing between IP Telephony Gateways"; IEICE Transactions on Information and Systems; Information & Systems Society; Tokyo, JP; vol. E82-D, No. 4; Apr. 1999; pp. 838-845.

* cited by examiner

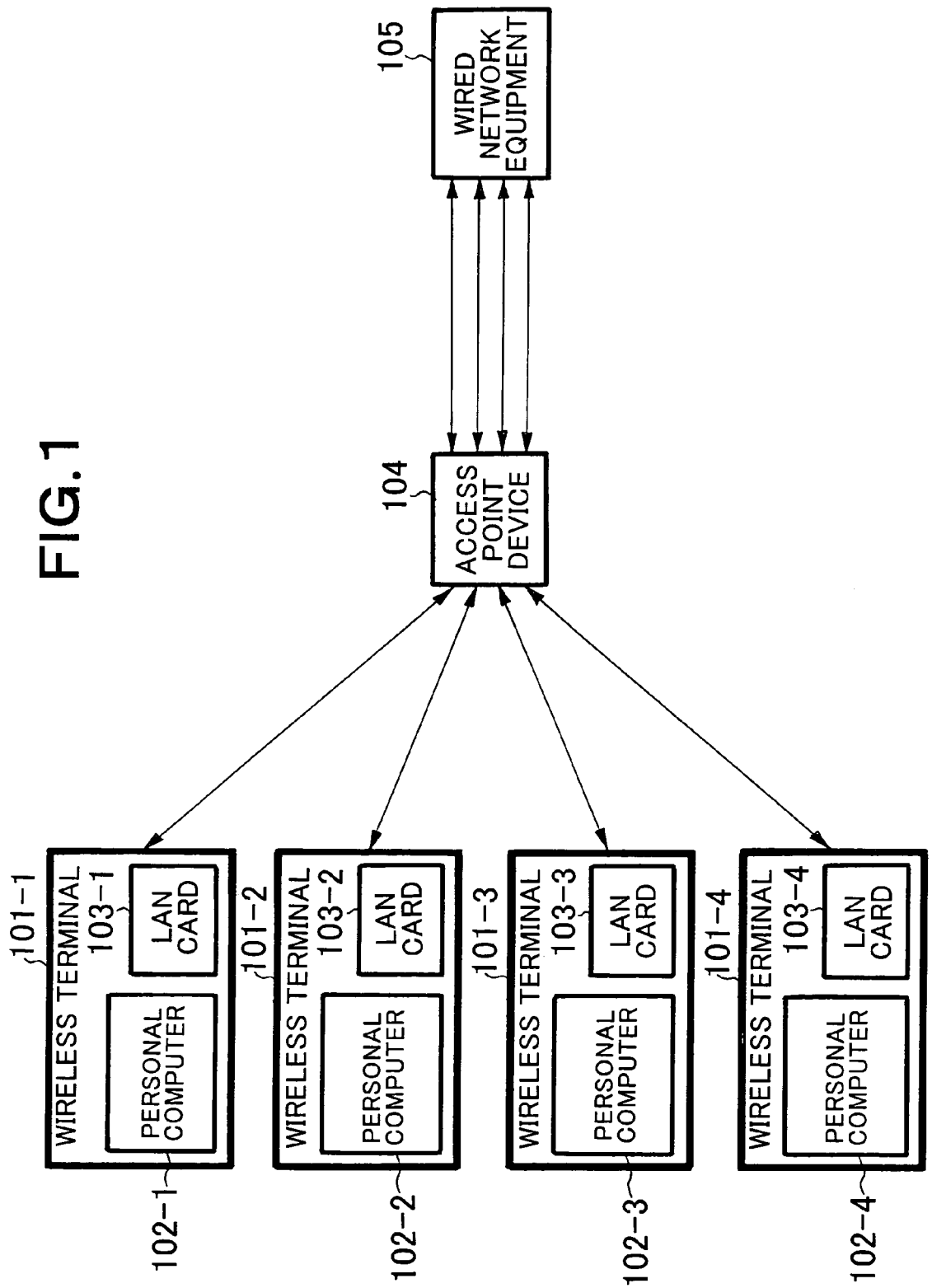

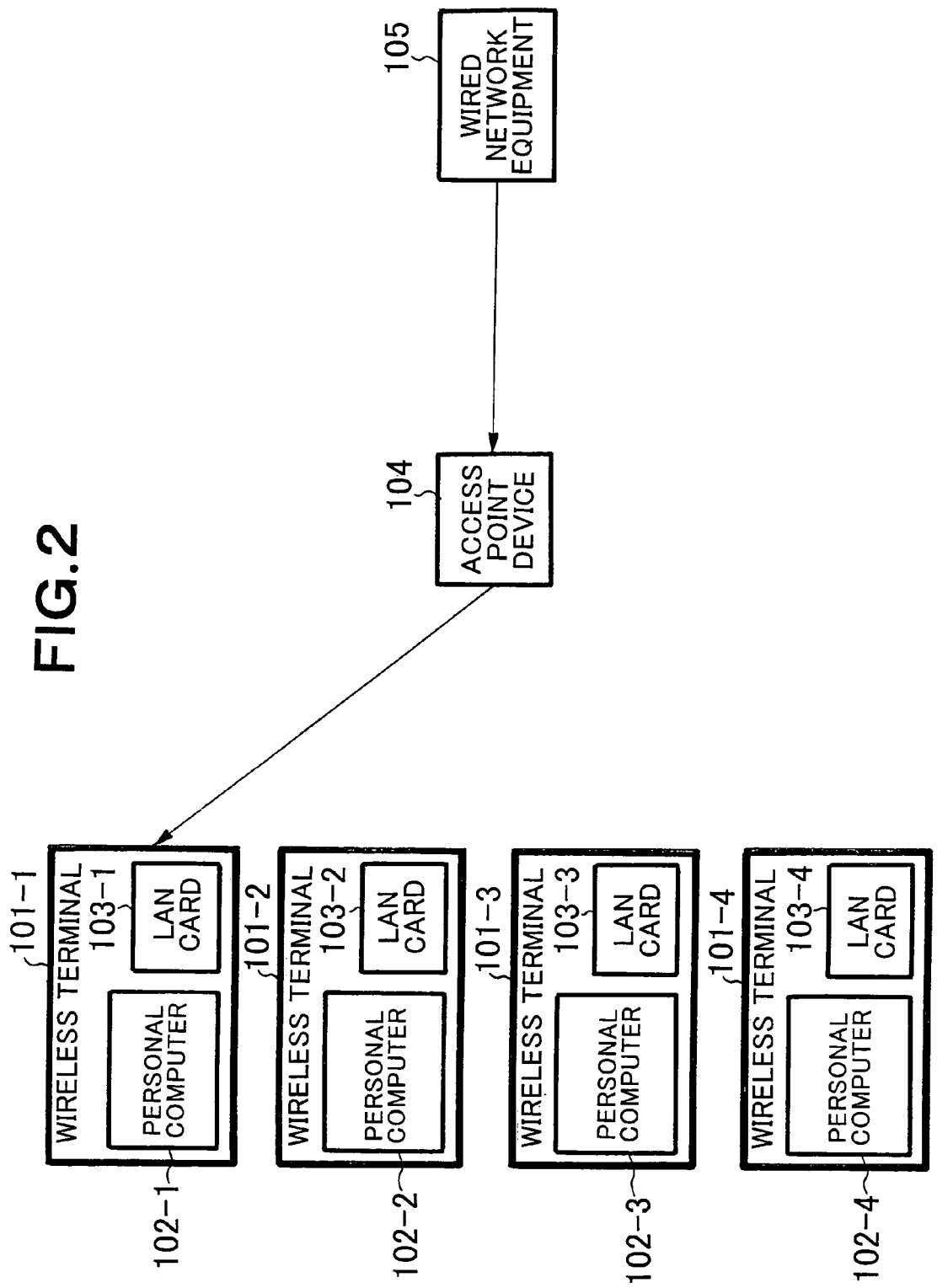

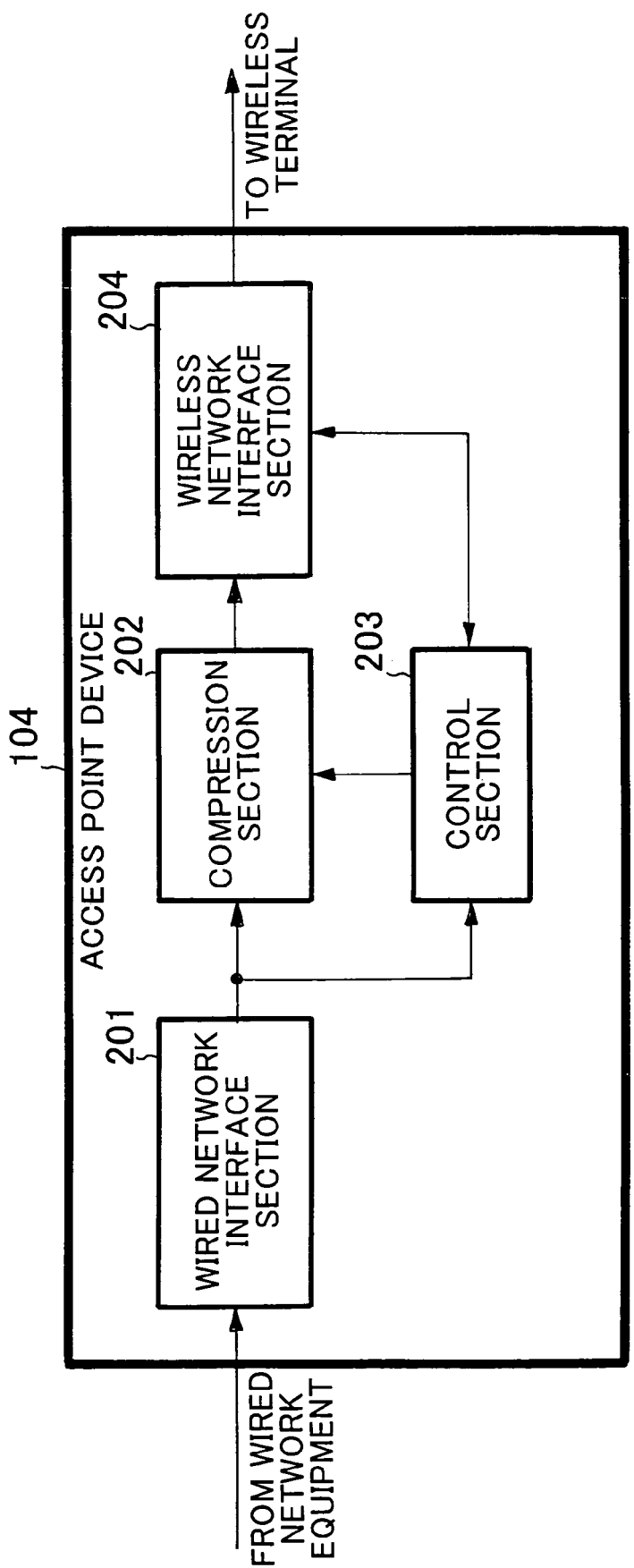

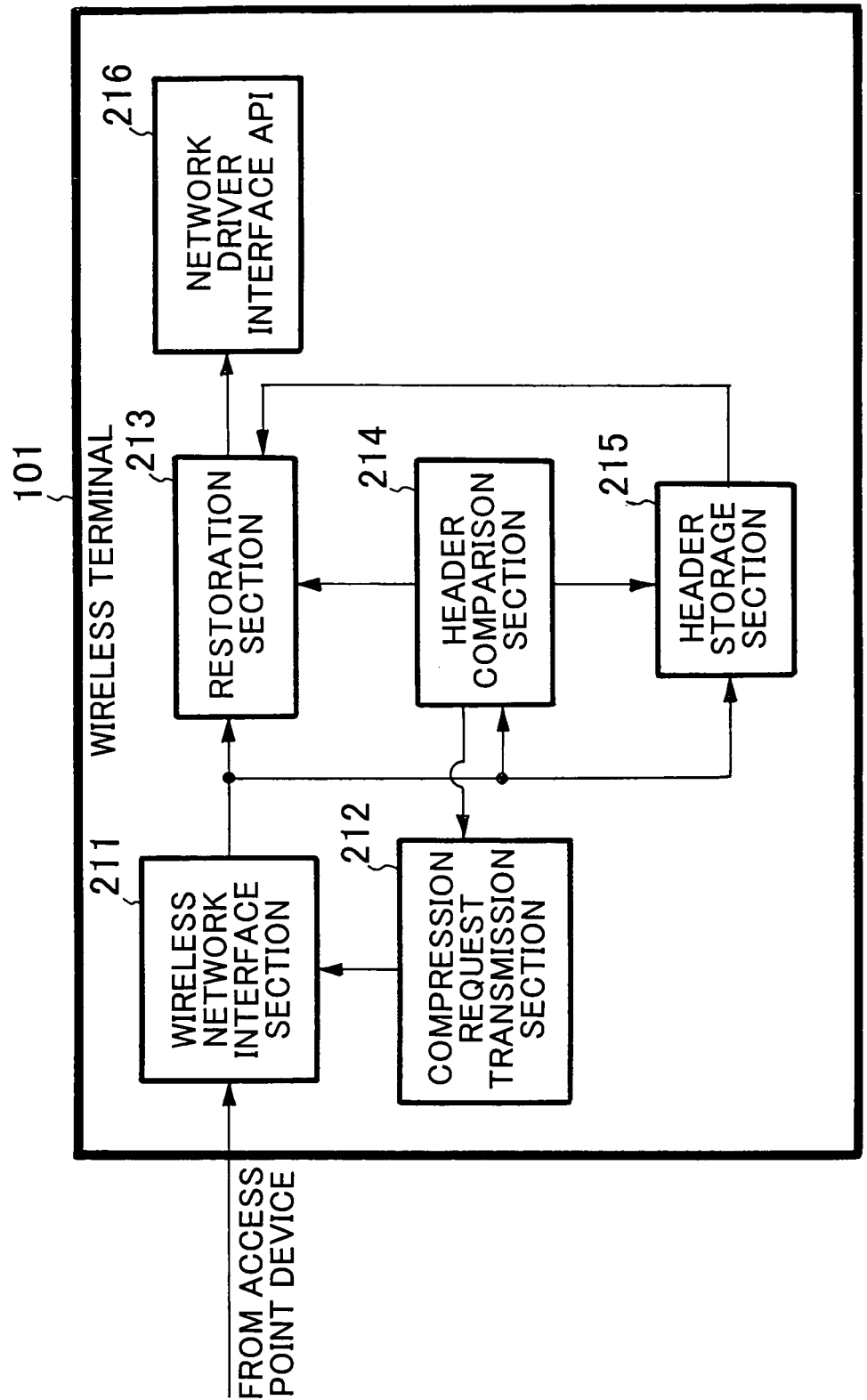

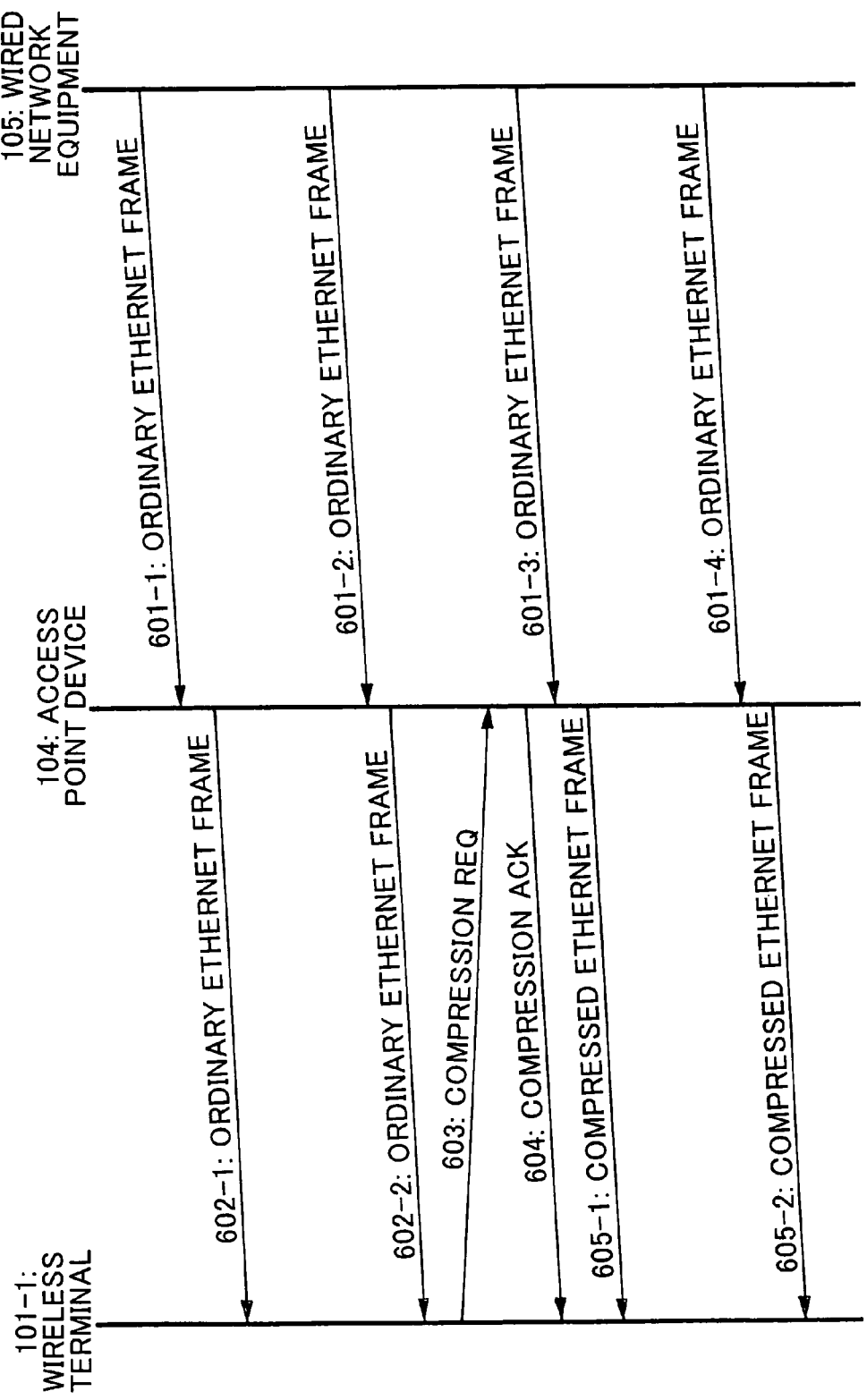

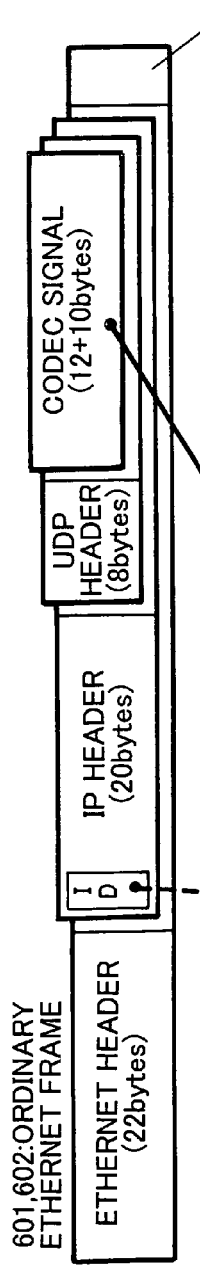
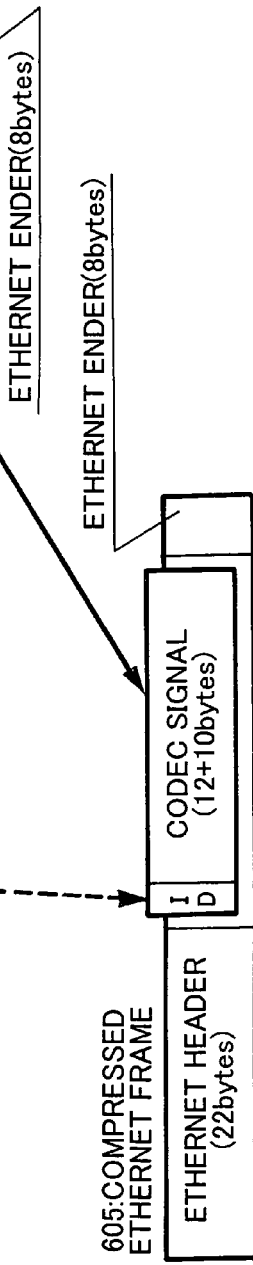
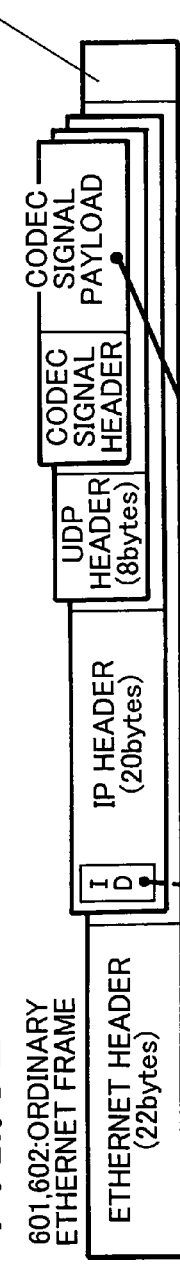
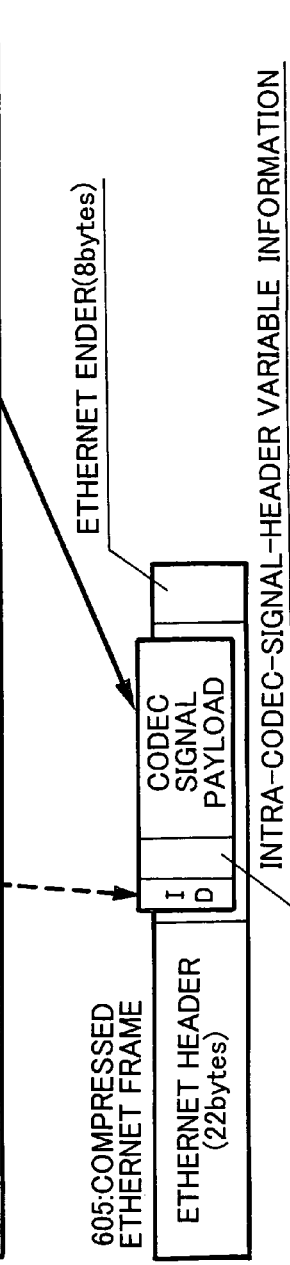
FIG.6A
FIG.6B

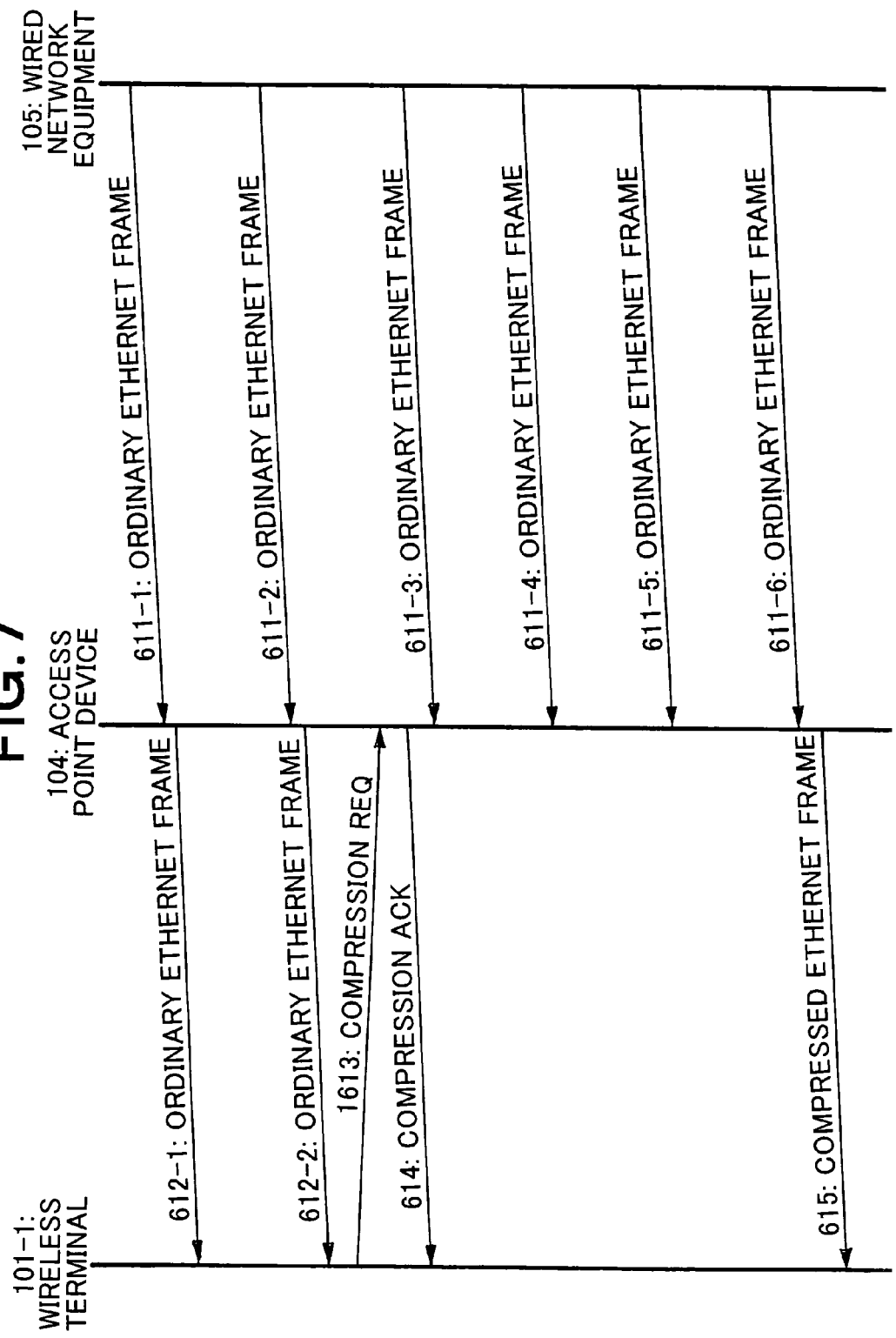

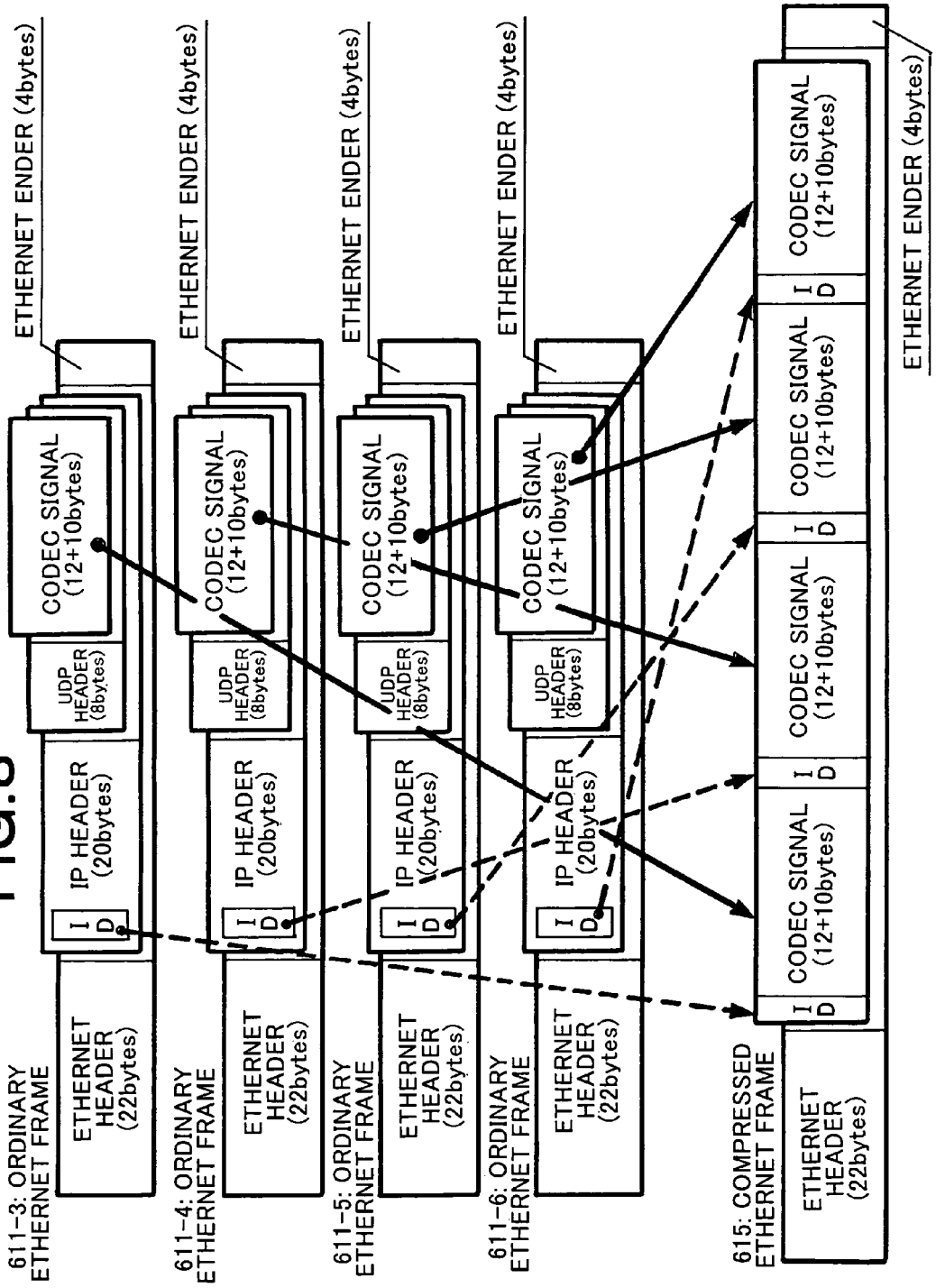

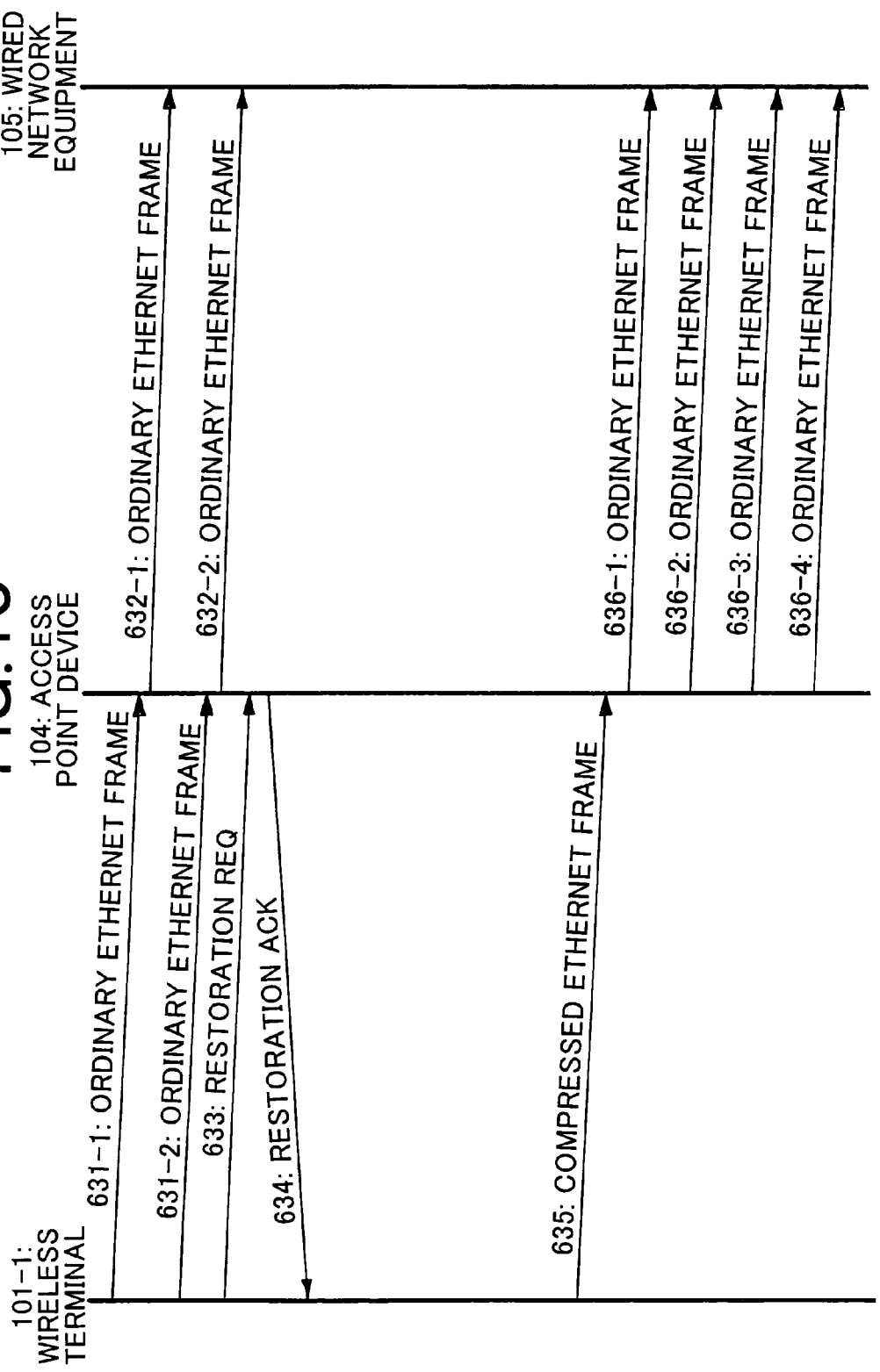

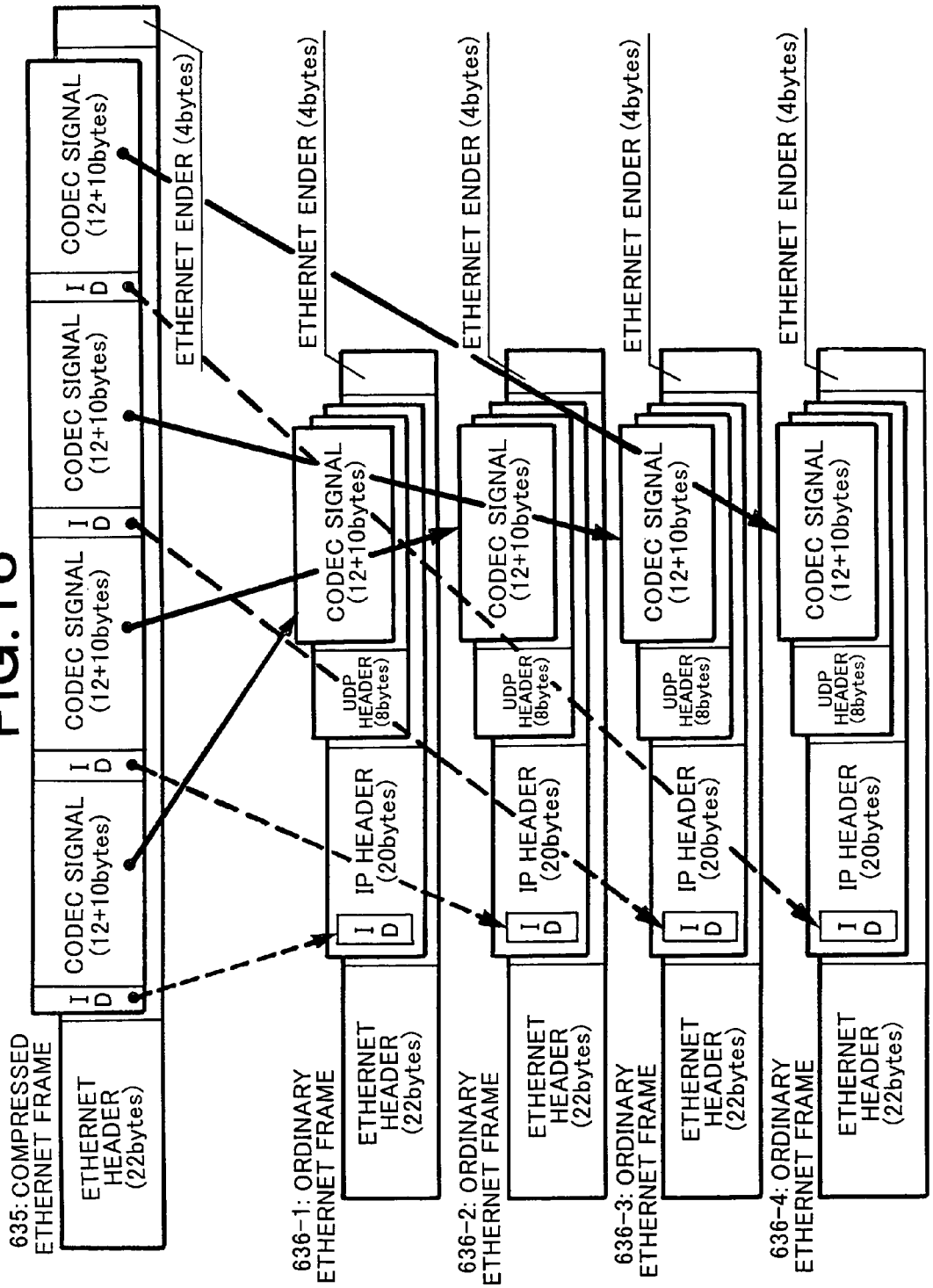

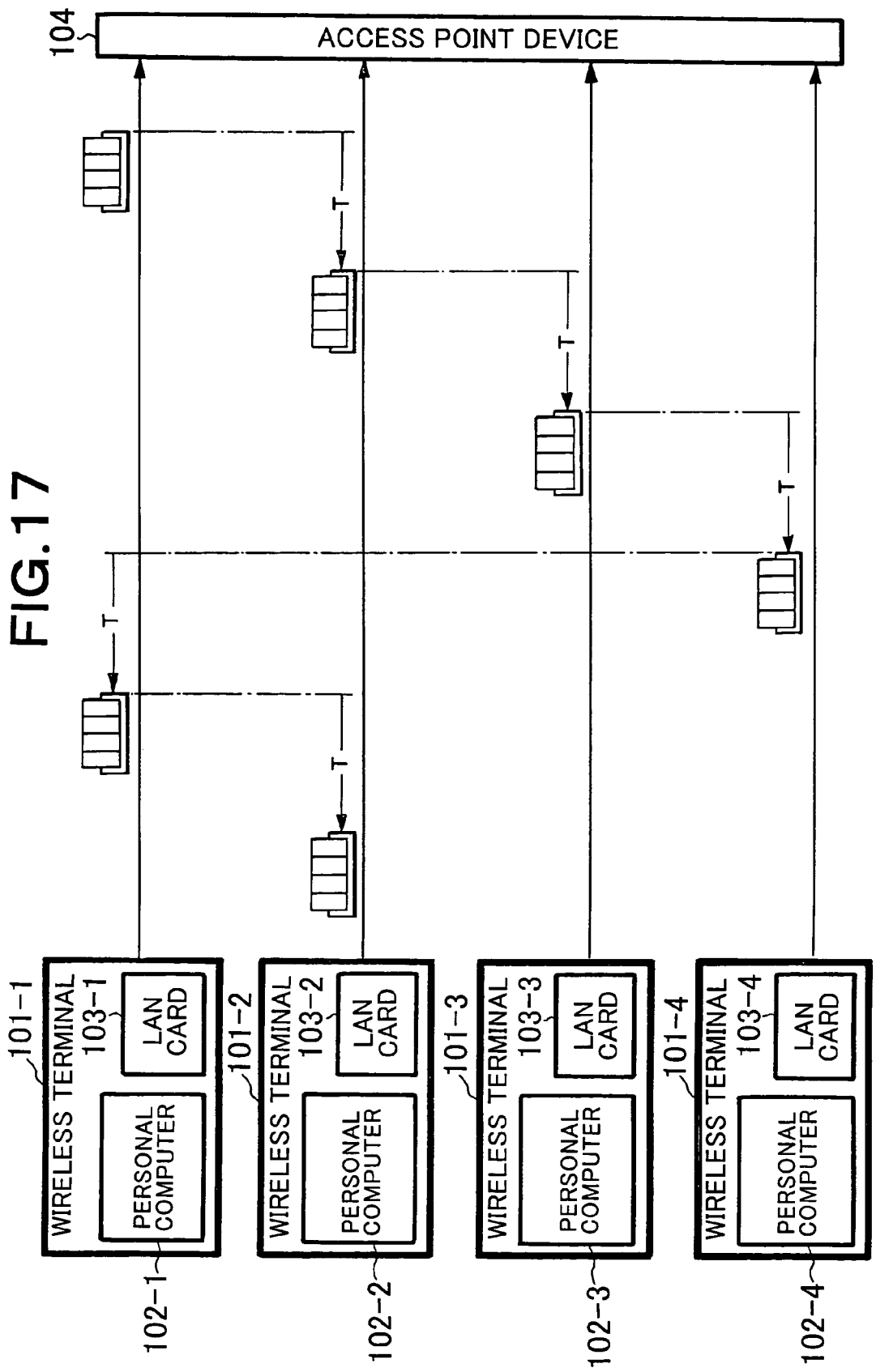

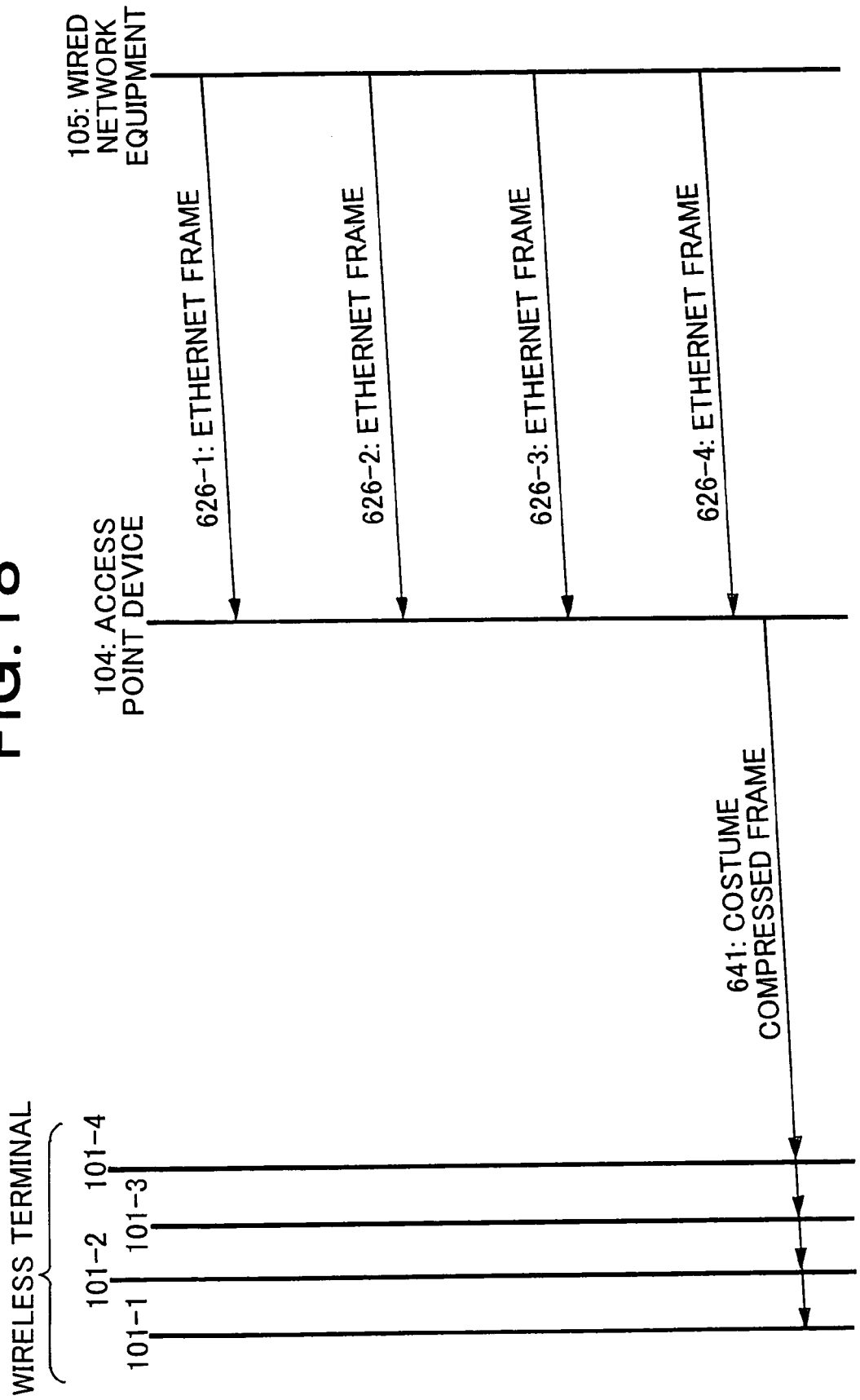

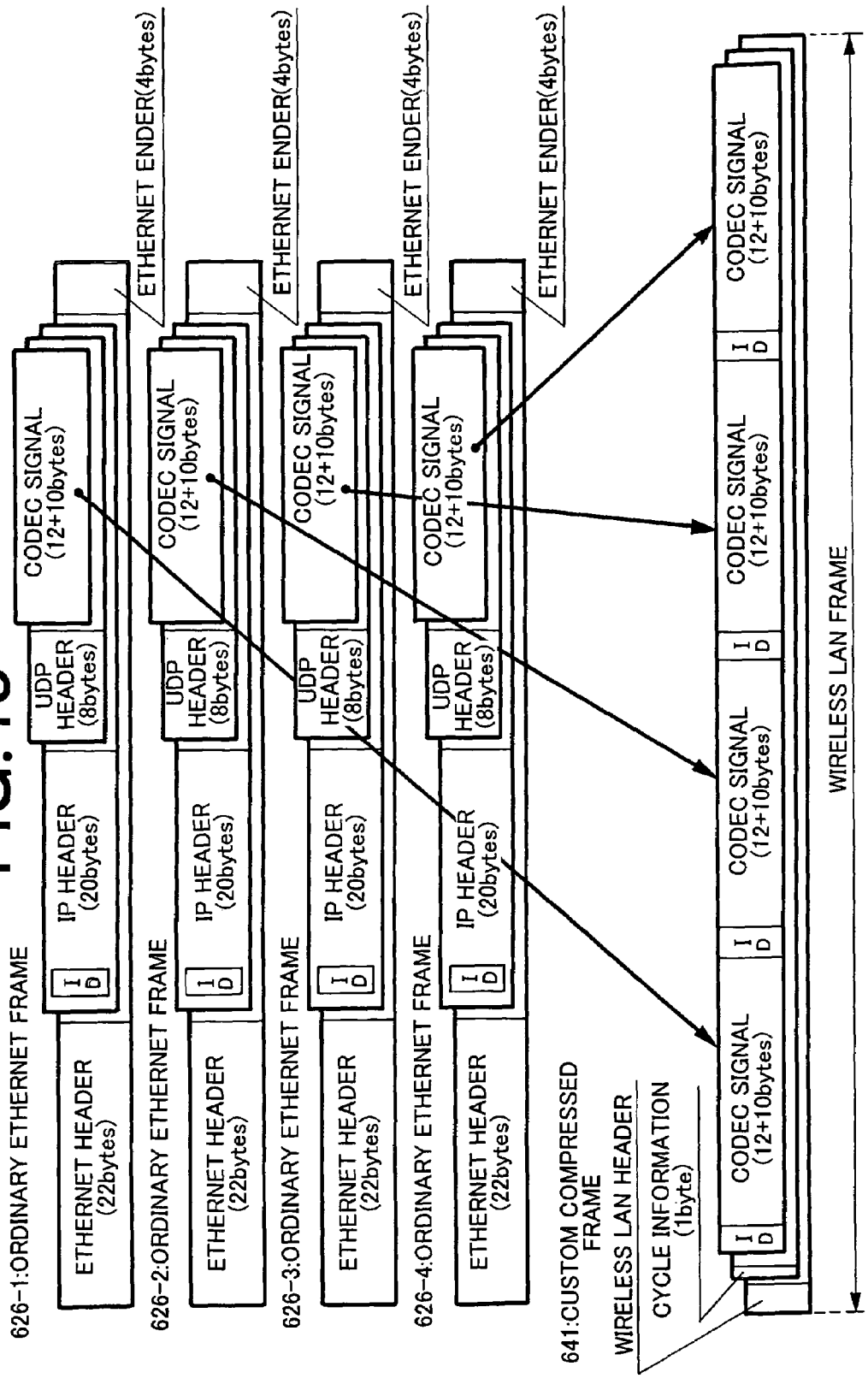

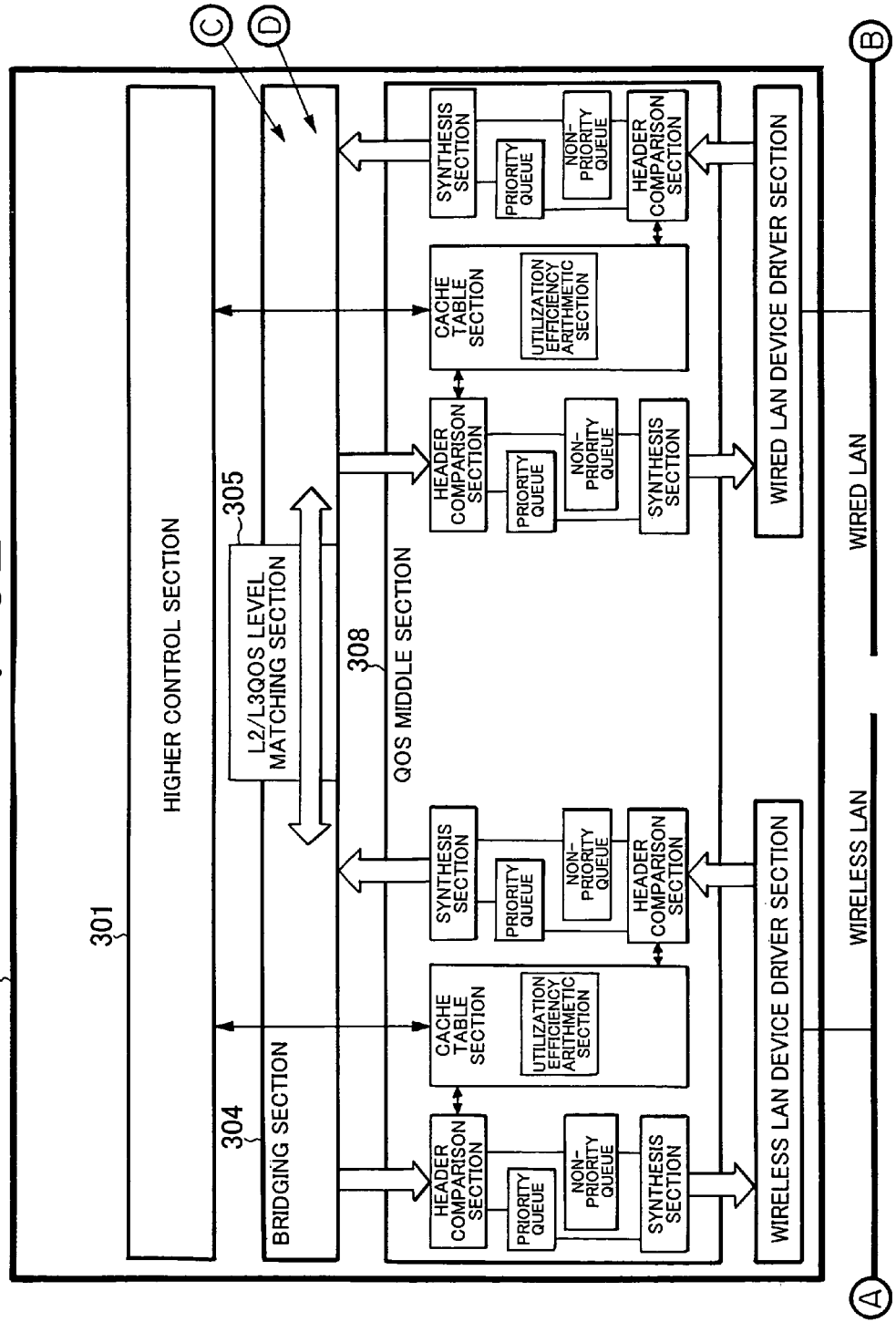

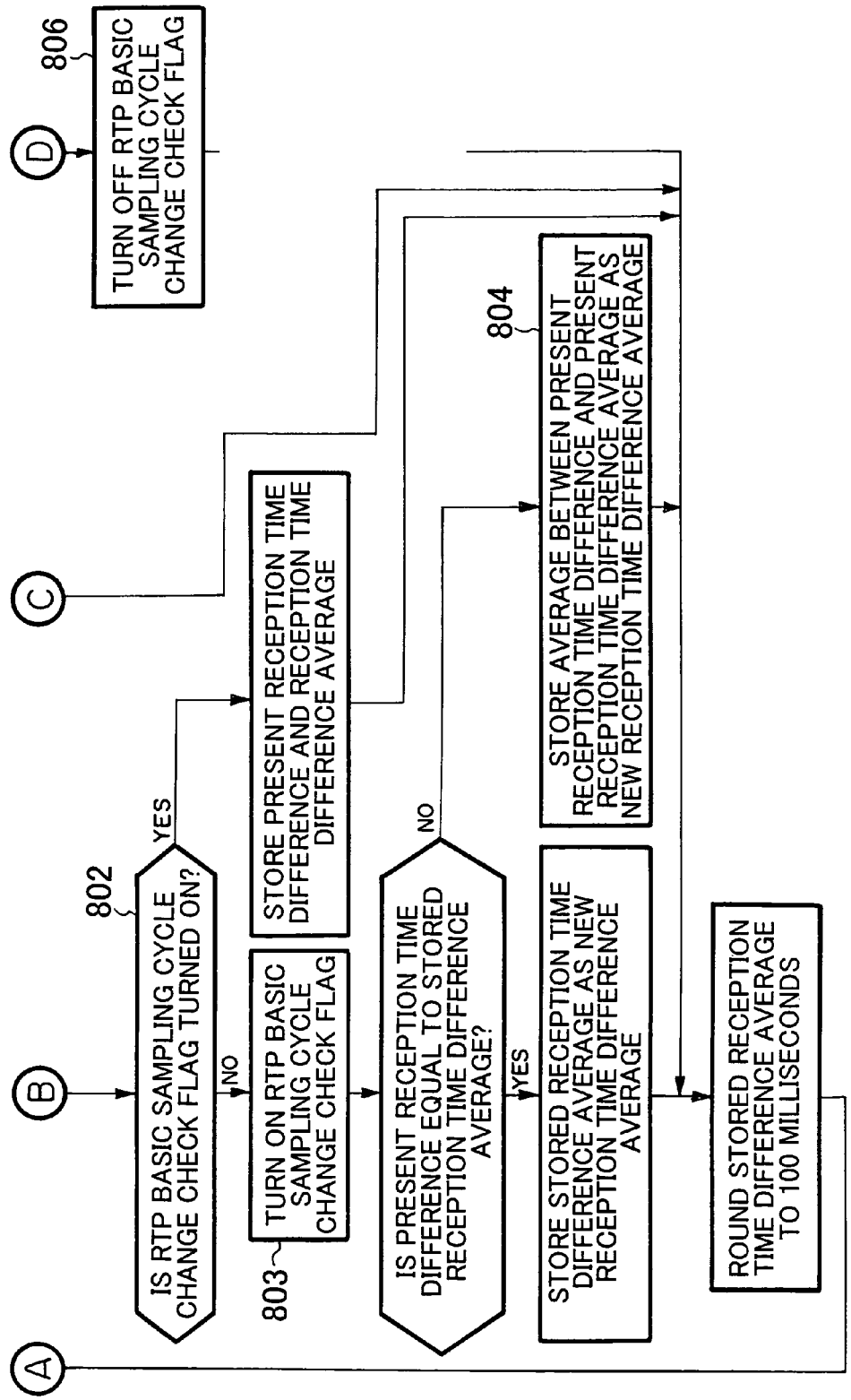

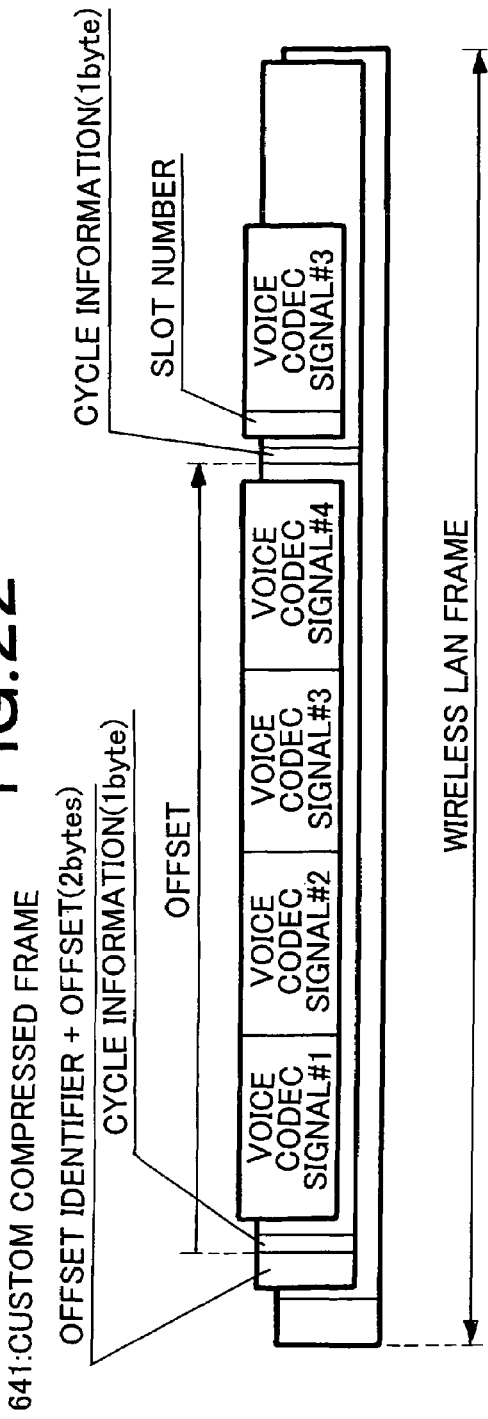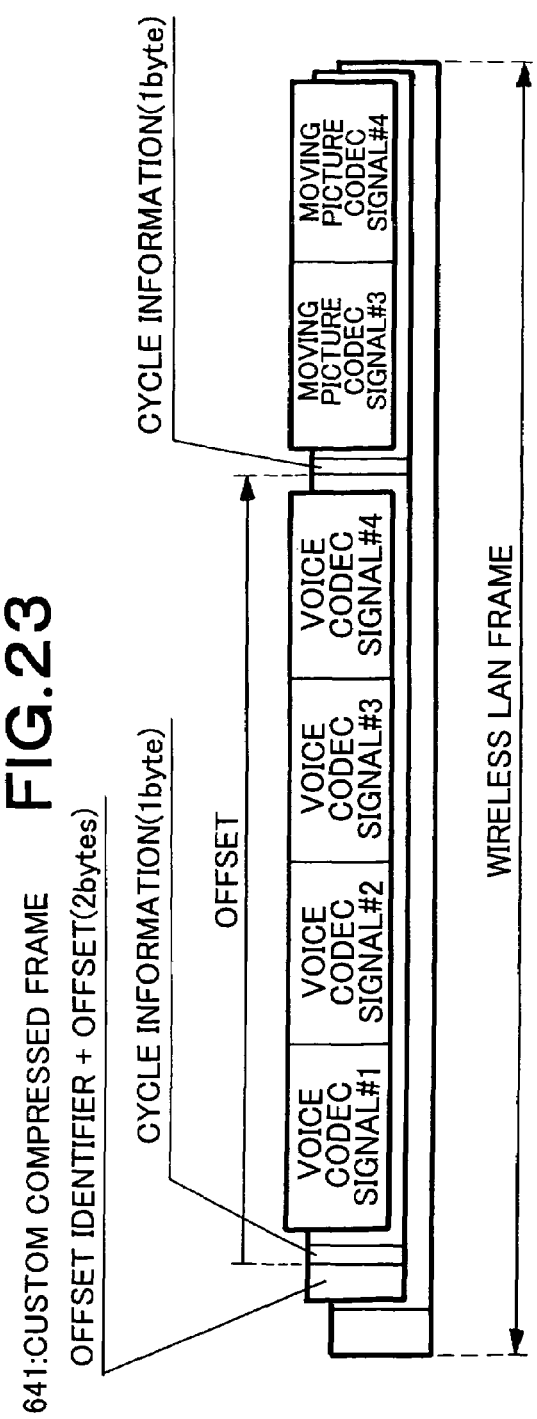

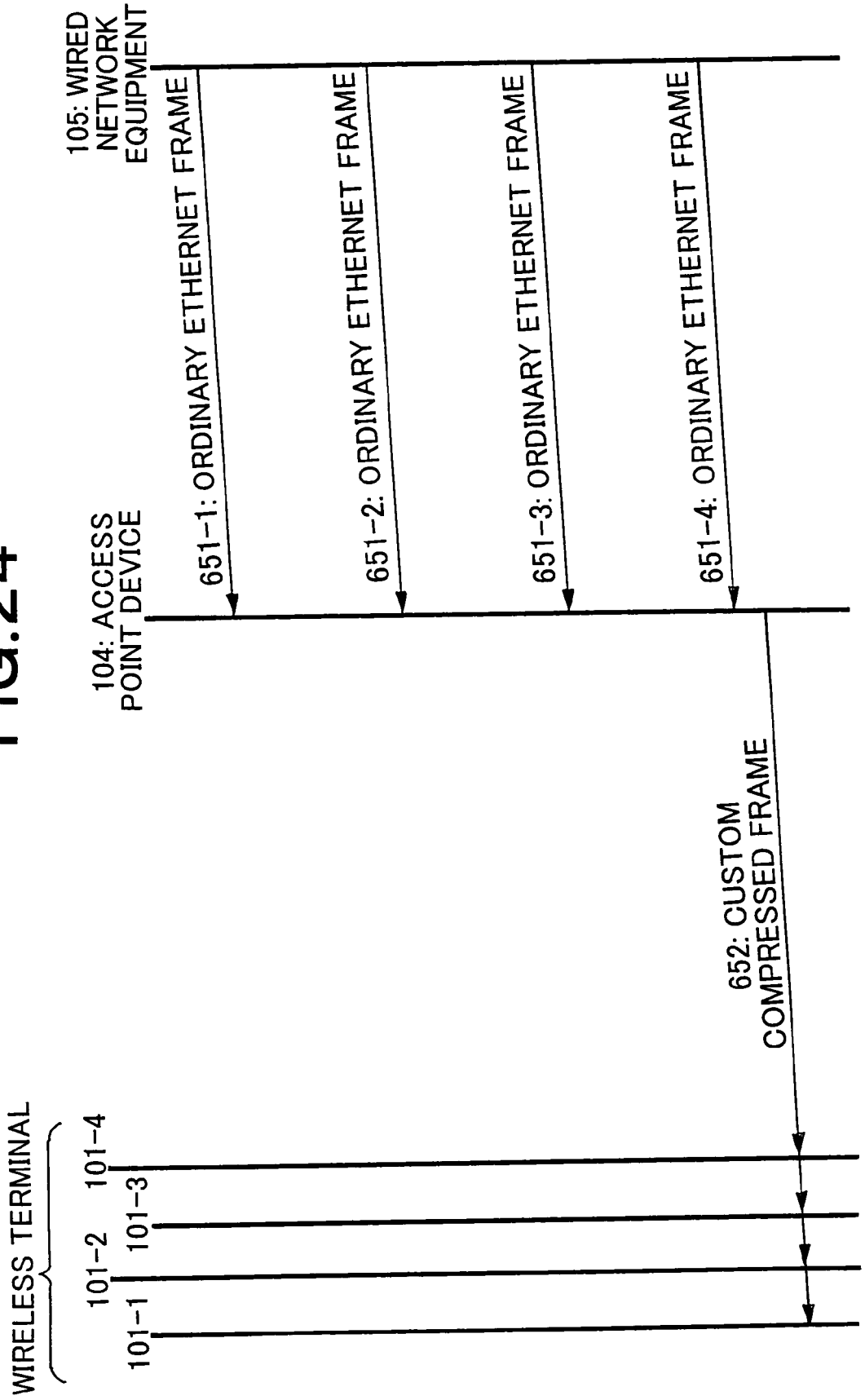

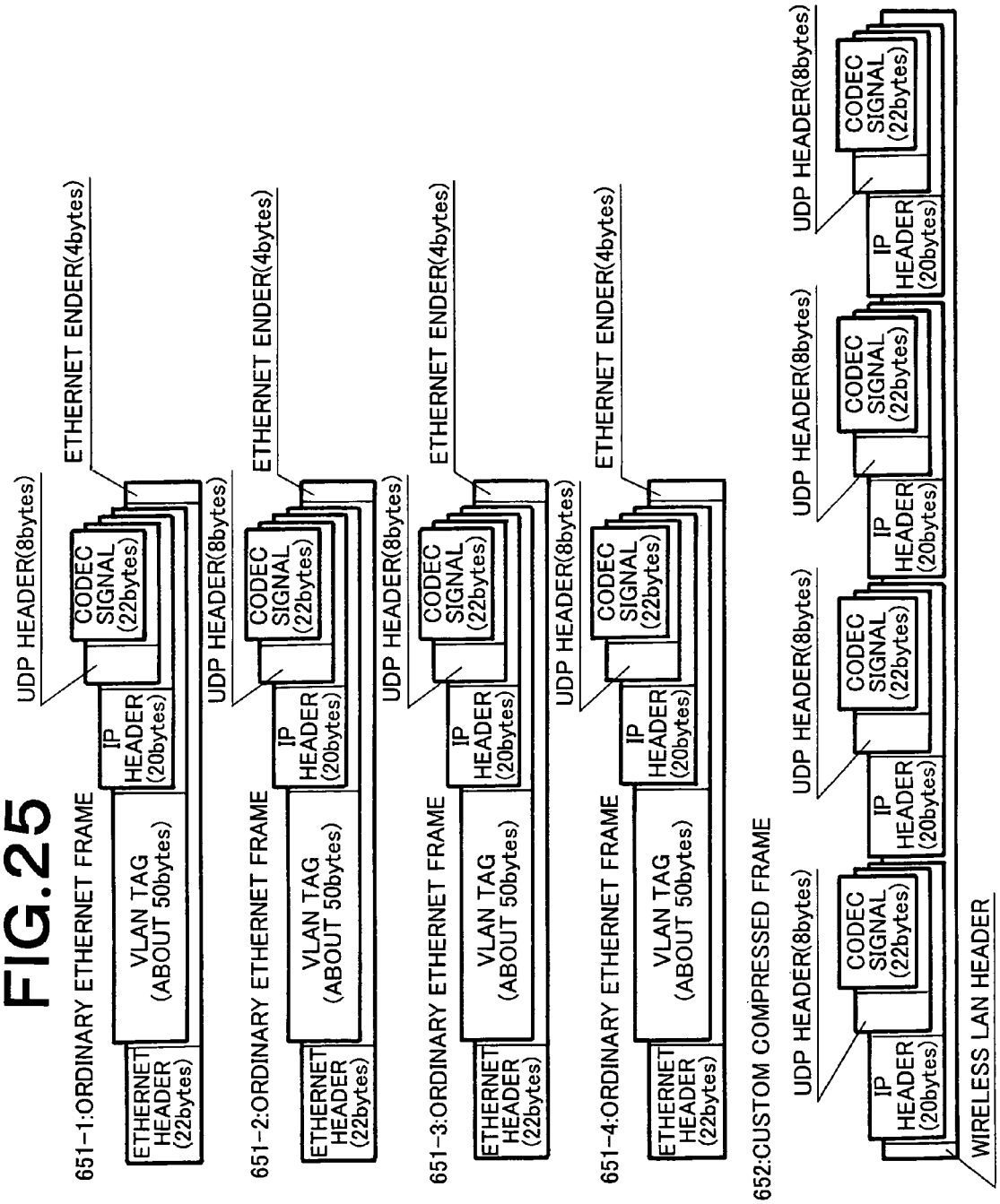

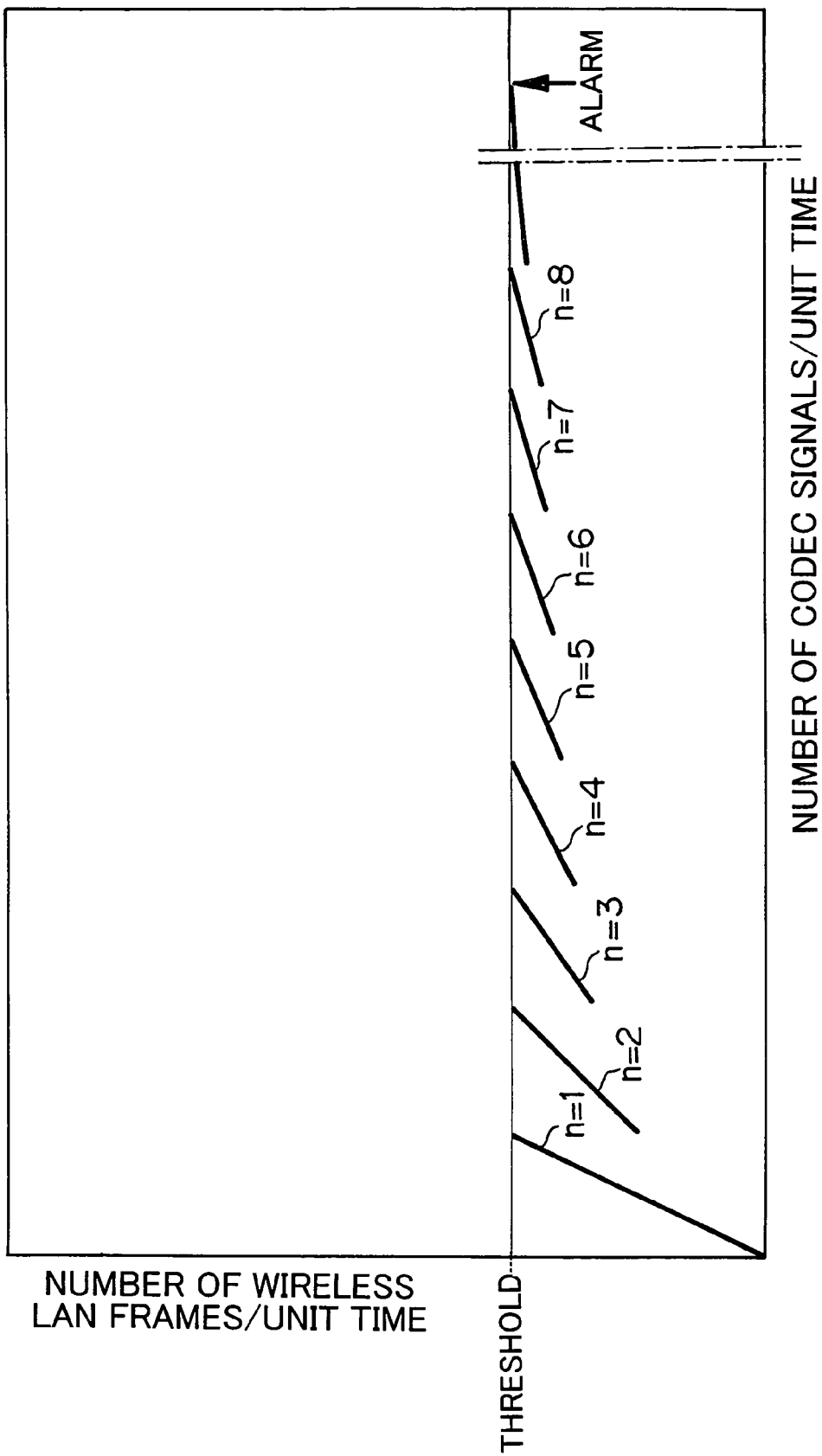

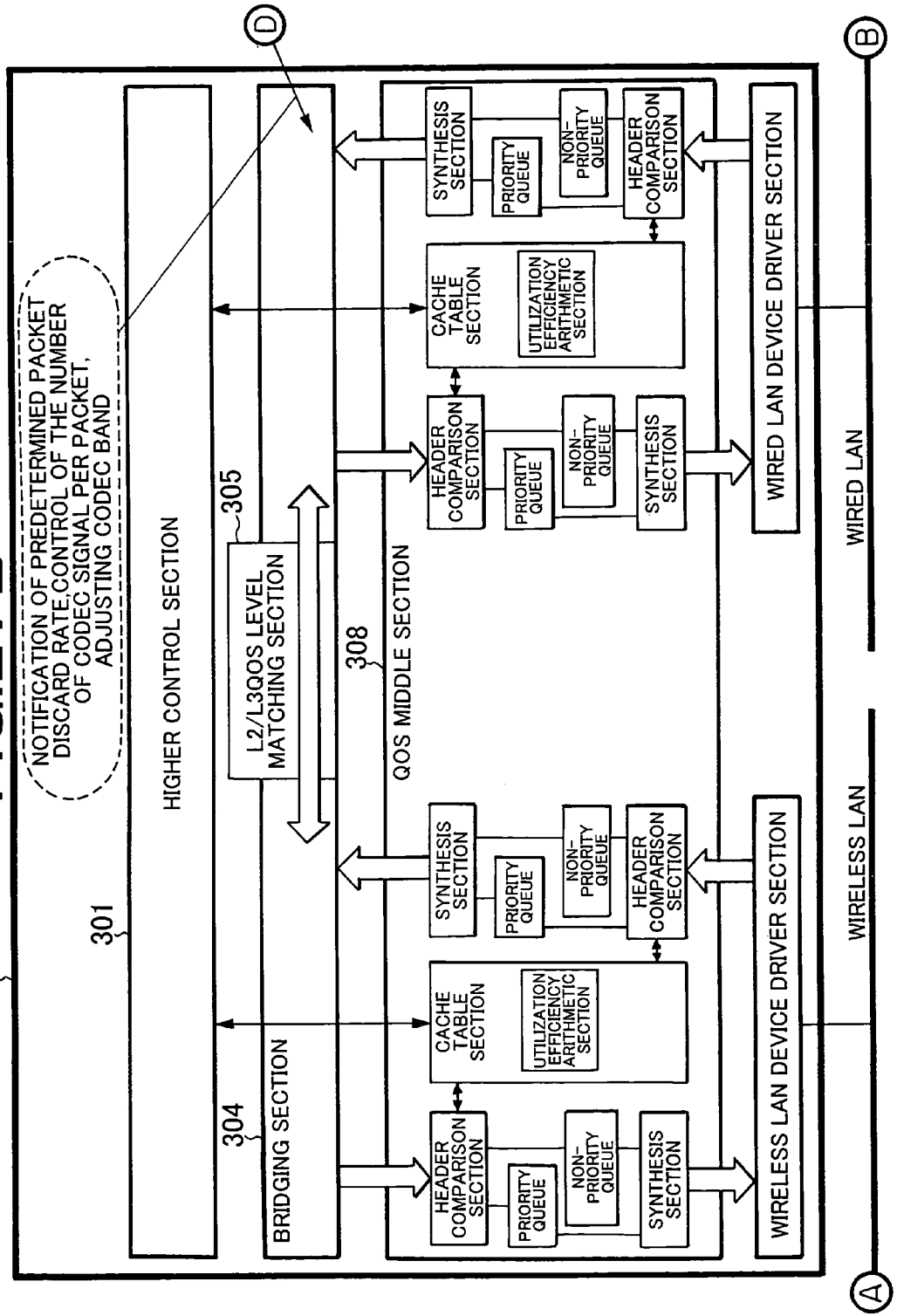

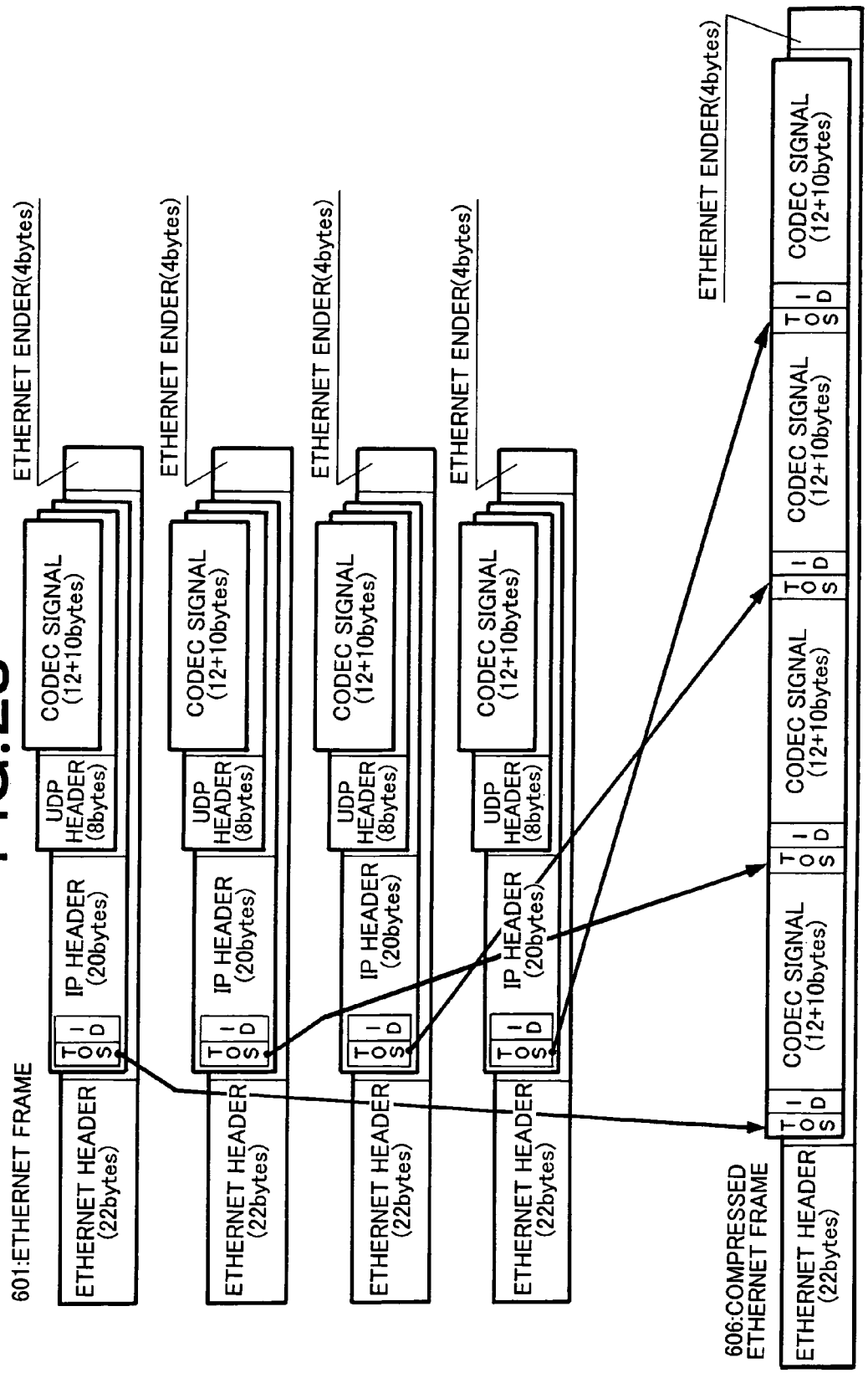

PACKET COMPRESSION SYSTEM, PACKET RESTORATION SYSTEM, PACKET COMPRESSION METHOD, AND PACKET RESTORATION METHOD

BACKGROUND OF THE PRESENT INVENTION

1. Field of the Present Invention

The present invention relates to a packet compression system for compressing a packet, a packet restoration system for restoring a packet compressed by the packet compression system, a packet compression method for compressing a packet, and a packet restoration method for restoring a packet compressed by the packet compression method. Specifically, the present invention relates to a packet compression system for compressing a packet which will be transmitted by a wireless LAN (Local Area Network) system, a packet restoration system for restoring a packet compressed by the packet compression system, a packet compression method for compressing a packet which will be transmitted by a wireless LAN system, and a packet compression method for compressing a packet compressed by the packet compression method. In addition, the present invention relates to a packet compression system for compressing a packet which will be transmitted between gateways or between inter-LAN connecting devices, a packet restoration system for restoring a packet compressed by the packet compression system, a packet compression method for compressing a packet which will be transmitted between gateways or between inter-LAN connecting devices, and a packet restoration method for restoring a packet compressed by the packet compression system.

2. Description of the Related Art

Recently, access point devices connecting a wireless LAN and a global area network such as the Internet have begun spreading at home, businesses and the like. Among these access point devices, what deals with an IP (Internet Protocol) telephone appears. Further, while the IP telephone is a dedicated device in one case, an OS of a personal computer supports functions of the IP phone in another case. The IP telephone uses a protocol such as a VoIP (Voice-over Internet Protocol). The VoIP normally uses a UDP/IP (User Datagram Protocol/Internet Protocol) as third and fourth OSI (Open Systems Interconnection) layers except for a time when the IP telephone is controlled. In addition, the VoIP uses an H.323 protocol, a SIP (Session Initiation Protocol) or the like as fifth and following OSI layers. The H.323 protocol or the SIP uses an RTP (Real-Time Transport Protocol) or the like for communication control, voice communication, and moving picture communication.

Further, voice data communication is held using the RTP or the like on the UDP/IP between wired LAN zones including gateways, inter-LAN connecting devices, and the like.

A prior art document of the present application is as follows:

Japanese Patent Application Laid-Open Publication No. 2001-325166.

In the conventional wireless LAN, in order to hold a VoIP communication between a wireless terminal and an access point device, only up to six wireless terminals can hold the VoIP communication even if all the other kinds of communications are not held.

According to, for example, IEEE (Institute of Electrical and Electronics Engineers) 802.11b, a normalized maximum total communication frequency is eleven Mbps. However, when a VoIP communication is held, a total used frequency band is actually at most about one Mbps.

These situations occur not only in a case where a voice communication is held using the VoIP but also in a case where a voice communication is held using the other protocol, and a case where a moving picture communication is held using a predetermined protocol.

Furthermore, because transmitting a codec signal in an RTP packet or the like in real time is important, the codec signal is short. Accordingly, an IP packet that includes the RTP packet is short, with the result that an occupation ratio of headers in the IP packet increases and transmission efficiency is disadvantageously deteriorated.

SUMMARY OF THE PRESENT INVENTION

It is, therefore, an object of the present invention to provide a packet compression system, a packet restoration system, a packet compression method, and a packet restoration method capable of efficiently transmitting a codec signal.

According to a first aspect of the present invention, there is provided a packet compression system comprising: reception means for receiving at least one uncompressed packet, the uncompressed packet including a header and a payload of a second OSI layer, the payload of the second OSI layer including a header and a payload of a third OSI layer, the payload of the third OSI layer including a header and a payload of a fourth OSI layer, the payload of the fourth OSI layer including a codec signal; compression means for generating a compressed packet in which at least one the codec signal is inserted into the payload of the second layer without interposition of the third OSI layer and the fourth OSI layer by deleting the header of the third OSI layer and the header of the fourth OSI layer from the uncompressed packet; and transmission means for transmitting the compressed packet.

The packet compression system may further comprise detection means for detecting the uncompressed packet in which the codec signal is inserted into the payload of the fourth OSI layer, and the compression means may generate the compressed packet based on the uncompressed packet of which the detection means detects that the codec signal is inserted into the payload of the fourth OSI layer.

In the packet compression system, the detection means may detect the uncompressed packet of which the codec signal is inserted into the payload of the fourth OSI layer at least based on a content of the header of the third OSI layer of the uncompressed packet and a content of the header of the fourth OSI layer of the uncompressed packet.

The packet compression system may further comprises notification reception means for receiving a notification of specific information on the uncompressed packet that should be transformed to the compressed packet, from a device comprising a packet restoration system, and the compression means may generate the compressed packet based on the uncompressed packet of which the notification is received from the device comprising the packet restoration system.

The packet compression system may further comprises insertion means for inserting an IP address of a device comprising a packet restoration system into the payload of the second OSI layer of the compressed packet.

In the packet compression system, the compression means may further delete a fixed part of a header of the codec signal.

In the packet compression system, the reception means may receive a plurality of uncompressed packets, each of which is addressed to each of a plurality of network terminals, the compression means may generate the compressed packet in which at least two the codec signals are inserted into the payload of the second OSI layer without interposition of the third OSI layer and the fourth OSI layer, and the transmission means may transmit the compressed packet to the plurality of network terminals.

In the packet compression system, the compression means may make the header of the second OSI layer of the compressed packet differ from the header of the second OSI layer of the uncompressed packet.

The packet compression system may further comprises means for detecting a cycle of the codec signal, and information on the detected cycle may be inserted into a header other than the header of the second OSI layer of the uncompressed packet.

In the packet compression system, the compression means may extract information varying for every uncompressed packets, the extracted information having been included in the header of the third OSI layer of the uncompressed packet, and inserts the extracted information into the payload of the second OSI layer of the compressed packet without interposition of the third OSI layer and the fourth OSI layer.

In the packet compression system, the packet compression system may be provided in each of a plurality of terminals, and the packet compression system may further comprise adjustment means for adjusting a timing for transmitting the compressed packet between the terminals.

In the packet compression system, the adjustment means may adjust the timing for transmitting the compressed packet between the terminals based on a synchronization signal transmitted to each of the terminals and a slot number allocated to each of the terminal.

In the packet compression system, the compression means may insert codec signals having different cycles into the compressed packet, insert cycle information for each of the cycles, and integrate the cycle information and the codec signals for each of the cycles.

In the packet compression system, the compression means may insert cycle information indicating a cycle of the codec signal into the payload of the second OSI layer of the compressed packet.

In the packet compression system, the compression means may adjust the number of codec signals inserted into the payload of the second OSI layer of the compressed packet so that the number of the compressed packets transmitted from the transmission means per unit time does not exceed a predetermined value irrespectively of the number of the uncompressed packets received by the reception means per unit time.

The packet compression system may further comprises control means for controlling one of a codec section and a VoIP section provided on an uncompressed packet transmission side to decrease a communication volume of the codec signal when the number of the compressed packets transmitted per unit time reaches a predetermined limit thereof and the number of codec signals included in each of the compressed packets reaches a predetermined limit thereof.

In the packet compression system, the compression means may insert a call control signal into the payload of the second OSI layer of the compressed packet without interposition of the third OSI layer and the fourth OSI layer.

The packet compression may further comprise means for calculating a transmission cycle of the compressed packet based on a reception cycle of the uncompressed packet.

The packet compression system may further comprise means for making a QoS of the compressed packet correspond to a QoS of the uncompressed packet.

According to a second aspect of the present invention, there is provided a packet compression system comprising: reception means for receiving an uncompressed packet, the uncompressed packet including a header and a payload of a second OSI layer, the payload of the second OSI layer including an MAC address-base VLAN packet; compression means for generating a compressed packet in which at least one the MAC address-base VLAN packet excluding a VLAN tag is inserted into the payload of the second OSI layer by deleting the VLAN tag from the uncompressed packet; and transmission means for transmitting the compressed packet.

According to a third aspect of the present invention, there is provided a packet restoration system comprising: reception means for receiving a compressed packet in which a codec signal is inserted into a payload of a second OSI layer without interposition of a third OSI layer and a fourth OSI layer; header insertion means for inserting a header of the third OSI layer and a header of the fourth OSI layer into the payload of the second OSI layer of the received compressed packet so as to include the codec signal in a payload of the fourth OSI layer.

The packet restoration system may further comprise transmission means for transmitting a compressed packet in which the codec signal is included in the payload of the fourth OSI layer.

The packet compression system may further comprise: detection means for detecting an uncompressed packet in which the codec signal is included in the payload of the fourth OSI layer, and request transmission means for transmitting a request of compressing the uncompressed packet of which the codec signal is inserted into the payload of the fourth OSI layer to a device comprising a packet compression system if the detection means detects the uncompressed packet.

In the packet compression system, the detection means may detect the uncompressed packet in which the codec signal is inserted into the payload of the fourth OSI layer at least based on a content of the header of the third OSI layer of the uncompressed packet and a content of the header of the fourth OSI layer of the uncompressed packet.

The packet restoration system may further comprise storage means for storing the header of the third OSI layer and the header of the fourth OSI layer of the uncompressed packet before the reception means receives the compressed packet, the uncompressed packet including a header and the payload of the second OSI layer, the payload of the second OSI layer including the header and a payload of the third OSI layer, the payload of the third OSI layer including the header and the payload of the fourth OSI layer, the payload of the fourth OSI layer including the codec signal, and the header insertion means may insert the header of the third OSI layer and the header of the fourth OSI layer stored in the storage means, into the payload of the second OSI layer of the received uncompressed packet.

According to the present invention, the ratio occupied by the IP header and the UPD header in the IP packet is reduced and the ratio occupied by the payload is increased. Therefore, codec signal transmission efficiency can be improved.

In addition, the technique of securing the number of actual communication packets while decreasing the number of packets is quite effective for the wireless LAN that depends on the number of packets and enables exceeding the number of times of communication by the conventional VoIP and ensuring communication quality.

BRIEF DESCRIPTION OF THE DRAWINGS

FIG. 1 is a conceptual view illustrating a wireless LAN system and a wired network connected to the wireless LAN system according to the present invention;

FIG. 2 is a conceptual view illustrating a transmission line in the first embodiment of the present invention;

FIG. 3 is a block diagram illustrating the configuration of an access point device in the first embodiment of the present invention;

FIG. 4 is a block diagram illustrating the configuration of a wireless terminal in the first embodiment of the present invention;

FIG. 5 is a sequence diagram for explaining operations in the first embodiment of the present invention;

FIGS. 6A and 6B illustrate formats of packets in the first embodiment of the present invention;

FIG. 7 is a sequence diagram for explaining operations in the second embodiment of the present invention;

FIG. 8 illustrates formats of packets in the second embodiment of the present invention;

FIG. 15 is a sequence diagram for explaining operations in the fourth embodiment of the present invention;

FIG. 16 illustrates formats of packets in the fourth embodiment of the present invention;

FIG. 17 illustrates operation timings in the fifth embodiment of the present invention;

FIG. 18 a sequence diagram for explaining operations in the sixth embodiment of the present invention;

FIG. 19 illustrates formats of packets in the sixth embodiment of the present invention;

FIGS. 20A, 20B and 20C form a block diagram illustrating configurations of a wireless terminal, an access point device, and a wired network device in the sixth embodiment of the present invention;

FIGS. 21A and 21B form a flow chart illustrating a method for deciding cycle information which will be inserted into a header in the sixth embodiment of the present invention;

FIG. 22 illustrates a format of a packet in a caser where two codec signals addressed to the same destination are inserted into one custom compressed frame in the sixth embodiment of the present invention;

FIG. 23 illustrates a format of another packet in the sixth embodiment of the present invention;

FIG. 24 is a sequence diagram for explaining operations in the seventh embodiment of the present invention;

FIG. 25 illustrates formats of packets in the seventh embodiment of the present invention;

FIG. 26 is a graph for explaining operations in the eighth embodiment of the present invention;

FIGS. 27A, 27B and 27C form a block diagram illustrating control in the ninth embodiment of the present invention;

FIG. 28 illustrates formats of packets in the tenth embodiment of the present invention;

DESCRIPTION OF THE PREFERRED EMBODIMENTS

Figure 9:
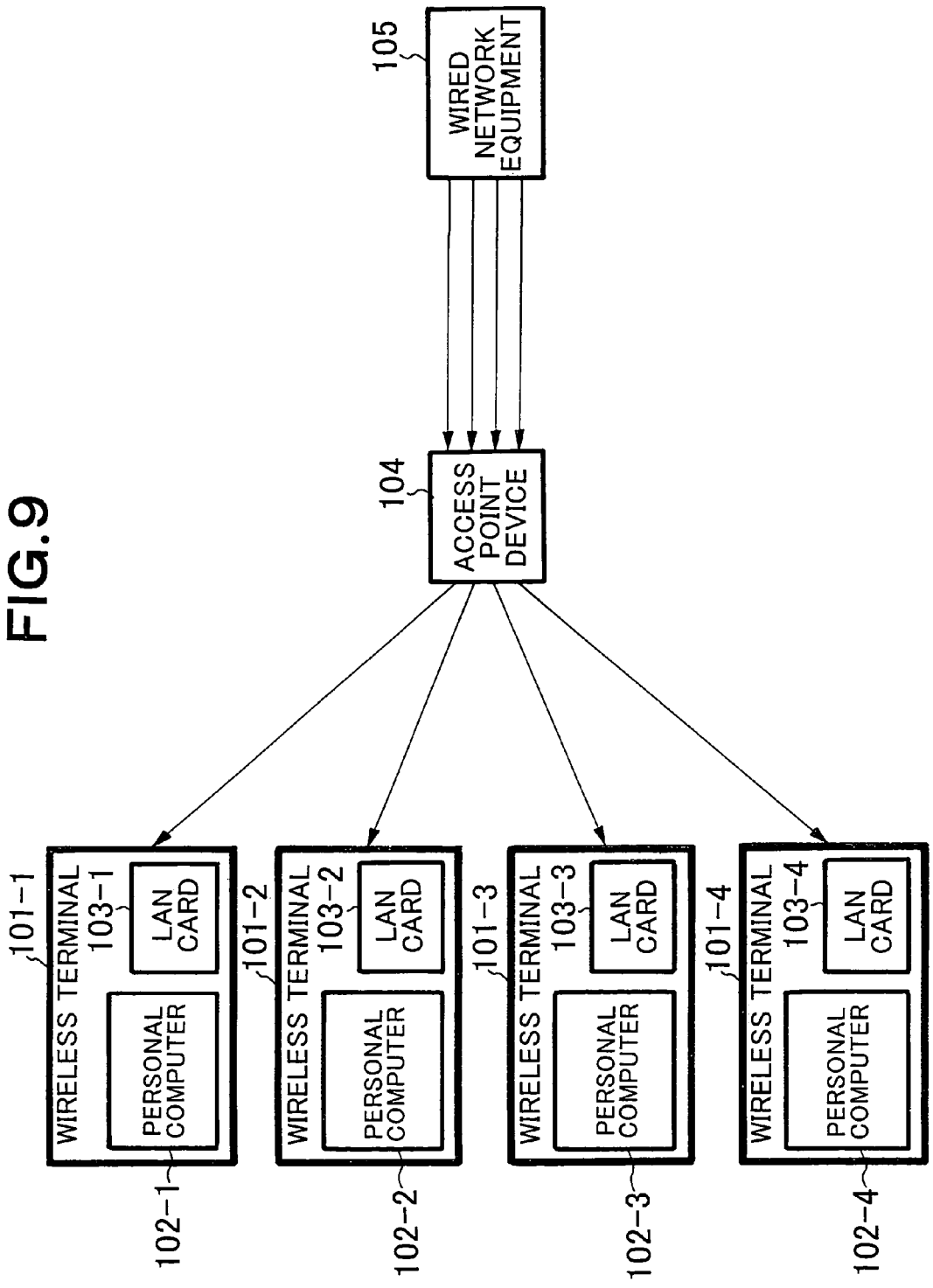
FIG. 9 is a conceptual view illustrating a transmission line in the third embodiment of the present invention.

Embodiments of the present invention will be described hereinafter in detail with reference to the drawings.

First Embodiment

FIG. 1 illustrates a wireless LAN system and a wired network equipment connected to the wireless LAN system in the first embodiment of the present invention.

Referring to FIG. 1, this wireless LAN system includes wireless terminals 101-1 to 101-4 and an access point device 104. The access point device 104 is connected to the wireless terminals 101-1 to 101-4 through a standardized wireless LAN according to IEEE802.11a, IEEE802.11b or the like. Each wireless terminal 101-$i$ (where i=1 to 4; the same shall apply hereafter) includes a personal computer 102-$i$ and a wireless LAN card 103-$i$. A wired network equipment 105 is connected to the access point device 104 through a wired LAN. Each of the wireless terminals 101-1 to 101-4 and the wired network equipment 105 has both of or one of a video codec and a voice codec installed therein. The wired network equipment 105 holds communication with the wireless terminals 101-1 to 101-4 for both of or one of video signals and voice signals (hereinafter, "codec signals"). Although not shown in the drawings, different wired network equipments as communication parties may be provided for the respective wireless terminals. The RTP, which is defined by RFC3267, is used for communication of real-time data including voice and video signals. The RTP is utilized for an interactive service such as a media on-demand or an Internet telephone. The application of the present invention is not limited to the RTP but the present invention may be also applied to other protocols for dealing with streaming or protocols for dealing with file communication.

Next, an example in which one wireless terminal 101-1 receives a codec signal from the wired network equipment 105 through the access point device 104, as shown in FIG. 2, will next be described.

FIG. 3 is a conceptual view illustrating important sections of the access point device 104 which are related to the first embodiment. Referring to FIG. 3, the access point device 104 includes a wired network interface section 201, a compression section 202, a control section 203, and a wireless network interface section 204. The wired network interface section 201 receives an Ethernet frame (which is an Ethernet frame that encapsulates the codec signal through an IP packet and a UDP packet) from the wired network equipment 105. The header compression section 202 deletes an IP header and a UDP header from an ordinary Ethernet frame that includes an IP address (in the IP header), a protocol number (in the IP header), and a port number (in the UDP header) which are designated by a compression request, so that the codec signal can be encapsulated directly in the Ethernet frame without interposition of the IP packet and the UDP packet, thereby shortening the Ethernet frame. That is, the header compression section 202 deletes them so that a fifth OSI layer is directly put on a second OSI layer. In the following description, a processing for deleting the IP header and the UDP header from the Ethernet frame that encapsulates the codec signal so as to encapsulate the codec signal directly into the Ethernet frame without interposition of the IP packet and the UDP packet will be referred to as "a compression of the Ethernet frame", and the Ethernet frame that directly encapsulates the codec signal without interposition of the IP packet and the UDP packet will be referred to as "a compressed Ethernet frame". The control section 203 controls the start of the compression of the Ethernet frame performed by the compression section 202 based on a request from the wireless terminal 101-1, and controls the end of the compression thereof based on a content of the received Ethernet frame. The wireless network interface section 204 encapsulates the compressed Ethernet frame that encapsulates the codec signal into a wireless LAN frame and transmits the wireless LAN frame to the wireless terminal 101-1.

FIG. 4 is a conceptual view illustrating important sections of the wireless terminal 101-$i$ related to the first embodiment. Referring to FIG. 4, the wireless terminal 101-$i$ includes a wireless network interface section 211, a compression request transmission section 212, a restoration section 213, a header comparison section 214, a header storage section 215, and a network driver interface API (Application Program Interface) 216. The wireless network interface section 211 receives the wireless LAN frame from the access point device 104. The header comparison section 214 makes a predetermined comparison related to headers and the like, as will be described later, and determines whether to start the compression of the Ethernet frame based on a comparison result. The header storage section 215 stores the IP header and the UDP header encapsulated into the present Ethernet frame when the header comparison section 214 determines to start compressing the Ethernet frame. The compression request transmission section 212 transmits a compression request, accompanied with designation of the IP address (in the IP header), the protocol number (in the IP header), and the port number (in the UDP header), to the control section 203 of the access point device 104 when the header comparison section 212 determines to start compressing the Ethernet frame. The restoration section 213 adds the IP header and the UDP header stored in the header storage section 215 to a region in front of the codec signal encapsulated into the compressed Ethernet frame, thereby restoring the IP packet. The network driver interface API 216 delivers the restored IP packet to a higher layer.

FIG. 5 is a sequence diagram illustrating operations of the wireless terminal 101-1, the access point device 104, and the wired network equipment 105 in the first embodiment. Referring to FIG. 5, the wired network equipment 105 regularly transmits ordinary Ethernet frames 601-1 to 601-4 to the access point device 104. The access point device 104 transfers the ordinary Ethernet frames 601-1 and 601-2, as ordinary Ethernet frames 602-1 and 602-2, to the wireless terminal 101-1, respectively. The header comparison section 214 of the wireless terminal 101-1 recognizes that the wireless terminal 101-1 receives the ordinary Ethernet frames 602-1 and 602-2 each encapsulating the codec signal. Accordingly, the header storage section 215 of the wireless terminal 101-1 stores the IP header and the UDP header described in the Ethernet frame 602-2, and the compression request transmission section 212 of the wireless terminal 101-1 transmits a compression request (compression REQ) 603, accompanied with designation of the IP address (in the IP header), the protocol number (in the IP header) and the port number (in the UDP header), to the access point device 104. In response to the compression request 603, the control section 203 of the access point device 104 transmits a compression acknowledgement (compression ACK) 604 to the wireless terminal 101-1. Thereafter, the compression section 202 of the access point device 104 compresses the ordinary Ethernet frames 601-3 and 601-4, and the wireless network interface section 204 of the access point device 104 transmits compressed Ethernet frames 605-1 and 605-2 to the wireless terminal 101-1. In the wireless terminal 101-1, the header comparison section 214 detects that the IP header is not present in a head of a payload of each Ethernet frame or, if the compression section 202 locally uses a slot for the type of the Ethernet header of the compressed Ethernet frame and sets an identifier for identifying that the frame is the compressed Ethernet frame in the slot, the header comparison section 214 detects the identifier, thereby recognizing the compressed Ethernet frames 605-1 and 605-2. If so, the restoration section 213 inserts the IP header and the UDP header stored in the header storage section 215 into each of the compressed Ethernet frames 605-1 and 605-2, thereby obtaining a restored IP packet.

FIG. 6A illustrates formats of the ordinary Ethernet frames 601 and 602 and a format of the compressed Ethernet frame 605. The ordinary Ethernet frames 601 and 602 are based on the standard. The IP header of each ordinary Ethernet frame includes an identifier (ID) which occupies $33^{rd}$ to $48^{th}$ bits. This identifier varies from Ethernet frame to Ethernet frame. For this reason, the identifier cannot be stored in the header storage section 215 and cannot be restored by the restoration section 213. Therefore, the compression section 202 extracts this identifier from the IP header and, as shown in FIG. 6A, inserts the extracted identifier into the payload of the compressed Ethernet frame 605. The restoration section 213 extracts the identifier inserted into the payload whenever the wireless terminal receives the compressed Ethernet frame 605, inserts the extracted identifier into the IP header stored in the header storage section 215, adds the IP header into which the identifier has been inserted as well as the UDP header, to the region in front of the codec signal, thereby restoring the IP packet. However, if the compressed Ethernet frame 605 is not retransmitted between the access point device 104 and the wireless terminal 101-1, the wireless terminal 101-1 may reproduce an individual pseudo-identifier. In that case, the identifier is not inserted into the compressed Ethernet frame 605.

Further, as shown in FIG. 6B, instead of inserting the entire codec signal into the payload of the compressed Ethernet frame 605, only the part (payload) of the codec signal excluding the head thereof may be inserted. In this case, variable information (time stamp and serial information) in the header part of the codec signal is inserted into the payload of the compressed Ethernet frame 605 similarly to the identifier in the IP header. The restoration section stores the header part (excluding the variable information) of the codec signal in advance before the compression starts. By doing so, when the compression starts, the restoration section is able to restore the codec signal based on the codec signal excluding the header thereof and the variable information in the header part of the codec signal which are included in the compressed Ethernet frame 605, and the header part (excluding the variable information) of the codec signal which has been stored beforehand.

The first-half 12 bytes of the codec signal are provided for an RTP header and a sum of the twelve bytes and the bytes of a CSRC (Contribution Source Identifier) is 20 bytes. In case of a G.729 codec, the second-half ten bytes of the codec signal are provided for actual data. The number of bytes for the actual data changes according to the payload header.

If receiving at least two Ethernet frames equal in sender IP address, destination IP address, protocol number, sender port number, and destination port number, then the header comparison section 215 determines to start compressing the Ethernet frames. Alternatively, the header comparison section 215 may determine whether to start compressing the Ethernet frames by checking a value, pattern, or sequence of at least one of a sender MAC address, a destination MAC address, an RTP header, an RTCP, the SIP header for VoIP, an H.248 (MEGACO) header, an H.323 header, an HTML (Hyper Text Markup Language) header, an SNMP (Simple Network management Protocol) header, and a COPS (Common Open Policy Service).

Furthermore, the header comparison section 214 may determine whether the Ethernet frame includes the UDP header and the RTP header while ignoring the IP header of the frame. If the Ethernet frame includes these headers, the header comparison section 214 may store the Ethernet header, the IP header (except for the identifier), the UDP header, and the RTP header of the Ethernet frame including the UDP header and the RTP header. If the terminal device receives the Ethernet frame having an Ethernet header, an IP header (except for the identifier), a UDP header, and an RTP header equal to the stored headers, the header comparison section 214 may specify an IP address, a protocol number, and a port number included in the received Ethernet frame, thereby determining to start compressing the Ethernet frame. Further, the header comparison section 214 may determine whether the Ethernet frame includes the RTP header while ignoring the IP header and the UDP header of the frame. If the Ethernet frame includes the RTP header, the header comparison section 214 may store the Ethernet header, the IP header (except for the identifier), the UDP header, and the RTP header of the Ethernet frame including the RTP header. If the terminal device receives the Ethernet frame having an Ethernet header, an IP header (except for the identifier), a UDP header, and an RTP header (except for a timestamp and a sequence number) equal to the stored headers, the header comparison section 214 may specify an IP address, a protocol number, and a port number included in the received Ethernet frame, thereby determining to start compressing the Ethernet frame. Furthermore, the header comparison section 214 may assume that the Ethernet frame includes the RTP header by determining that the Ethernet frames have the same sender IP, the same destination IP, and the same UDP port number. The header comparison section 214 may grasp a port number while checking RTP path setting information on the H.323, SIP or H.248 header, and determine to start compressing Ethernet frames based on the sender IP address, the destination IP address, and the grasped port number (in the UDP header) of each frame.

The control section 203 of the access point device 104 causes the compression section 202 to end the compression of the Ethernet frame when, for example, the Ethernet frame including the header(s) to be deleted by the compression section 202 does not arrive for predetermined time. Alternatively, the control section 203 may cause the compression section 202 to end the compression of the Ethernet frames when the wireless terminal 101-1 logs in the access point device 104 again. The wireless terminal 101-1 is notified of the end of the compression by a predetermined disconnecting packet.

Alternatively, the control section 203 may cause the compression section 202 to end the compression of the Ethernet frame when an overload, a reset or the like occurs.

While the example of transmitting voice or moving picture data according to the RTP has been described above, the present invention can be also applied to the transmission of the voice or moving picture data according to other protocols. Furthermore, the present invention can be applied to the transmission of cyclic data transmitted according to the RTP or other protocols.

In the above description, the compression request signal includes the designation of the IP address, the protocol number, and the port number, and the compression section 202 compresses the Ethernet frame having the designated IP address, protocol number and port number. Alternatively, the compression section 202 may detect the MAC address of the wireless terminal which has transmitted a compression request signal, search an ordinary Ethernet frame addressed to the MAC address and including the latest codec signal, thereby compressing a future ordinary Ethernet frame having an IP address, a protocol number, and a port number equal to those included in the searched ordinary Ethernet frame.

Second Embodiment

According to the prior art, the access point device 104 transfers ordinary Ethernet frames to the wireless terminal 101-1 as they are. In addition, according to the prior art, the number of Ethernet frames which one wireless LAN frame can include is one and the number of wireless LAN frames which one access point device can transmit per unit time is limited to a predetermined number or less. Due to this, conventionally, if the number of bytes of a codec signal included in the Ethernet frame transmitted from the wired network equipment to the access point device is small, the wireless bandwidth of the wireless LAN system cannot be effectively utilized. In case of the VoIP, in particular, since the number of bytes included in one codec signal is small in the prior art, this disadvantage is conspicuous. The second embodiment of the present invention is intended to solve this disadvantage.

FIG. 7 is a sequence diagram illustrating operations of the wireless terminal 101-1, the access point device 104, and the wired network equipment 105 in the second embodiment according to the present invention. Referring to FIG. 7, the wired network equipment 105 sequentially transmits ordinary Ethernet frames 611-1 to 611-6 addressed to the wireless terminal 101-1, to the access point device 104. The access point device 104 transfers the ordinary Ethernet frames 611-1 and 611-2 to the wireless terminal 101-1 as ordinary Ethernet frames 612-1 and 612-2, respectively. In addition, the header comparison section 214 of the wireless terminal 101-1 recognizes the reception of the ordinary Ethernet frames 612-1 and 612-2 each of which encapsulates a codec signal thereinto. Accordingly, the header storage section 215 of the wireless terminal 101-1 stores the IP header and the UDP header described in the Ethernet frame 612-2, and the compression request transmission section 212 transmits a compression request (compression REQ) 613 to the access point device 104. In response to the compression request 613, the control section 203 of the access point device 104 transmits a compression acknowledgement (compression ACK) 614 to the wireless terminal 101-1. Thereafter, the compression section 202 of the access point device 104 directly inserts codec signals included in the ordinary Ethernet frames 611-3, 611-4, 611-5, and 611-6 into the payload of one Ethernet frame without interposition of an IP packet and a UDP packet to generate a compressed Ethernet frame 615, and transmits the compressed Ethernet frame 615 to the wireless terminal 101-1. In the wireless terminal 101-1, the header comparison section 214 detects that an IP header is not present in the head of the payload of the Ethernet frame or, if the compression section 202 locally uses a slot for the type of the Ethernet header of the compressed Ethernet frame and sets an identifier for identifying that the frame is the compressed Ethernet frame in the slot, the header comparison section 214 detects the identifier, thereby recognizing the compressed Ethernet frame 615. If so, the restoration section 213 inserts the IP header and the UDP header stored in the header storage section 215 into the compressed Ethernet frames 615, thereby obtaining a restored IP packet.

The retransmission control such as retry may be specially intensified for the compressed Ethernet frame.

FIG. 8 illustrates the formats of the ordinary Ethernet frames 611-3 to 611-6 and the format of the compressed Ethernet frame 615. The IP header of each ordinary Ethernet frame includes an identifier (ID) which occupies $33^{rd}$ to $48^{th}$ bits. This identifier varies from Ethernet frame to Ethernet frame. Due to this, the identifier cannot be stored in the header storage section 215 and cannot be restored by the restoration section 213. Therefore, the compression section 202 extracts this identifier from the IP header and, as shown in FIG. 8, inserts the extracted identifier into the payload of the compressed Ethernet frame 615. The restoration section 213 extracts the identifier inserted into the payload whenever the wireless terminal 101-1 receives the compressed Ethernet frame 615, inserts the extracted identifier into the IP header stored in the header storage section 215, and adds the IP header into which the identifier has been inserted as well as the UDP header to a region in front of the codec signal, thereby restoring the IP packet. However, if the compressed Ethernet frame is not retransmitted between the access point device 104 and the wireless terminal 101-1, the wireless terminal 101-1 may reproduce an individual pseudo-identifier. In that case, the identifier is not inserted into the compressed Ethernet frame 615.

In the second embodiment, the number of Ethernet frames transmitted from the access point device 104 can be decreased. From another point of view, the number of bytes of a codec signal included in one wireless LAN frame can be increased. In the second embodiment, therefore, the wireless bandwidth of the wireless LAN system can be effectively utilized.

Third Embodiment

In the first and second embodiments, the example in which one wireless terminal 101-1 receives codec signals has been described. In the second embodiment, a plurality of wireless terminals 101-1 to 101-4 receive codec signals as shown in FIG. 9.

Figure 10:
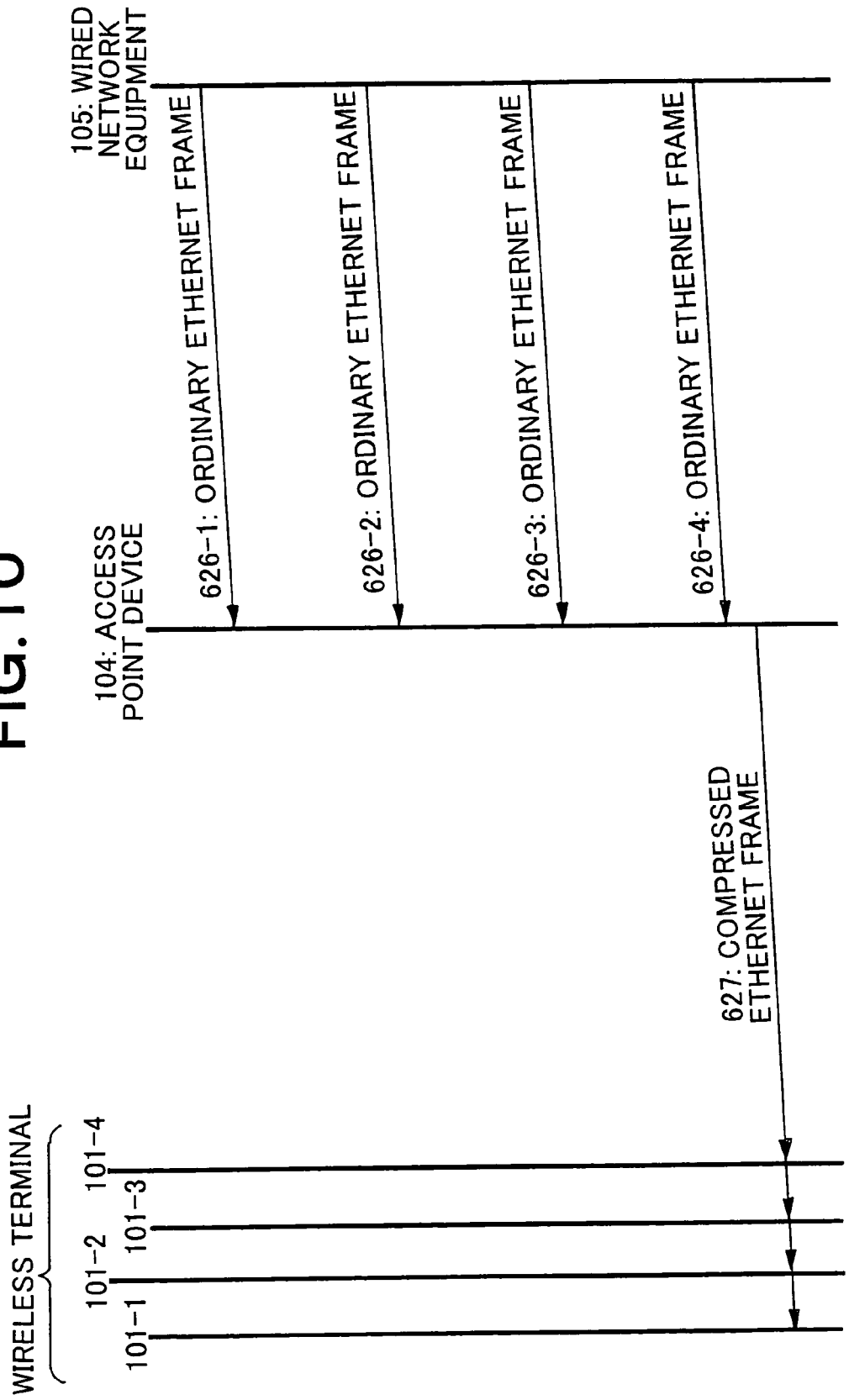
FIG. 10 is a sequence diagram for explaining operations in the third embodiment of the present invention.

FIG. 10 is a sequence diagram illustrating operations in the third embodiment. Referring to FIG. 10, the wired network equipment 105 transmits an ordinary Ethernet frame 626-1 addressed to the wireless terminal 101-1, an ordinary Ethernet frame 626-2 addressed to the wireless terminal 101-2, an ordinary Ethernet frame 626-3 addressed to the wireless terminal 101-3, and an ordinary Ethernet frame 626-4 addressed to the wireless terminal 101-4, to the access point device 104 in this order. Thereafter, the access point device 104 broadcasts, multicasts or unicasts a compressed Ethernet frame 627 into which codec signals included in the Ethernet frames 626-1 to 626-4 are encapsulated, to each of the wireless terminals 101-1 to 101-4.

Figure 11:
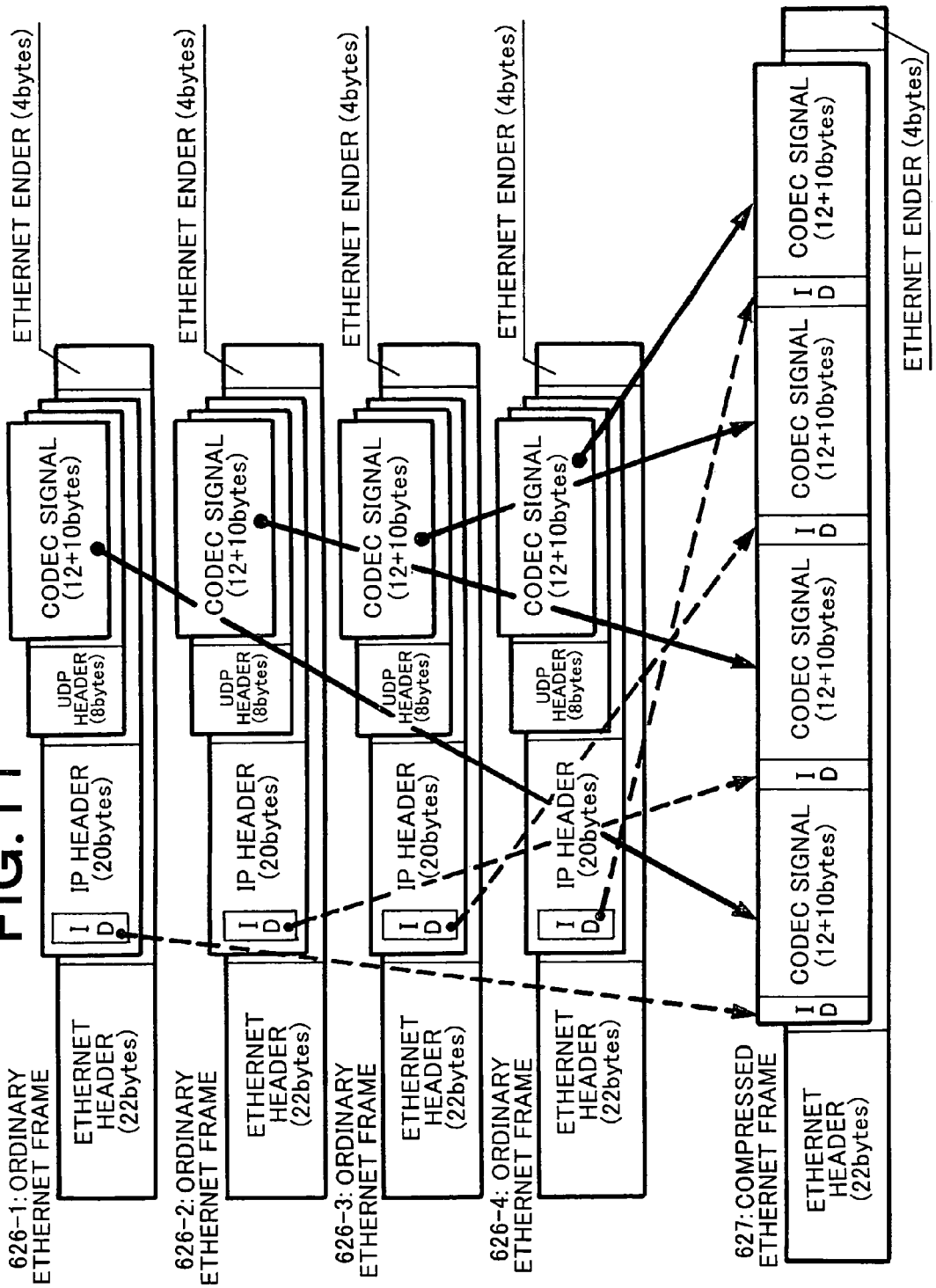
FIG. 11 illustrates formats of packets in the third embodiment of the present invention.

FIG. 11 illustrates formats of the ordinary Ethernet frames 626-1 to 626-4 and a format of the compressed Ethernet frame 627. The ordinary Ethernet frames 626-1 to 626-4 are based on the standard. Identifiers of IP headers and codec signals included in the respective ordinary Ethernet frames 626-1 to 626-4 are directly inserted into the payload of the compressed Ethernet frame 627 without interposition of an IP packet and a UDP packet. If the wireless terminals 101-1 to 101-4 reproduce individual pseudo-identifiers, respectively, the identifiers may be deleted from the compressed Ethernet frame 627.

The slot numbers of codec signals related to compression are inserted into a compression acknowledgement (compression ACK) transmitted from the access point device 104 to the wireless terminal which has transmitted a compression request to the access point device 104, whereby the wireless terminal can identify the position of the codec signal addressed to the wireless terminal itself based on the slot number of the codec signal. In addition, even if the wireless terminal holds two or more communications using the compressed Ethernet frame through different ports, respectively, the wireless terminal can identify these communications based on the slot numbers of the codec signals. This is because the codec signals for the communications using the different ports are inserted into the different slots, respectively. In the example of FIG. 11, the slot numbers are numbered 1 to 4 for the codec signals addressed to the wireless terminals 101-1 to 101-4, respectively. Alternatively, offsets indicating slot positions may be used in place of the slot numbers.

For example, if the ordinary Ethernet frame 626-1 arrived one cycle before (before the access point device 104 transmitted a compressed Ethernet frame preceding the compressed Ethernet frame 627) due to a jitter, two codec signals addressed to the wireless terminal 101-1 are inserted into the compressed Ethernet frame which arrives one cycle before and not inserted into the compressed Ethernet frame 627. If two codec signals addressed to the same wireless terminal using the same port are inserted into one compressed Ethernet frame, a series of codec signals are inserted as usual into the payload of the compressed Ethernet frame and pairs of the codec signals addressed to the wireless terminal and the slot number in a normal case are added to the end of the payload, for example. If codec signals addressed to a certain wireless terminal are not inserted into the compressed Ethernet frame, bits of all the codec signals are set at nulls, for example.

Only a maximum of 1500 bytes of data can be inserted into one Ethernet frame. However, if the number of bytes including those for the codec signals addressed to all the wireless terminals exceeds 1500 bytes because of an increase in the number of wireless terminals connected to the access point device 104 or the like, the codec signals addressed to all the wireless terminals are transmitted using a plurality of compressed Ethernet frames. In this case, division codes, the frame numbers of divided compressed Ethernet frames, and the like are described in the payload of the respective divided compressed Ethernet frames so that each terminal can recognize that the codec signals are divided according to the plural compressed Ethernet frames and transmitted thereto.

In the third embodiment, the number of Ethernet frames transmitted from the access point device 104 can be decreased. From another point of view, the number of bytes of a codec signal included into one wireless LAN frame can be increased. Therefore, in the third embodiment, the wireless bandwidth of the wireless LAN system can be effectively utilized.

Fourth Embodiment

Figure 12:
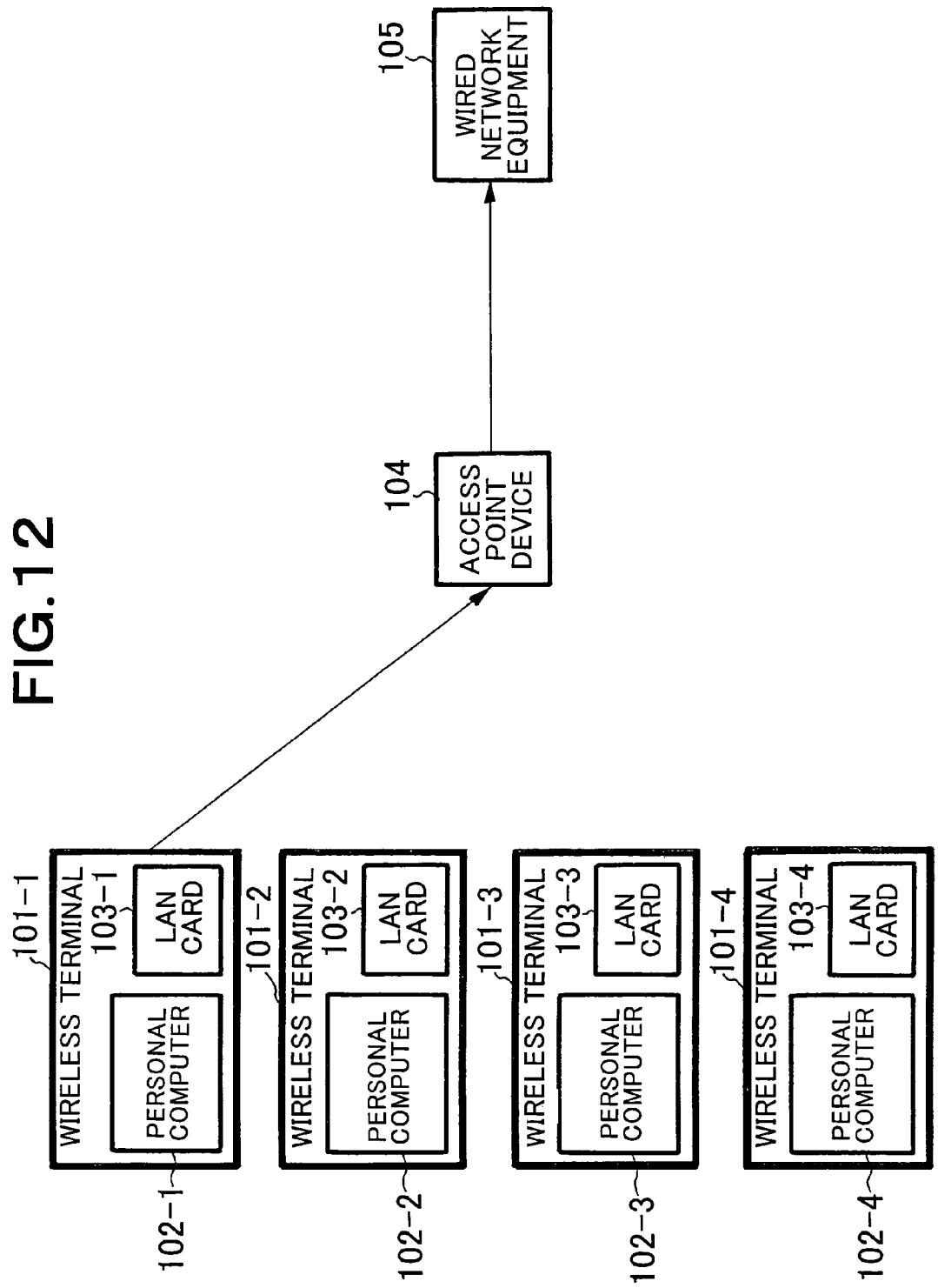
FIG. 12 is a conceptual view illustrating a transmission line in the fourth embodiment of the present invention.

In the fourth embodiment, an example in which one wireless terminal 101-1 transmits a codec signal to the wired network equipment 105 through the access point device 104 as shown in FIG. 12 will be described.

Figure 13:
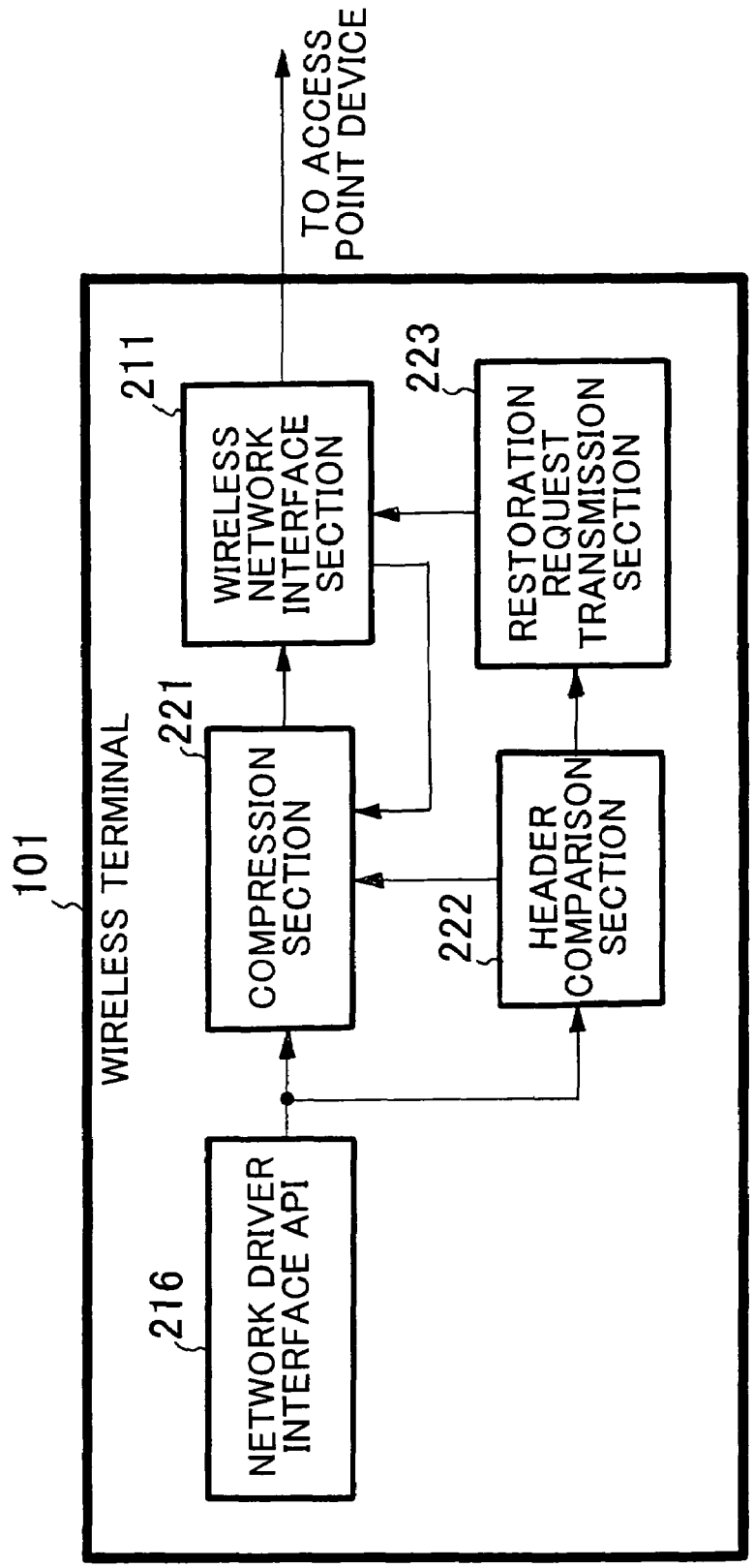
FIG. 13 is a block diagram illustrating the configuration of a wireless terminal in the fourth embodiment of the present invention.

FIG. 13 is a conceptual view illustrating the important sections of the wireless terminal 101 related to the fourth embodiment. Referring to FIG. 13, the wireless terminal 101 includes a compression section 221, a header comparison section 222, and a restoration request transmission section 223 as well as the wireless network section 211 and the network driver interface API 216 shown in FIG. 4. The network driver interface API 216 receives an IP packet including a codec signal from a higher level layer. The compression section 221 generates a compressed Ethernet frame based on the IP packet input from the network driver interface API 216. The wireless network interface section 211 transmits a wireless LAN frame including the Ethernet frame to the access point device 104. The header comparison section 222 makes a predetermined comparison related to the headers of the IP packet input from the network driver interface API 216 or the like, and determines whether to start or end the compression of the Ethernet frame based on the comparison result. The restoration request transmission section 223 transmits a restoration request (restoration REQ) to the access point device 104 if the header comparison section 222 determines to start the compression of the Ethernet frame.

Figure 14:
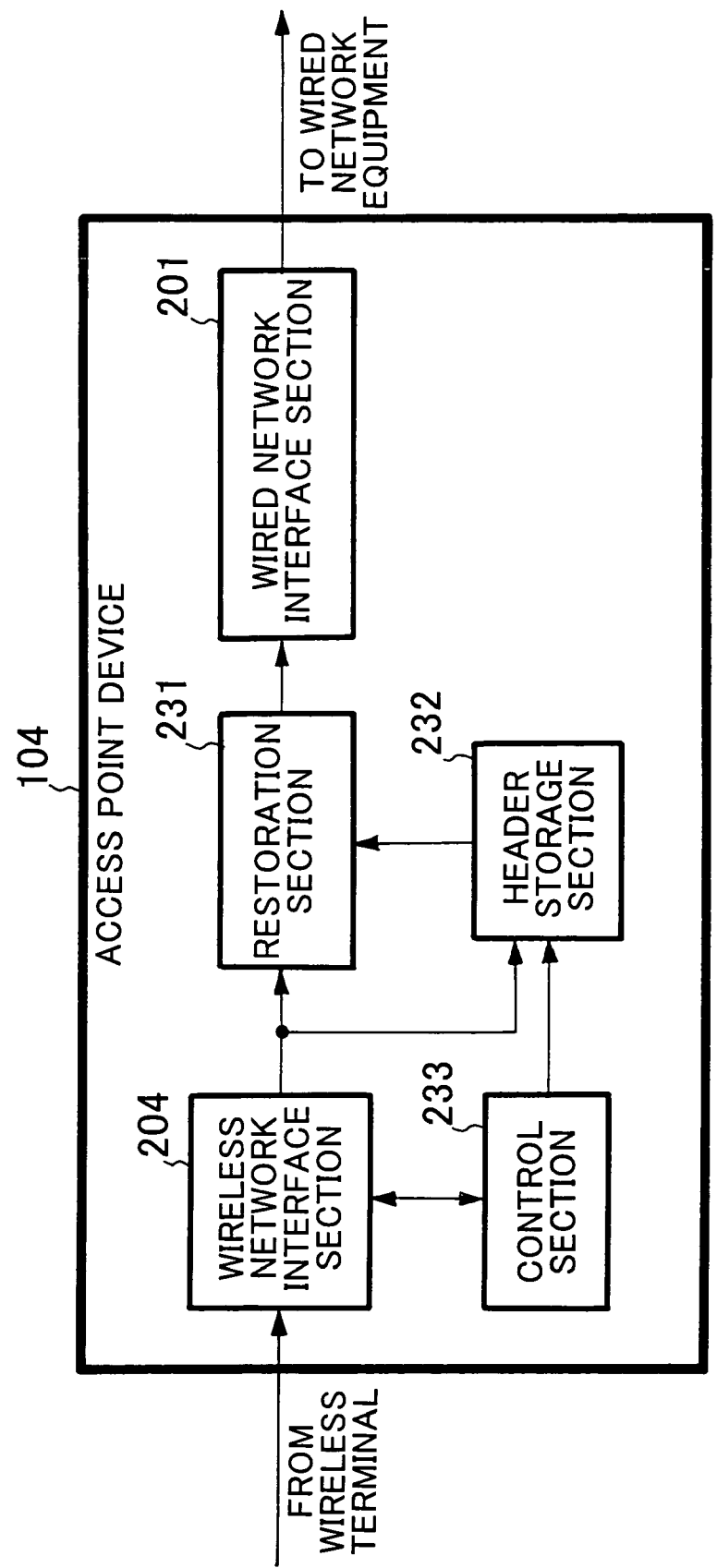
FIG. 14 is a block diagram illustrating the configuration of an access point device in the fourth embodiment of the present invention.

FIG. 14 is a conceptual view illustrating the important sections of the access point device 104 related to the fourth embodiment. Referring to FIG. 14, the access point device 104 includes a restoration section 231, a header storage section 232, and a control section 233 in addition to the wired network interface section 201 and the wireless network interface section 204 shown in FIG. 14. The wireless network interface section 204 receives the wireless LAN frame including the Ethernet frame from wireless terminal 101. The restoration section 231 restores the compressed Ethernet frame input from the wireless network interface section 204 into an ordinary Ethernet frame using the IP header and the UDP header stored in the header storage section 232. The wired network interface section 201 transmits ordinary Ethernet frames to the wired network equipment 105. The control section 233 transmits a restoration acknowledgement (restoration ACK) in response to the restoration request received from the restoration request transmission section 223 of the wireless terminal 101 to the wireless terminal 101. If there is a restoration request, the control section 233 issues to the header storage section 232 a request to store the IP header and the UDP header of the Ethernet frame input from the wireless network interface section 204. The header storage section 232 stores the IP header and the UDP header of the Ethernet frame input from the wireless network interface section 204 in response to the request from the control section 233.

FIG. 15 is a sequence diagram illustrating operations of the wireless terminal 101-1, the access point device 104, and the wired network equipment 105 in the fourth embodiment. Referring to FIG. 15, the wireless terminal 101-1 encapsulates ordinary Ethernet frames 631-1 and 631-2 into respective wireless LAN frames and transmits the wireless LAN frames to the access point device 104. The access point device 104 transfers the ordinary Ethernet frames 631-1 and 631-2 to the wired network equipment 105 as ordinary Ethernet frames 632-1 and 632-2, respectively. Next, when the header comparison section 222 of the wireless terminal 101-1 detects that codec signals are included in the respective ordinary Ethernet frames 631-1 and 631-2 similarly to the header comparison section 214, the restoration request transmission section 223 of the wireless terminal 101-1 transmits a restoration request (restoration REQ) 633 to the access point device 104. When the control section 233 of the access point device 104 receives the restoration request 633, the control section 233 stores an IP header and a UDP header included in the ordinary Ethernet frame 631-2 in the header storage section 232, and transmits a restoration acknowledgement (restoration ACK) 634 to the wireless terminal 101-1. Thereafter, when the compression section 221 of the wireless terminal 101-1 receives four IP packets including codec signals from the network driver interface API 216, the compression section 221 generates a single compressed Ethernet frame 635 including the codec signals included in the four IP packets and transmits the compressed Ethernet frame 635 to the access point device 104. When the access point device 104 receives the compressed Ethernet frame 635, the restoration section 231 of the access point device 104 restores four ordinary Ethernet frames 636-1 to 636-4 using the IP header and the UDP header stored in the header storage section 232, and sequentially transmits the restored ordinary Ethernet frames 636-1 to 636-4 to the wired network equipment 105.

FIG. 16 illustrates formats of the compressed Ethernet frame 635 and the restored ordinary Ethernet frames 636-1 to 636-4. Four pairs of identifiers and codec signals are directly inserted into the payload of the compressed Ethernet frame 635 without interposition of the IP packet and the UDP packet. The four identifiers in the compressed Ethernet frames 635 were originally included in the IP headers of the respective four IP packets input to the compression section 221 from the network driver interface API 216. The four codec signals in the compressed Ethernet frame 635 were originally included in UDP packets included in the respective four IP packets input to the compression section 221 from the network driver interface API 216. The ordinary Ethernet frames 636-1 to 636-4 are based on the standard. The four pairs of identifiers and codec signals included in the compressed Ethernet frame 635 are distributed to the four ordinary Ethernet frames 636-1 to 636-4.

If the compressed Ethernet frame 635 is not retransmitted between the access point device 104 and the wireless terminal 101-1, the access point device 104 may generate individual pseudo-identifiers. In that case, the identifiers are not inserted into the compressed Ethernet frame 635.

In the example of FIGS. 15 and 16, the four codec signals are inserted into one compressed Ethernet frame. Generally, however, one or more codec signals are inserted into one compressed Ethernet frame. In addition, codec signals for the IP packets which the compression section 221 receives within predetermined time may be inserted into one compressed Ethernet frame instead of specifying the number of codec signals inserted into one compressed Ethernet frame.

In the fourth embodiment, the number of Ethernet frames transmitted from the wireless terminal 101 to the access point device 104 can be decreased. From another point of view, the number of bytes of a codec signals inserted into one wireless LAN frame can be increased. Therefore, in the fourth embodiment, the wireless bandwidth of the wireless LAN system can be effectively utilized.

Fifth Embodiment

In the fourth embodiment, attention is paid only to one wireless terminal. However, if all of the wireless terminals 101-1 to 101-4 operate as described in the fourth embodiment and simultaneously transmit compressed Ethernet frames, total transmission bandwidths for the terminal devices 101-1 to 101-4 sometimes exceed the wireless bandwidth of the wireless LAN system or processing quantities sometimes exceed a processing capability of the access point device 104. The fifth embodiment is, therefore, intended to prevent occurrence of these situations.

FIG. 17 is a conceptual view of the fifth embodiment. The wireless terminals 101-1 to 101-4 sequentially transmit compressed Ethernet frames to the access point device 104 at certain times intervals T. This can decrease the number of compressed Ethernet frames that the access point device 104 should process at one time, thereby preventing the access point device 104 from discarding packets.

The access point device 104 regularly broadcasts synchronization information to all of the wireless terminals 101-1 to 101-4. The wireless terminals 101-1 to 101-4 receive compressed Ethernet frames from the access point device 104 in a manner described in the third embodiment. Each wireless terminal knows of the slot number of a slot in the compressed Ethernet frame to which the codec signal addressed to itself is allocated. Therefore, it is possible to calculate a timing at which each wireless terminal transmits the compressed Ethernet frame based on the synchronization information and the slot number.

The time interval T is expressed as:

$T = P/N$, where P is a cycle of a compressed Ethernet frame and N is the number of wireless terminals.

If a period in which one RTP packet including codec data is generated is R, the cycle of the compressed Ethernet frame is P, the number of wireless terminals is N, then the number of wireless terminals S which can simultaneously transmit compressed Ethernet frames may be expressed as:

$S = R/(P/N)$.

It is noted, however, that the S wireless terminals can transmit the compressed Ethernet frames at different timings within the time T. For example, if R=10 [milliseconds], P=40 [milliseconds], and N=8, then S is given as:

$S = 10/(40/8) = 2$

Therefore, the two wireless terminals may transmit the compressed Ethernet frames at the ten milliseconds' times inter-vals. In addition, the two wireless terminals may transmit the compressed Ethernet frames at different timings within ten milliseconds's times intervals. Accordingly, one wireless terminal may transmit one compressed Ethernet frame within five milliseconds.

The fifth embodiment is also applicable to a gateway and an inter-LAN connecting device to be described later.

Sixth Embodiment

Similarly to the third embodiment, the sixth embodiment provides an example in which a plurality of wireless terminals 101-1 to 101-4 receive respective codec signals as shown in FIG. 9. In the third embodiment, the access point device 104 broadcasts or multicasts the compressed Ethernet frame 627 as shown in FIG. 10. In the sixth embodiment, by contrast, the access point device 104 generates a custom compressed frame 641 based on the normal Ethernet frames 626-1 to 626-4 and broadcasts or multicast the generated custom compressed frame 641 as shown in FIG. 18.

FIG. 19 illustrates formats of the normal Ethernet frames 626-1 to 626-4 and a format of the custom compressed Ethernet frame 641. The ordinary Ethernet frames 626-1 to 626-4 are based on the standard. The custom compressed frame 641 is inserted into the payload of the wireless LAN frame in place of the Ethernet frame. Cycle information is inserted into a header of the custom compressed frame 641. The cycle information indicates a cycle of each codec signal inserted into the custom compressed frame 641. The cycle information is necessary to collect codec streams equal in cycle and to generate a minimum number of custom compressed frames. Identifiers and codec signals of IP headers included in the respective ordinary Ethernet frames 626-1 to 626-4 are directly inserted into the payload of the custom compressed frame 641 without interposition of the IP packets and the UDP packets. Further, if the wireless terminals 101-1 to 101-4 reproduce individual pseudo-identifiers, the identifiers may be deleted from the custom compressed frame 641.

Figure 20A:
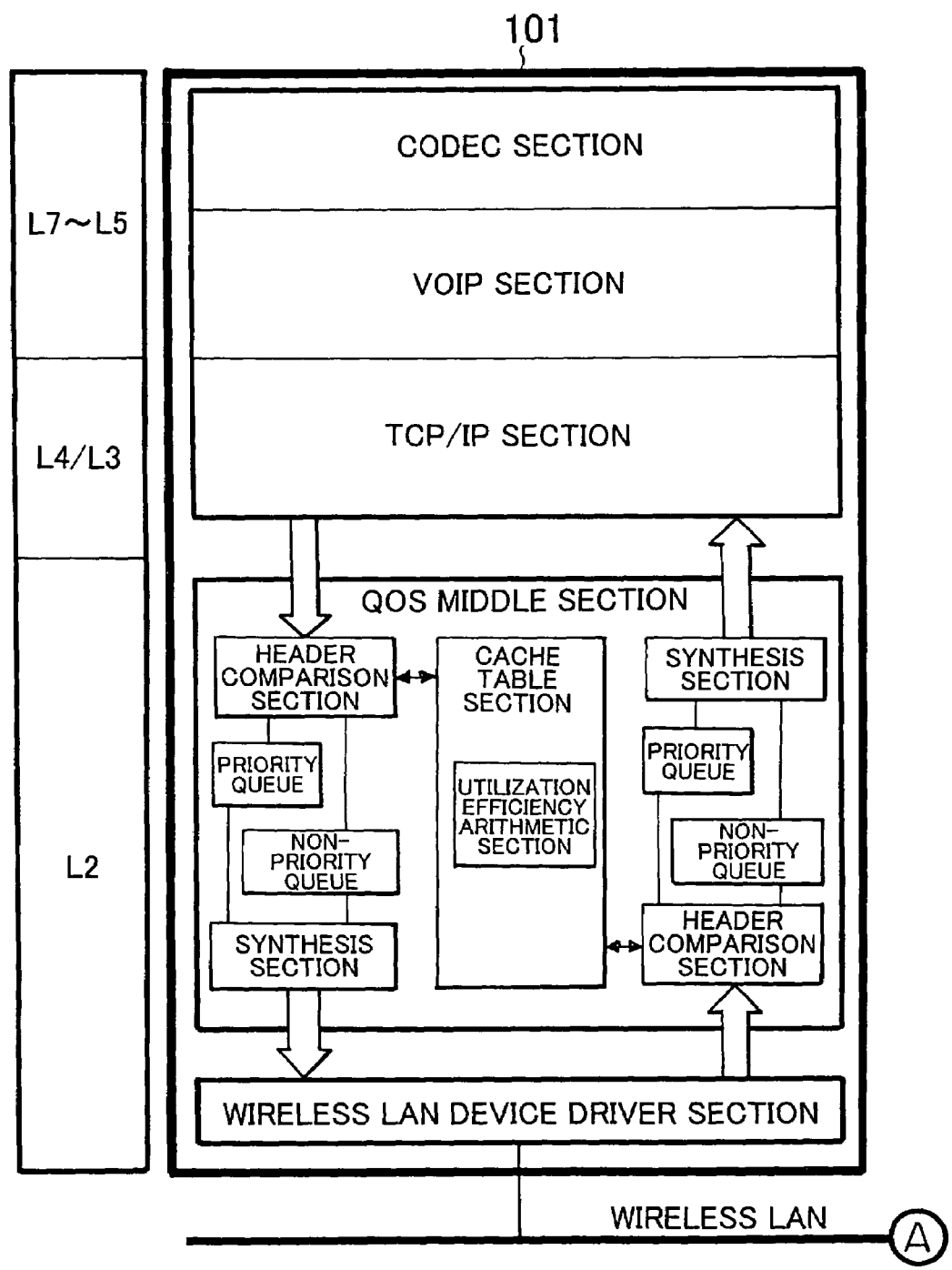
Figure 20C:
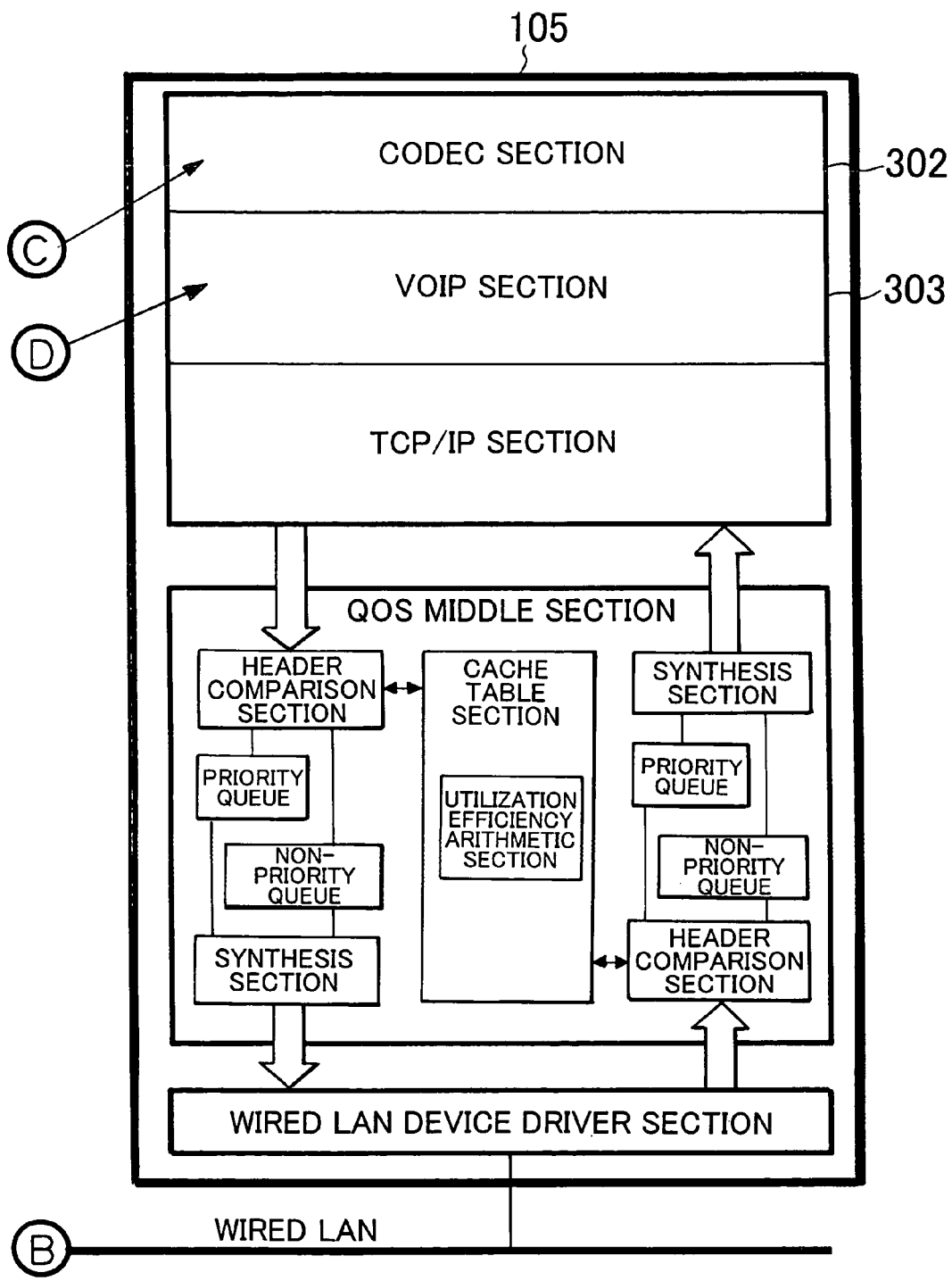

FIG. 20 is a block diagram illustrating the overall configurations of the wireless terminal 101, the access point device 104, and the wired network equipment 105. In order for the access point device 104 to generate the cycle information to be inserted into the custom compressed frame shown in FIG. 19, a higher control section 301 of the access point device 104 receives the codec signal cycle information from a codec section 302 of the wired network equipment 105 according to a predetermined protocol. TCP/IP socket information (IP addresses, a protocol number, port numbers, etc.) and codec type information may be added to the codec cycle information. The socket information indicates communication links. If packets include the same socket information as the RTP, a basic cycle is determined by the codec type and a packet cycle is determined for each RTP link unit.

The access point device needs to grasp the codec signal cycle information so as to increase compression efficiency. Namely, provided that eight channels of RTP packets are generated once for 30 milliseconds, if eight channels of packets are collected at 30 milliseconds' intervals, the number of wireless LAN frames transmitted from the access point device to the wireless terminal is one and the compression efficiency improves. If the access point device 104 cannot grasp the codec signal cycle information, collects packets at 20 milliseconds' times intervals, and generates the wireless LAN frame, the number of packets included in one wireless LAN frame decreases, thereby deteriorating the compression efficiency.

Figure 21A:
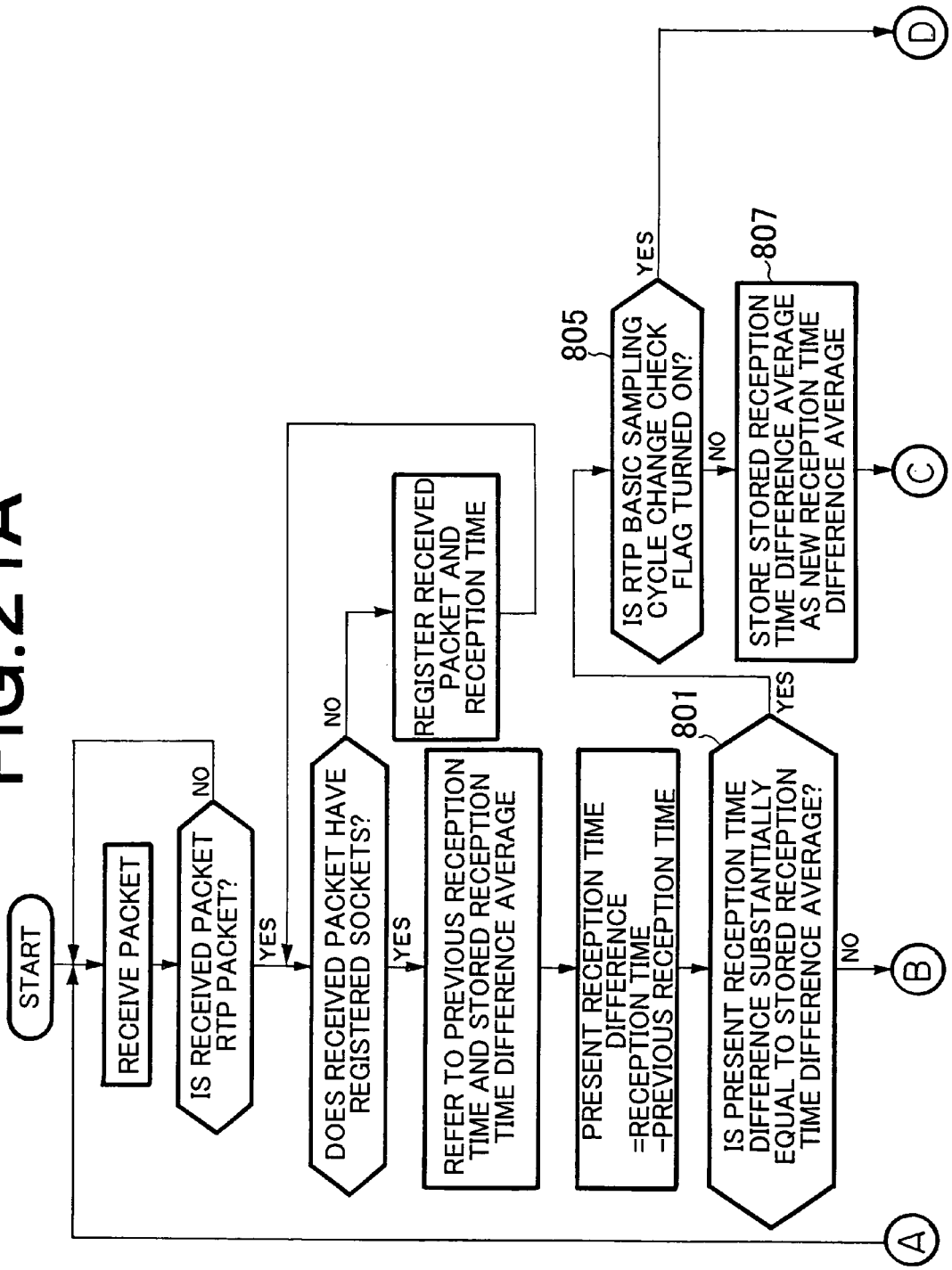

The higher control section 301 determines the cycle information to be inserted into the header of the custom compressed frame 641 based on the cycles of the RTP packets received by a method shown in FIGS. 21A and 21B. The outline of the method shown in FIGS. 21A and 21B will be described. The reason for determining "whether a present reception time difference is substantially equal to a stored reception time difference average" is as follows. If the reception time difference is only small, it is not determined that the cycle of the received RTP packet is disturbed. If it is determined that the RTP packet cycle is disturbed, the processing goes to a step 802. A cycle change check flag checked in the step 802 indicates whether the cycle of the custom compressed frame is being adjusted. If it is determined that the cycle is adjusted for the first time this time, the cycle change check flag is turned on (in a step 803) and a new reception time difference average is stored (in a step 804). If it is determined that the RTP packet cycle is not disturbed, the processing goes to a step 805. In the step 805, it is determined whether a cycle adjustment was made previously. If it is determined that the cycle adjustment was made previously, the cycle change check flag indicating this is turned off (in a step S806). After the step 806, if it is determined that the processing goes to the step 805 again in the next loop, the stored reception time difference average is stored as a new reception time difference average (in a step 807).

Further, the access point device 104 may acquire the cycle information by extracting values at a predetermined location of a predetermined frame when the device 104 monitors communication and detects an RTP codec compatibility sequence by header analysis. Alternatively, the access point device 104 may acquire the cycle information from a communication cycle of a predetermined port.

If a certain wireless terminal finishes communication for the codec signal, a dummy signal is inserted into the slot used by the wireless terminal. Alternatively, if the certain wireless terminal finishes communication for the codec signal, the slot used by the wireless terminal is deleted and slots after the deleted slot are shifted forward. The slot number of the deleted slot is described in the header of the custom compressed frame so that each wireless terminal that continues communication can know whether the slot allocated to itself is shifted forward and, if the slot is shifted forward, the wireless terminal can know by as much as how many slots the slot is shifted forward. If the number of wireless terminals that finish codec signal communication increases, and the number of slots into which dummy signals are inserted or the number of deleted slots increases, then the access point device 104 reconstructs the custom compressed frame and reallocates first to the following slots to sets of IP addresses, protocol numbers, and port numbers of the respective wireless terminals that are now holding codec signal communication in ascending order. In this case, the access point device 104 notifies all the wireless terminals that are now holding codec signal communication of new slot numbers.

When a wireless terminal that is to newly start codec signal communication appears, the access point device 104 adds a new slot after the last slot and allocates the new slot to a set of the IP address, the protocol number, and the port number of the new wireless terminal. If there is a slot into which a dummy signal is inserted, the slot may be allocated to the set of the IP address, the protocol number, and the port number of the new wireless terminal. The access point device 104 notifies the newly allocated slot number to the wireless terminal that starts holding the new codec signal communication.

The above-stated deletion and addition operations can be carried out when a slot length of the codec signal is fixed. If the type and operating frequency of the codec are common, the slot length of the codec signal can be fixed. Further, even if transmitting codec signals equal in cycle but different in data quantity per cycle, a slot size may be made uniform by using slots having a capacity equal to the maximum data quantity.

If the codec signal has a variable slot length, the following operations are carried out.

The access point device 104 adds an offset that indicates a position of a codec signal to be compressed to a compression acknowledgement transmitted to the wireless terminal that transmits a compression request to the access point device 104.

If a certain terminal device finishes codec signal communication, a dummy signal is inserted into the slot previously used by the wireless terminal. Alternatively, if the certain terminal finishes codec signal communication, the slot previously used by the wireless terminal is deleted and slots after the deleted slot are shifted forward. The offset and length of the deleted slot are described in the header of the custom compressed frame so that each wireless terminal that continues communication can know whether the slot allocated to itself is shifted forward and, if the slot is shifted forward, the wireless terminal can know by as much as how many slots the slot is shifted forward. If the number of wireless terminals that have finished codec signal communication increases, and the number of slots into which dummy signals are inserted or the number of deleted slots increases, then the access point device 104 reconstructs the custom compressed frame and reallocates first to the following slots of variable lengths to sets of IP addresses, protocol numbers, and port numbers of the respective wireless terminals that are now holding codec signal communication in ascending order. In this case, the access point device 104 notifies all the wireless terminals that are now holding codec signal communication of offsets of the new slots.

Even if the codec signal has a variable slot length, it is possible to add or delete the codec signal by the same operation as that carried out when the slot length is fixed by inserting a signal that indicates a slot boundary between the slots.

When a wireless terminal that is to newly start codec signal communication appears, the access point device adds a new slot after the last slot and allocates the new slot to a set of the IP address, the protocol number, and the port number of the new wireless terminal. The access point device then notifies the wireless terminal that newly starts codec signal communication of an offset of the slot allocated thereto.

If a codec signal cannot be inserted into a slot of a certain custom compressed frame because of the influence of a jitter, a null signal is inserted into the slot. If two codec signals addressed to the same wireless terminal should be inserted into the custom compressed frame due to the influence of a jitter, one codec signal is inserted into an ordinary slot and the other codec signal is inserted into an additional slot as shown in FIG. 22. As shown in FIG. 22, a slot number is also described in the additional slot.

The custom compressed frame may be encrypted for each frame or each slot. In this case, a compression acknowledgment that includes a cipher key is transmitted from the access point device to the wireless terminal.

FIG. 23 illustrates a format of another custom compressed frame. In this format, codec signals having different cycles are inserted into one custom compressed frame. By doing so, it is possible to transmit the codec signals, which arrive at the access point device 104 in different cycles, to the wireless terminals with a smaller delay. If codec signals, which arrive at the access point device 104 in different cycles, are transmitted to the wireless terminals in the same cycle, a custom compressed frame having the same cycle as that of the codec signal having a long cycle is generated and the codec signal having a short cycle is delayed. In addition, as compared with a case of individually generating wireless LAN frames shown in FIG. 19 for different cycles, it is possible to decrease the number of wireless LAN frames. In the example of FIG. 23, voice codec signals #1 to #4 have a first cycle, and moving picture codec signals #3 and #4 have a second cycle. Offset related information including the offset identifier and the offset, first cycle information, the voice codec signals #1 to #4, second cycle information, and the moving picture codec signals #3 and #4 are inserted into the custom compressed frame in this order. The offset identifier indicates the type of the offset. The first cycle information indicates the cycle of the voice codec signals #1 to #4. The second cycle information indicates the cycle of the moving picture codec signals #3 and #4.

The higher control section 301 of the access point device 104 detects the end of the codec operation by checking a predetermined communication header (VoIP or video communication control header) or by determining whether communication is interrupted for a predetermined period. Alternatively, the higher control section 301 of the access point device 10 detects the end of the codec operation when it is notified of the interruption by a predetermined frame from a VoIP section 303 of the wired network equipment 105 shown in FIGS. 20A, 20B and 20C.

Without making the number of codec slots in the compressed frame, a new RTP communication may be automatically held after the voice frame. Since no unused frame is present, it is possible to always set the packet length short. In addition, compatibility handling can be simplified, thereby simplifying the sequence shown in FIG. 8.

It is provided that a predetermined packet is received. In this case, even if it is detected that the RTP is not used for a predetermined period (e.g., three seconds), it is not determined that communication is interrupted but communication is held continuously against a case in which the interruption of the RTP continues for a long period of time because of hold, transfer, call waiting, chat or the like. Further, slot change is not made (slot deletion is not made), a sign of null (unused) may be described without notifying the wireless terminal of the interruption of the communication that uses the slot and the communication may be continued as it is until the next RTP communication is detected.

If the number of locations of nulls increases, a slot compatibility notification may be issued and means for shortening the packet length may be provided.

Not only the voice data having different cycles but also moving picture data and voice data having different cycles may be inserted into the packet to be synthesized.

For cryptographic communication, a cipher or a password of a slot may be made compatible with an RTP by which a cryptographic communication is to be held when the corresponding slot is assigned to the RTP. Alternatively, a packet including system information that defines a cryptographic system or a cipher key may be received from a predetermined higher device in advance, the RTP information may be restored, and cryptographic communication may be held to correspond to slots compatible with individual RTPs.

Further, cryptographic communication may be held by decoding a cipher of data, creating a compressed frame for each unit in which the cryptographic system is shared in a group such as a VLAN (Virtual Local Area Network).

The sixth embodiment is also applicable to the gateway or the inter-LAN connecting device to be described later.

Seventh Embodiment

In the seventh embodiment, a VLAN packet is handled. As the VLAN, various types including a port-base VLAN, a MAC address-base VLAN, a policy-base VLAN, an IEEE802.1q VLAN, an IEEE802.1d, an IPsec VLAN, and an L2TP VLAN are known.

Among them, in the IEEE802.1q VLAN, it is possible to treat an IP packet to which a VLAN tag is added and which is encrypted.

In this case, since the IP packet is encrypted, it is impossible to simply delete the IP header and the UDP header of the IP packet on a transmission side in the wireless LAN system and restore the IP packet on a reception side.

The VLAN tag, which is defined by 802.1q, such as a basic 32-byte tag or a double-tag frame that is a twofold of the basic tag, is large in size. However, if the same stream is used, then VLAN ID's, CFI identifiers, priority identifiers and the like included in several frames defined by 802.1q are fixed. Therefore, no problem occurs even if the VLAN tag is deleted. As for the other VLAN systems, header information includes a fixed part. Therefore, no problem occurs even if the fixed part of the header is deleted. In the seventh embodiment, therefore, a compressed frame is created by deleting a VLAN tag of a VLAN packet of a predetermined type or deleting fixed part information, so that transmission efficiency can be improved.

A fixed header of the VLAN packet from the transmitter device (i.e., the access point device if a packet is transmitted from the access point device or the wireless terminal if a packet is transmitted from the wireless terminal) is deleted and one or more IP packets are inserted into the wireless LAN frame as they are.

FIG. 24 is a sequence diagram illustrating operations of the wireless terminals 101-1 to 101-4, the access point device 104, and the wired network equipment 105 in the seventh embodiment. Referring to FIG. 24, the wired network equipment 105 sequentially transmits ordinary Ethernet frames 651-1 to 651-4 to the access point device 104. Each of the ordinary Ethernet frames 651-1 to 651-4 includes a VLAN frame. The access point device 104 creates a custom compressed frame 652 based on IP packets included in the VLAN frames included in the respective ordinary Ethernet frames 651-1 to 651-4, and broadcasts or unicasts the generated custom compressed frame 652 to the wireless terminals 101-1 to 101-4.

FIG. 25 illustrates formats of the ordinary Ethernet frames 651-1 to 651-4 and a format of the custom compressed frame 652. Referring to FIG. 25, the ordinary Ethernet frame 651-1 includes a VLAN packet in a payload, the VLAN packet includes a VLAN tag and a VLAN payload, and the VLAN payload includes an IP packet. In the custom compressed frame 652, four IP packets included in payloads of the VLAN packets are included in the payload of the wireless LAN frame. The number of IP packets included in the payload of the wireless LAN is generally one or more. The reception side restores the individual IP packets in the wireless LAN frame.

The higher control section of the access point device may receive a group number of the VLAN in the form of a predetermined packet. Alternatively, the higher control section may receive a decoding key from the VoIP section or the codec section, perform an analysis operation, fetch data on the RTP, and hold multiple-frame communication.

The seventh embodiment is also applicable to the gateway or the inter-LAN connecting device to be described later.

Eighth Embodiment

In the eighth embodiment, the number of codec signals inserted into the compressed Ethernet frame or the custom compressed frame is dynamically changed.

As shown in FIG. 26, if the number of codec signals transmitted from the access point device 104 to the wireless terminals is small, the number of codec signals "n" inserted into one wireless LAN frame is set at 1 (n=1). If the number of codec signals transmitted from the access point device 104 to the wireless terminals gradually increases and the number of wireless LAN frames transmitted per unit time reaches a threshold, the access point device 104 sets the number of codec signals "n" inserted into one wireless LAN frame at 2 (n=2). By so setting, the number of wireless LAN frames can be reduced to half. If the number of codec signals transmitted from the access point device 104 to the wireless terminals gradually increases and the number of wireless LAN frames transmitted per unit time reaches the threshold again, the access point device 104 sets the number of codec signals "n" inserted into one wireless LAN frame at 3 (n=3). By so setting, the number of wireless LAN frames can be reduced to two-thirds. This operation is continuously carried out until the number of codec signals that can be inserted into one wireless LAN frame reaches a predetermined maximum.

Further, if the number of codec signals transmitted from the access point device 104 to the wireless terminals decreases, the number of codec signals inserted into one wireless LAN frame is gradually decreased.

The value of "n" may be multiplied in such a manner as 1 to 2, 2 to 4, and 4 to 8. In this case, a threshold used when the value of "n" is conversely decreased can be fixed to a half of the threshold used to increase the value of "n", thereby simplifying the operation.

When the number of codec signals inserted into one wireless LAN frame is to be changed, the access point device 104 reconstructs either the compressed Ethernet frame or the custom compressed frame and transmits the slot number allocated to each codec signal to each wireless terminal. Because it is generally impossible that all the codec signals to be transmitted are inserted into one wireless LAN frame, they are transmitted while inserting them over a plurality of wireless LAN frames.

The threshold for determining whether the number of codec signals inserted into one wireless LAN frame should be increased is set at a fraction of a maximum number of wireless LAN frames that can be transmitted by the wireless LAN system per unit time. Voice codec signals, moving picture codec signals, and data signals are transmitted over different wireless LAN frames, and different thresholds are set for the voice codec signals, the moving picture codec signals, and the data signals. It is therefore possible to prevent communication for a certain type of signals (e.g., voice communication) from being interfered with by communication for the other type of signals (e.g., moving picture communication). Alternatively, the thresholds may be adjusted arbitrarily by a user.

Further, thresholds registered in advance to correspond to the LAN communication system or a rate compatible value may be referred to when setting these thresholds. The thresholds may be notified by a predetermined packet.

In the eighth embodiment, similarly to the preceding embodiments, it is possible to suppress the number of wireless LAN frames transmitted per unit time to be equal to or smaller than a predetermined number by changing the number of IP packets inserted into one wireless LAN frame.

The eighth embodiment is also applicable to the gateway or the inter-LAN connecting device to be described later.

Ninth Embodiment

The ninth embodiment is intended to deal with a case in which the operation for increasing the number of codec signals inserted into one wireless LAN frame is continuously carried out in the manner described in the eighth embodiment and the number reaches an upper limit of the wireless LAN system. To "reach an upper limit" means that the number of wireless LAN frames transmitted per unit time reaches a limit of the wireless LAN system and that the capacity of codec signals inserted into one wireless LAN frame reaches a limit of the capacity of the wireless LAN frame.

Figure 27A:
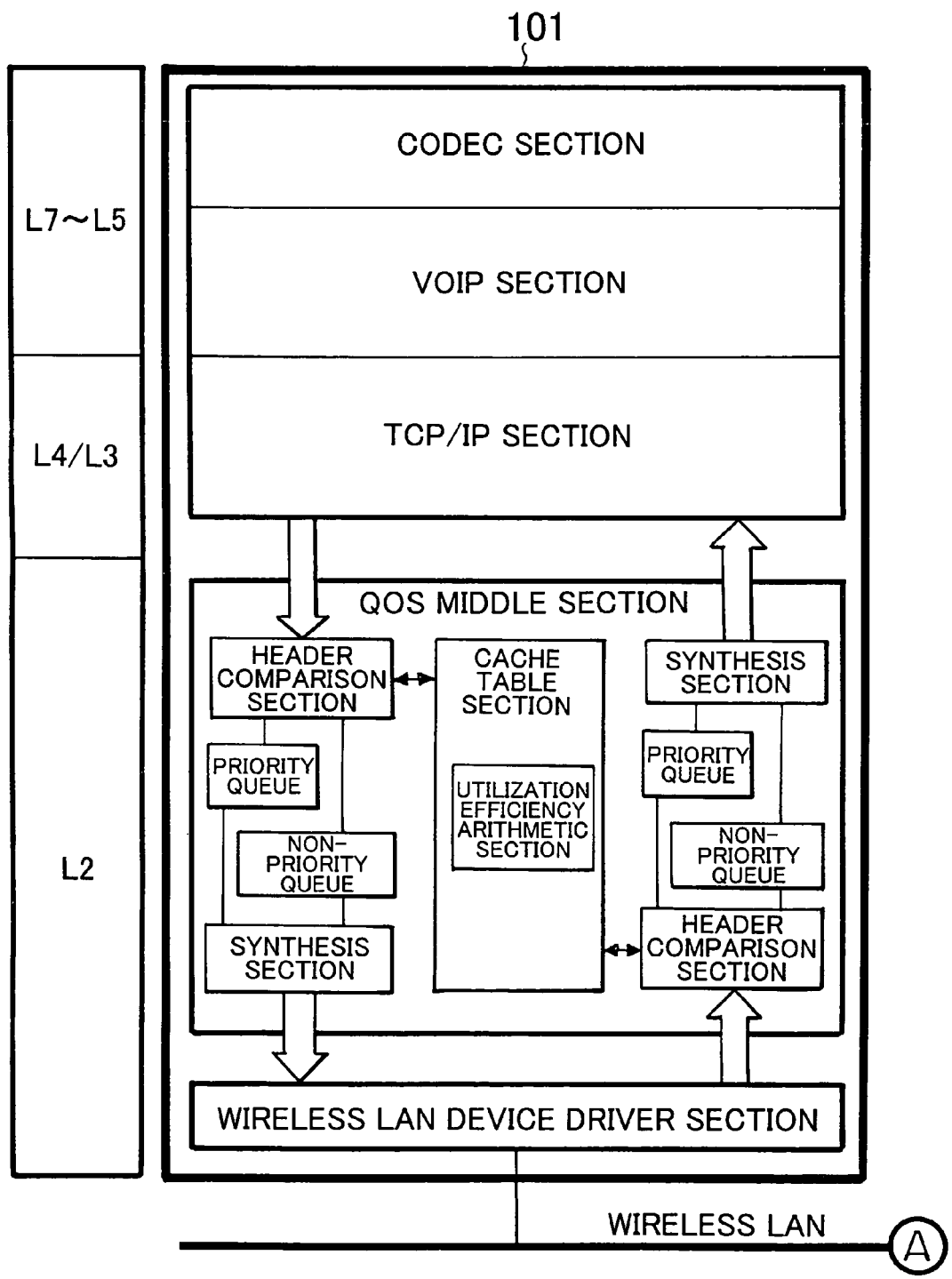
Figure 27C:
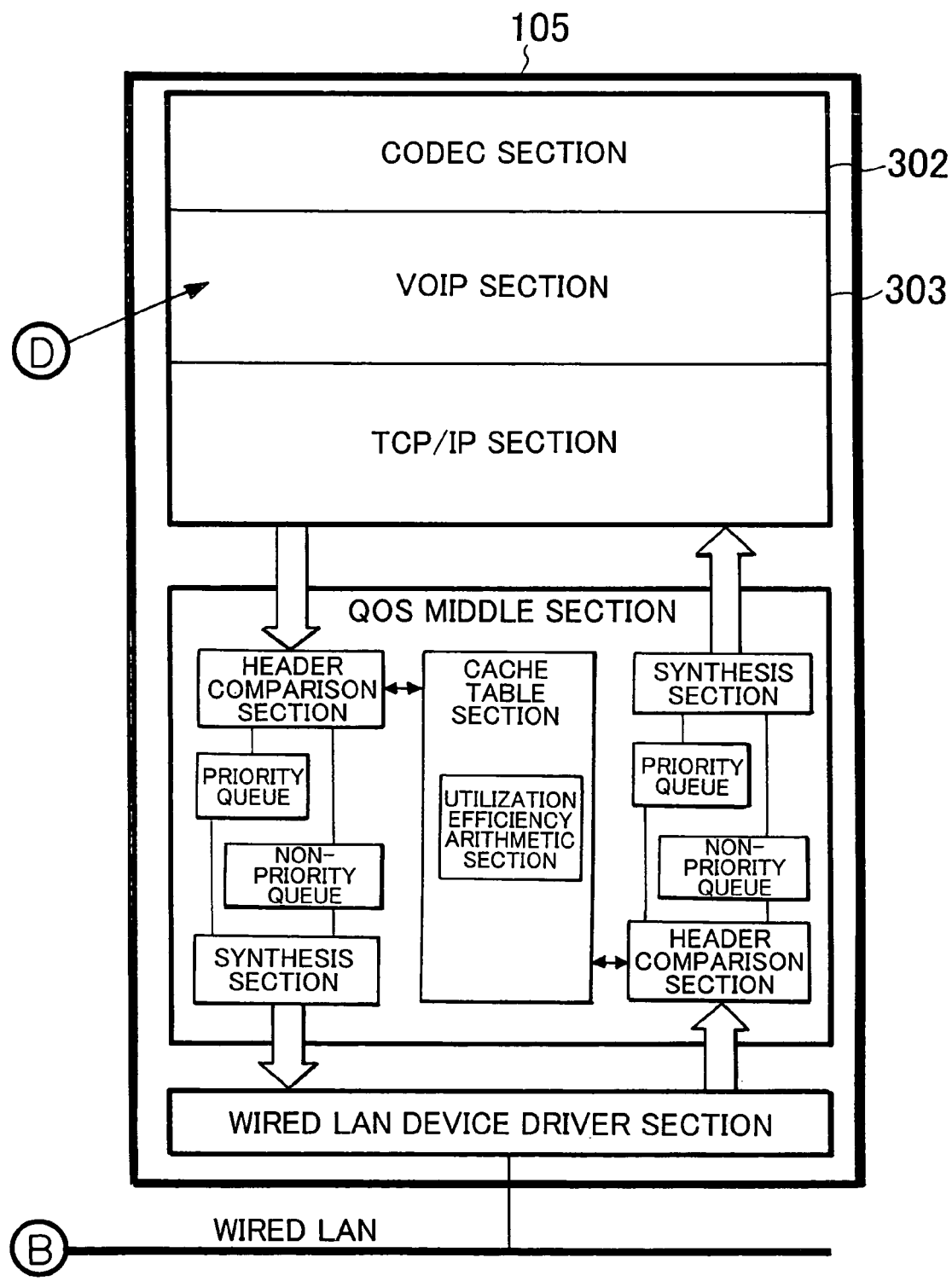

In this case, as shown in FIGS. 27A, 27B and 27C, the higher control section 301 notifies the codec section 302 of the wired network equipment 105 of this situation through the VoIP section 303. The codec section 302 increases the compression ratio of voice data or moving picture data or multiplexes a codec frame in one RTP packet, thereby decreasing the number of codec signals (the number of RTP packets) per unit time.

Alternatively, each wireless terminal may roam to another access point device having a lighter load.

When the number of codec signals reaches the upper limit as stated above, it is necessary to avoid a further increase in communication volume. Therefore, if a new VoIP connection request is transmitted from an external device, not shown, connected to the wired network equipment, the higher control section 301 transmits a busy tone to the device as a response, thereby restricting calls.

In FIGS. 27A, 27B and 27C, "the restriction of the number of codec signals per packet" means that the number of voice codec signals inserted into one wireless LAN frame is controlled. "adjusting codec band" means that a bit rate of each codec signal generated by the codec is controlled.

The gateway or the inter-LAN connecting device to be described later may include the QoS middle section 308, the bridging section 304, the L2/L3QoS level matching section 305, and the higher control section 301 similarly to the access point device 104. In that case, the higher control section of the gateway or the inter-LAN connecting device performs the same processing for dealing with a case in which the number of codec signals reaches the upper limit as that performed by the higher control section 301 of the access point device 104.

Tenth Embodiment

The tenth embodiment is intended to deal with a priority and the like set to the IP packet.

A TOS (Type of Service) is inserted into the IP header. The TOS indicates a priority, a delay, a throughput, a reliability, a cost, and a security of the IP packet. In the tenth embodiment, similarly to the insertion of the identifier of the IP header as well as the codec signal into the compressed Ethernet frame or the custom compressed frame, the TOS as well as the codec signal is inserted into the compressed Ethernet frame or the custom compressed frame as shown in FIG. 28.

Figure 29:
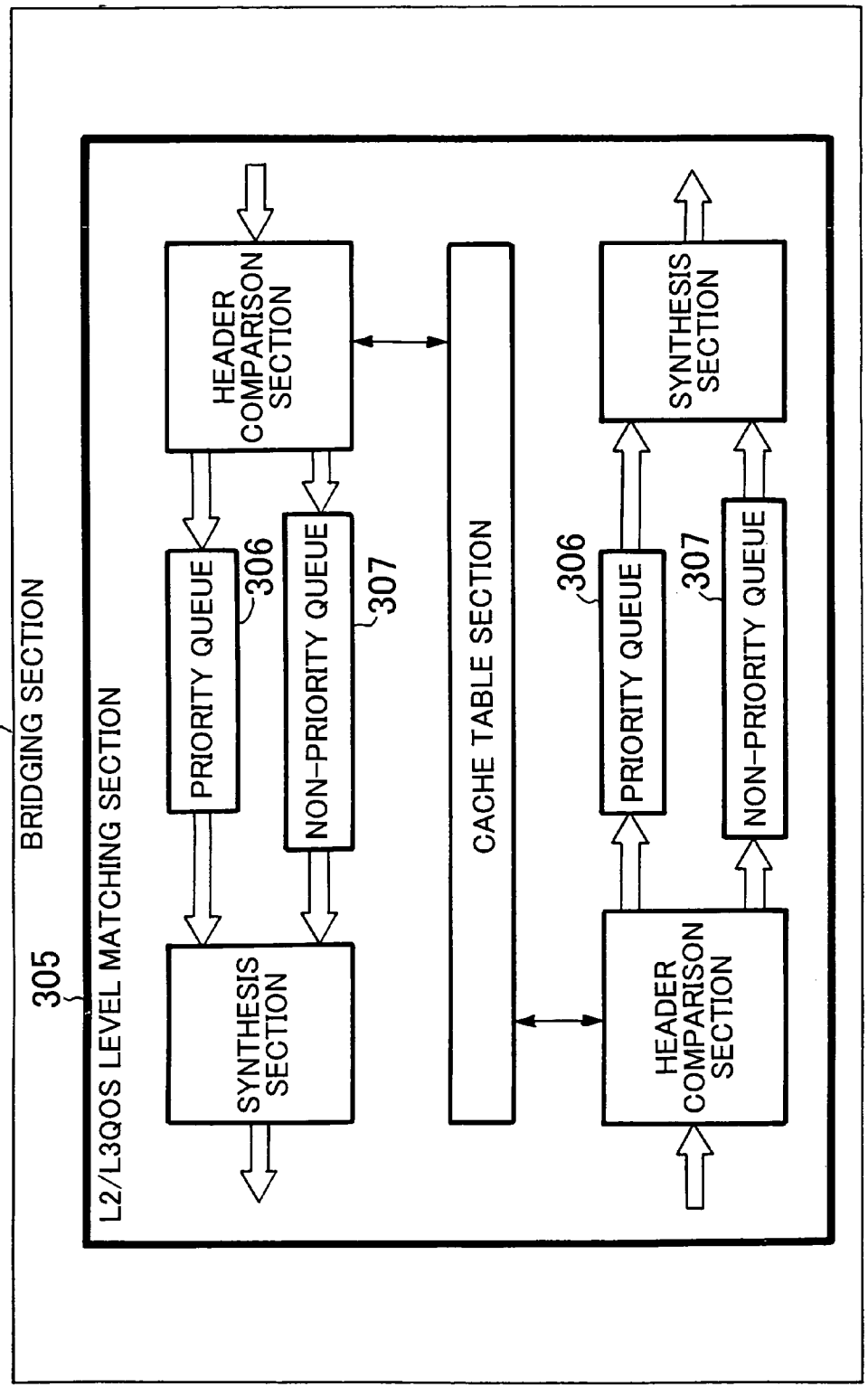
FIG. 29 is a block diagram illustrating the configuration of an L2/L3QoS level matching section in the tenth embodiment of the present invention.

Further, as shown in FIG. 29, a priority queue 306 and a non-priority queue 307 are provided in the L2/L3QoS level matching section. An IP packet having a high priority is fed to the priority queue 306 and an IP packet having a low priority is fed to the non-priority queue 307, thereby preferentially routing the IP packet having the high priority. It is assumed that each priority is a priority in the prior art TAG, 802.1p, or 802.1q. In case of the 802.1q VLAN, a priority is defined according to priority information in a VLAN tag. In case of the TOS-base VLAN, a priority is defined according to TOSbit. In case of the 802.1d VLAN, a priority is defined according to a MAC address and a port number.

As shown in FIG. 29, VILAN information may be defined by a predetermined correspondence table so that priority orders for transmission and reception between the wireless LAN and the priority LAN can be made correspond to the VILAN information. The VILAN information is VLAN information in a wider sense. The VILAN information includes L2VLAN information, L3VLAN information, application VLAN information and the like. Namely, wired LAN-side QoS information and VILAN information of the access point device may be transferred as codec information.

The tenth embodiment is also applicable to the gateway and the inter-LAN connecting device to be described later.

Eleventh Embodiment

Figure 30:
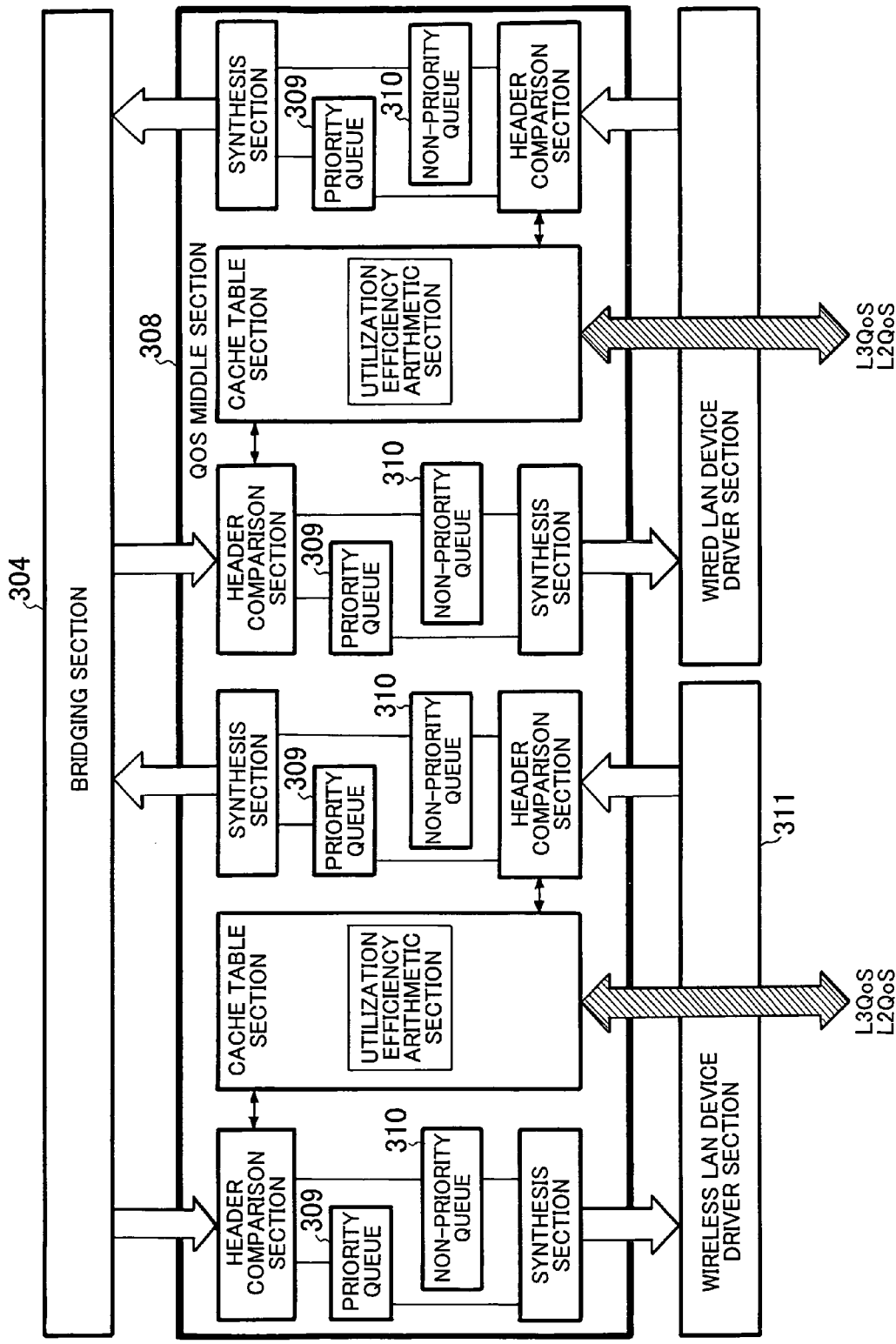
FIG. 30 is a block diagram illustrating the configuration of a QoS middle section in the eleventh embodiment of the present invention.

As shown in FIG. 30, the priority queue 309 and the non-priority queue 310 are similarly provided in the QoS middle section 308. An IP packet having a high priority is fed to the priority queue 309 and an IP packet having a low priority is fed to the non-priority queue 310, thereby preferentially routing the IP packet having the high priority. It is assumed that each priority is a priority in the wireless LAN or the wired LAN. More specifically, in case of the 802.1q VLAN, a priority is defined according to priority information in a VLAN tag. In case of the TOS-base VLAN, a priority is defined according to TOSbit. In case of the 802.1d VLAN, a priority is defined according to a MAC address and a port number.

As shown in FIG. 30, if an RTP without QoS transmitted from the wireless LAN has a predetermined header or an RTP without QoS is transmitted from a predetermined wireless terminal, the bridging section 304 of the access point device may allocate QoS information to the RTP when a packet is transmitted from the LAN side so as to secure voice or stream information. For example, if a wireless LAN device driver section 311 receives voice data from a voice information terminal, TOSbit is added to a packet to secure the priority of the packet and then transmits the voice data to WAN. If the wireless LAN device driver section 311 receives voice data from the voice information terminal and the priority of the packet is designated by 802.1p, 802.1q or 802.1d, the priority is secured as TOS or VLAN of the third OSI layer or more since priority information on the MAC address is lost when the packet is transferred to WAN.

As for both the data transmitted from the wireless LAN to the wired LAN and the data from the wired LAN to the wireless LAN, when weights are given to the respective pieces of data, the bridging section 304 may make QoS weights given to the wireless LAN and the wired LAN correspond to respective header information with QoS weights given to the wireless LAN and the wired LAN to correspond to header information set as a standard of judgment. Alternatively, a priority order defined by 802.11e may be made correspond to a transmission order QoS.

As shown in FIG. 26, the operation for controlling the number of codec signal inserted into one wireless LAN frame so that the number of wireless LAN frames is equal to or smaller than a certain value is referred to as "packet number QoS" in the present invention. By associating the packet number QoS with QoS's (such as I2TP, PPTP, 802.1p, 802.1q, IPsec, etc.) of the second and third OSI layers, packet loss is prevented.

The eleventh embodiment is also applicable to the gateway and the inter-LAN connecting device to be described later.

Twelfth Embodiment

Figure 31:
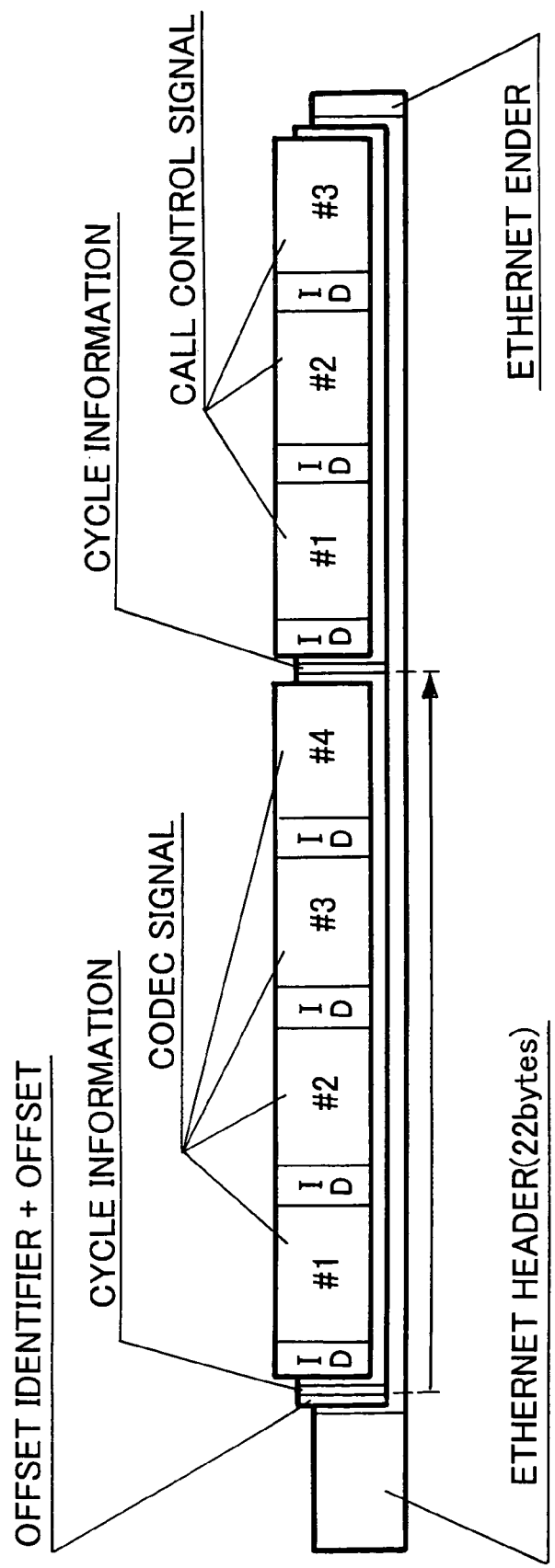
FIG. 31 illustrates a format of a packet in the twelfth embodiment of the present invention.

As shown in FIG. 31, call control information transmitted and received from and by the codec section is inserted into the custom compressed frame to decrease the number of wireless LAN frames, thereby preventing the packet loss.

In addition, only the wireless LAN frame that includes a plurality of codec signals is forced to be retransmitted until an acknowledgement is issued in the wireless LAN, thereby improving an arrival rate.

The twelfth embodiment is also applicable to the gateway and the inter-LAN connecting device to be described later.

Thirteenth Embodiment

In the thirteenth embodiment, a compressed packet is transmitted between the access points, between the inter-LAN connecting devices or between the gateways.

Figure 32:
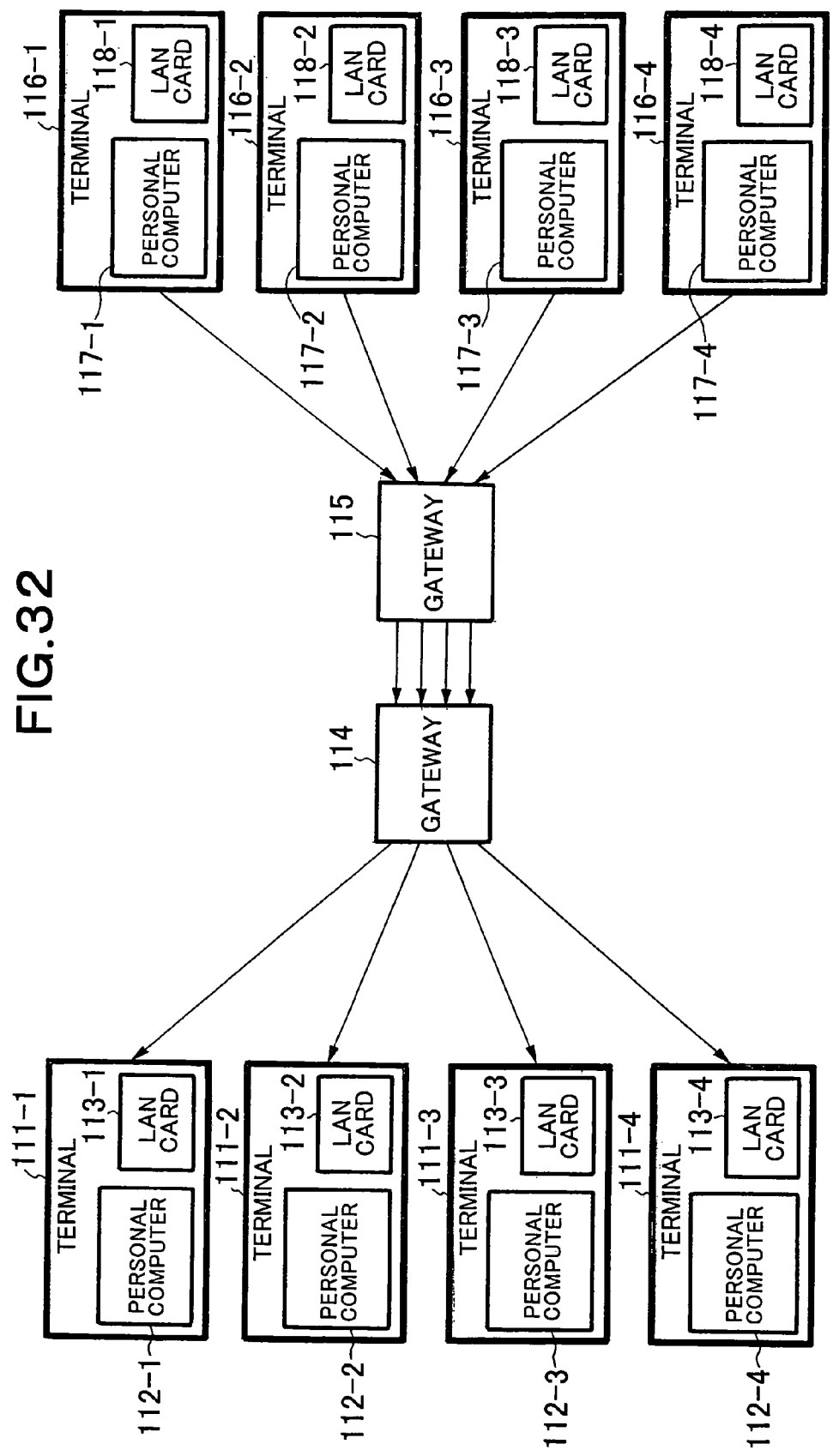
FIG. 32 is a block diagram illustrating the configuration of a system which includes a packet compression system and a packet restoration system in the thirteenth embodiment of the present invention.

FIG. 32 illustrates the configuration of the system that includes a packet compression system and a packet restoration system in the thirteenth embodiment. Referring to FIG. 13, gateways 114 and 115 are connected to each other by the LAN, WAN, VLAN or the like. Terminals 111-1 to 111-4 are connected to the gateway 114. Terminals 116-1 to 116-4 are connected to the gateway 115. Each terminal 111-$i$ includes a personal computer 112-$i$ and a LAN card 113-$i$ connected to the personal computer 112-$i$. Likewise, each terminal 116-$i$ includes a personal computer 117-$i$ and a LAN card 118-$i$ connected to the personal computer 117-$i$. For example, the terminals 111-1 to 111-4 and the gateway 114 are located in a company head office in Tokyo whereas the terminals 116-1 to 116-4 and the gateway 117 are located in a company branch office in Osaka. Alternatively, all of the terminals and the gateways may be located in the Tokyo head office.

Figure 33:
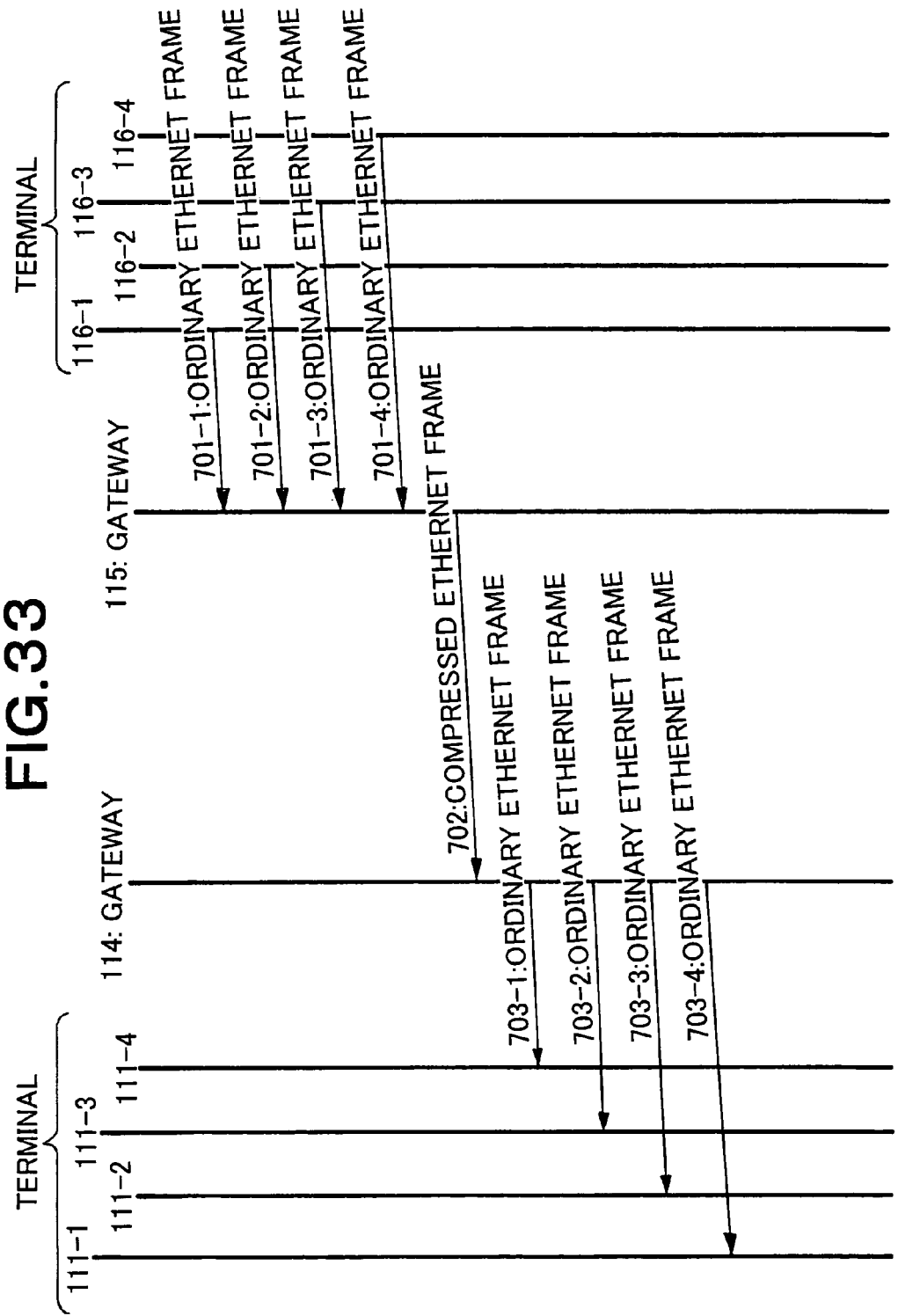
FIG. 33 is a sequence diagram illustrating Ethernet frames transmitted from terminals and Ethernet frames transmitted from gateways in the thirteenth embodiment of the present invention.

Referring to FIG. 33, the terminals 116-1 to 116-4 transmit ordinary Ethernet frames 701-1 to 701-4 to the gateway 115. The gateway 115 generates a compressed Ethernet frame 702 based on the ordinary Ethernet frames received from the respective terminals 116-1 to 116-4, and transmits the generated Ethernet frame 702 to the gateway 114. The gateway 114 generates ordinary Ethernet frames 703-1 to 703-4 based on the compressed Ethernet frame 702 received from the gateway 115, and transmits the generated ordinary Ethernet frames 703-1 to 703-4 to the terminals 111-1 to 111-4.

Figure 34:
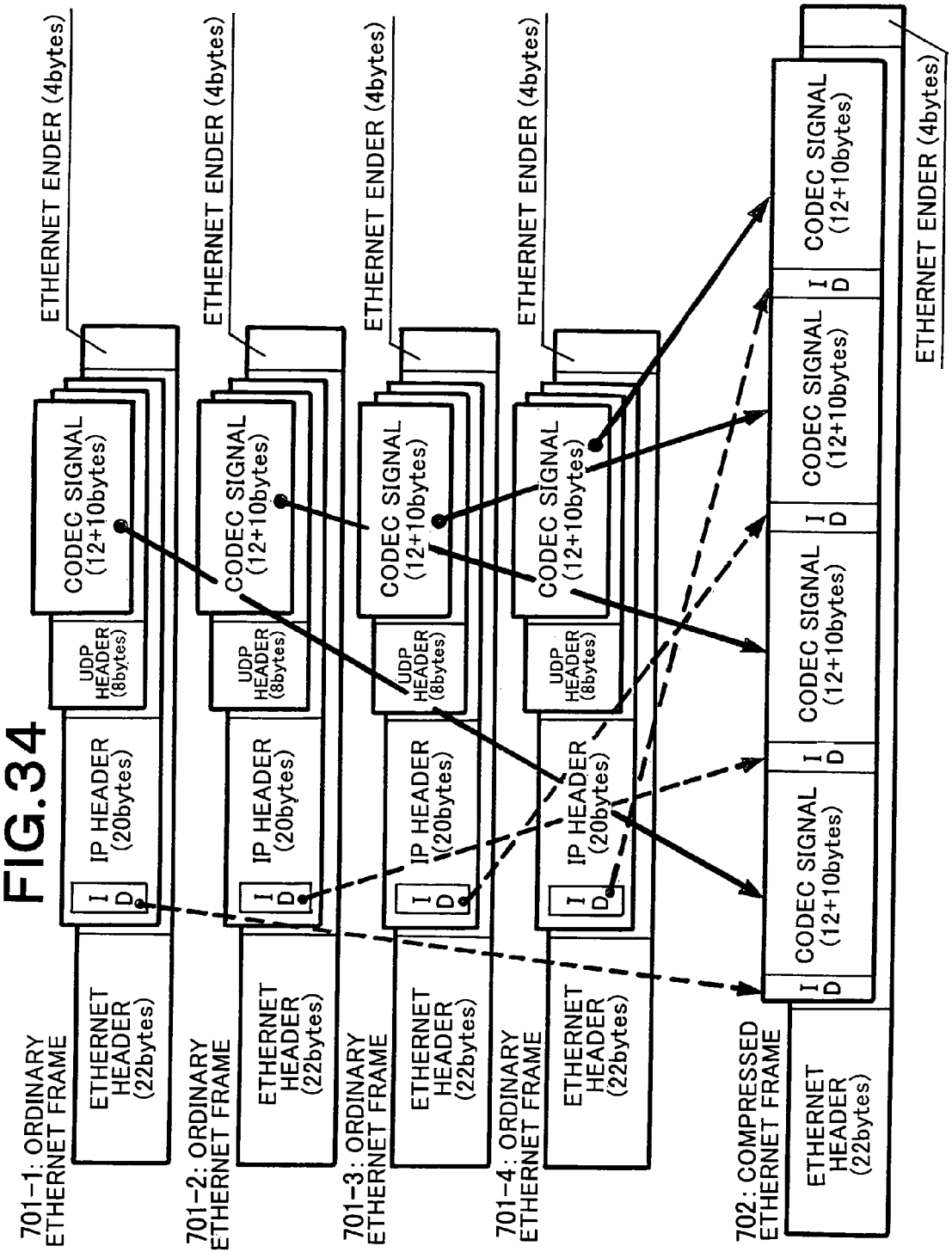
FIG. 34 illustrates format of the Ethernet frames transmitted from the terminals and format of the Ethernet frames transmitted from the gateways in the thirteenth embodiment of the present invention.

Referring to FIG. 34, each of the ordinary Ethernet frames 701-1 to 701-4 consists of an Ethernet header, an Ethernet payload, and an Ethernet ender. An IP packet that consists of an IP header and an IP payload is inserted into the Ethernet payload. A UDP packet that consists of a UDP header and a codec signal is inserted into the IP payload. The IP header includes an identifier (ID) of the IP packet.

The compressed Ethernet frame 702 consists of an Ethernet header, an Ethernet payload, and an Ethernet ender. Identifiers (ID's) of the IP packets and the codec signals included in the ordinary Ethernet frames 701-1 to 701-4 are directly inserted into the Ethernet payload of the compressed Ethernet frame 702 without interposition of the IP packets and the UDP packets.

The ordinary Ethernet frames 703-1 to 703-4 are equal in structure to the ordinary Ethernet frames 701-1 to 701-4.

The IP header of the ordinary Ethernet frame that includes the codec signal addressed to the terminal 111-1 is fixed except for the identifier (ID), and the UDP header thereof is also fixed. Therefore, if detecting the ordinary Ethernet frame including the codec signal addressed to the terminal 111-1, the gateway 114 stores the IP header (excluding the identifier (ID)) and the UDP header included in the ordinary Ethernet frame and transmits a compression request, accompanied with designation of the IP address and the port number of the compressed Ethernet frame including the codec signal addressed to the terminal 111-1, to the gateway 115. The gateway 115 transmits an acknowledgement, to which a slot number of a slot into which the codec signal addressed to the terminal 111-1 and the identifier (ID) are inserted in the compressed Ethernet frame is added, to the gateway 114 in response to the compression request. The gateway 115 extracts the identifier (ID) in the IP header and the codec signal from the ordinary Ethernet frame 701-1 addressed to the terminal 111-1, inserts the extracted identifier and the codec signal into the slot of the compressed Ethernet frame the number of which slot is notified to the gateway 114, and transmits the compressed Ethernet frame 702 to the gateway 114. When receiving the compressed Ethernet frame 702, the gateway 114 extracts the identifier (ID) and the codec signal from the slot of the compressed Ethernet frame 702 the number of which slot is notified by the gateway 115, generates the ordinary Ethernet frame 703-1 based on the extracted identifier and codec signal as well as the IP header (excluding the identifier (ID)) and the UDP header that the gateway 114 stored in advance, and transmits the generated ordinary Ethernet frame 703-1 to the terminal 111-1.

The Ethernet frames including the codec signals addressed to the respective terminals 111-2 to 111-4 are similarly transmitted.

In this way, the number of Ethernet frames transmitted between the gateways 114 and 115 can be decreased.

In the above description, the Ethernet is employed as the second OSI layer. However, PPP, ATM, frame relay or the like may be employed in place of the Ethernet. In addition, both the Ethernet frames transmitted from the terminals 116-1 to 116-4 to the gateway 115 and those transmitted from the gateway 114 to the terminals 111-1 to 111-4 may be compressed similarly to those in the preceding embodiments.

In addition, the compressed Ethernet frame may be the custom compressed Ethernet frame as shown in FIG. 19. In this case, the gateway 115 generates the cycle information to be inserted into the custom compressed Ethernet frame by the method as shown in FIGS. 21A and 21B.

Fourteenth Embodiment

The thirteenth embodiment has been described on the premise that the gateways 114 and 115 belong to the same sub-net. Accordingly, a packet that does not include the IP packet can be transmitted from the gateway 115 to the gateway 114 by employing the MAC address which can be known in the sub-net.

The fourteenth embodiment, by contrast, is premised on a case in which a sub-net to which the gateway 114 belongs differs from a sub-net to which the gateway 115 belongs.

Figure 35:
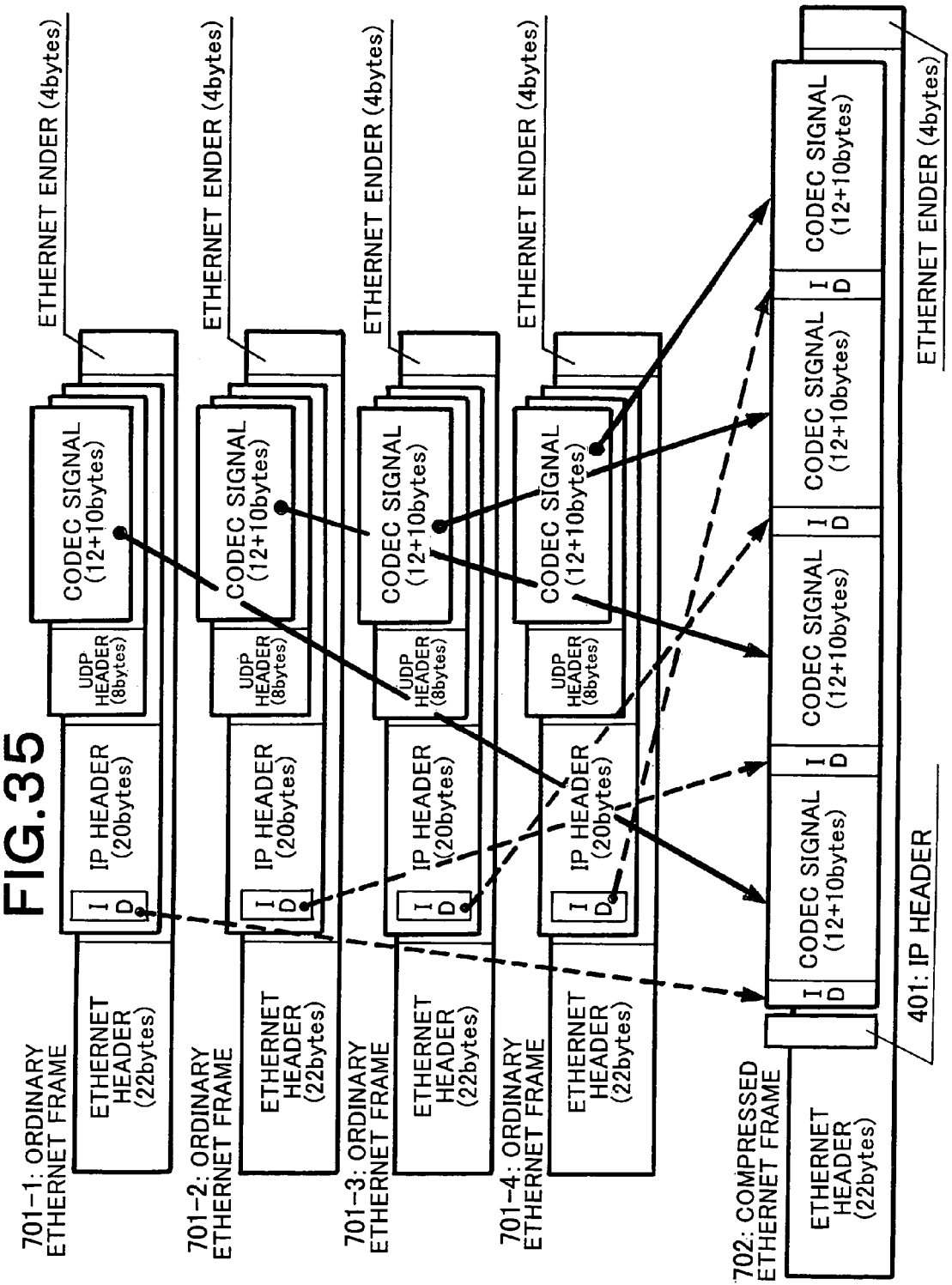
FIG. 35 illustrates formats of Ethernet frames transmitted from terminals and formats of Ethernet frames transmitted from gateways in the fourteenth embodiment of the present invention.

In that case, as shown in FIG. 35, an IP header 401 in which an IP address of the gateway 114 is set as a destination IP address is inserted into the payload of the compressed Ethernet frame 702. By doing so, routing from the gateway 115 to the gateway 114 can be made.

Fifteenth Embodiment

In the thirteenth embodiment, the ordinary Ethernet frames transmitted from a plurality of terminals 116-1 to 116-4 to a plurality of terminals 111-1 to 111-4 are compressed between the gateways 114 and 115.

In the fifteenth embodiment, by contrast, ordinary Ethernet frames transmitted from the single terminal 116-1 to the single terminal 111-1 are compressed between the gateways 114 and 115.

Figure 36:
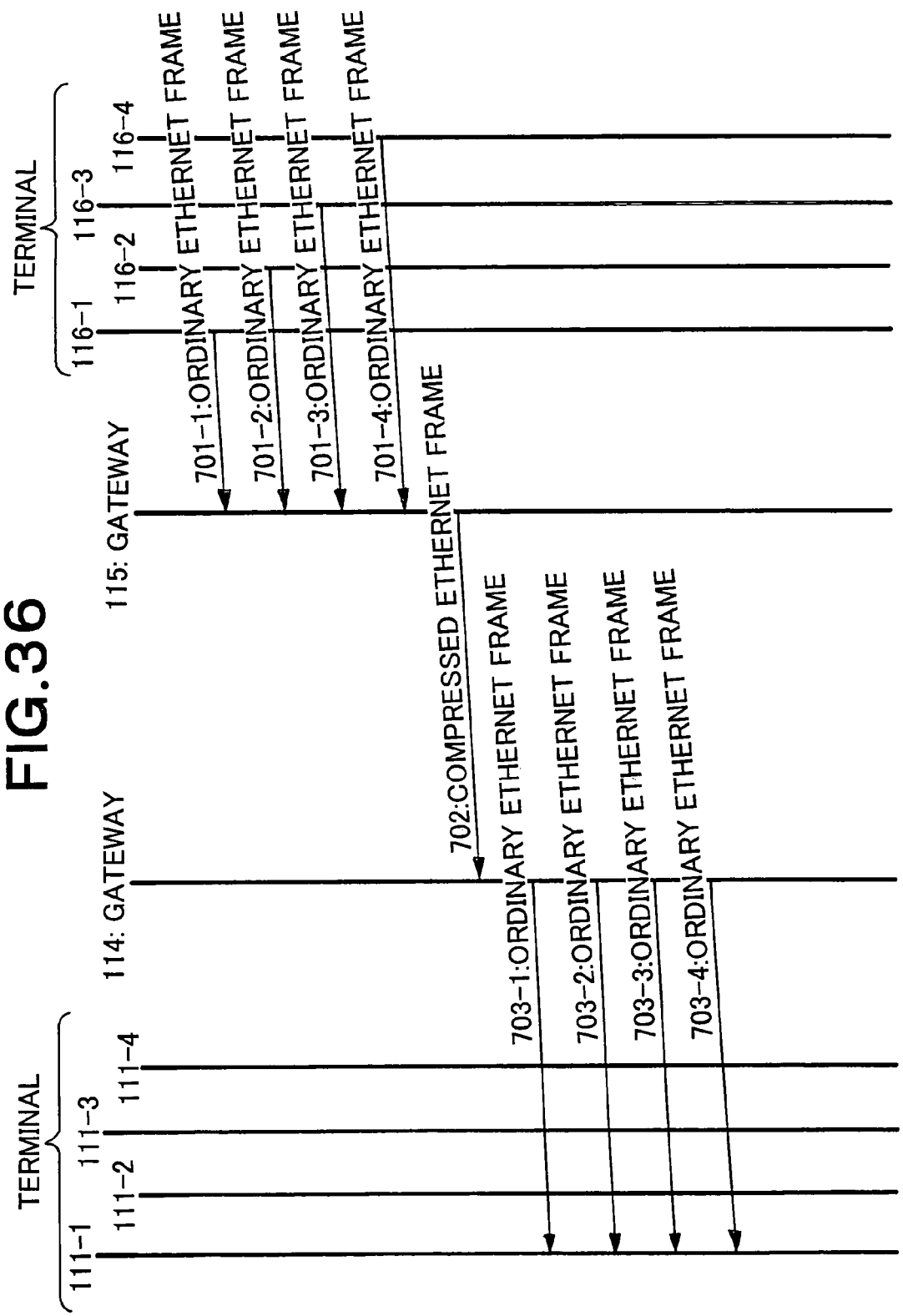
FIG. 36 is a sequence diagram illustrating Ethernet frames transmitted from terminals and formats of Ethernet frames transmitted from gateways in the fifteenth embodiment of the present invention.

FIG. 36 illustrates a sequence in the fifteenth embodiment. As is obvious from the comparison of the sequence diagram of FIG. 36 with the sequence diagram of FIG. 13, the fifteenth embodiment differs from the thirteenth embodiment in that all of the ordinary Ethernet frames 701-1 to 701-4 are transmitted from the terminal 116-1 and that all of the ordinary Ethernet frames 703-1 to 703-4 are received by the terminal 116-1.

Formats of the ordinary Ethernet frames 701-1 to 701-4 and 703-1 to 703-4 and the compressed Ethernet frame 702 are the same as those in the thirteenth embodiment as shown in FIG. 34.

Sixteenth Embodiment

In the sixteenth embodiment, the change of the fourteenth embodiment from the thirteenth embodiment and the change of the fifteenth embodiment from the thirteenth embodiment are added to the thirteenth embodiment. That is, as shown in the sequence diagram of FIG. 36, on premise that the sub-net to which the terminal 111-1 and the gateway 114 belong differs from the sub-net to which the terminal 116-1 and the gateway 115 belong, the ordinary Ethernet frames transmitted from the terminal 116-1 to the terminal 111-1 are compressed between the gateways 114 and 115.

In this case, the format of the compressed Ethernet frame 702 is the same as that described in the thirteenth embodiment and shown in FIG. 35. In the sixteenth embodiment, the destination IP address in the IP header 401 is the IP address of the terminal 111-1. However, if the gateway 114 grasps the IP address or MAC address of the terminal 111-1, the destination IP address in the IP header 401 may be the IP address of the gateway 114.

Seventeenth Embodiment

In the seventeenth embodiment, Ethernet frames transmitted from a multimedia server to terminals are compressed.

Figure 37:
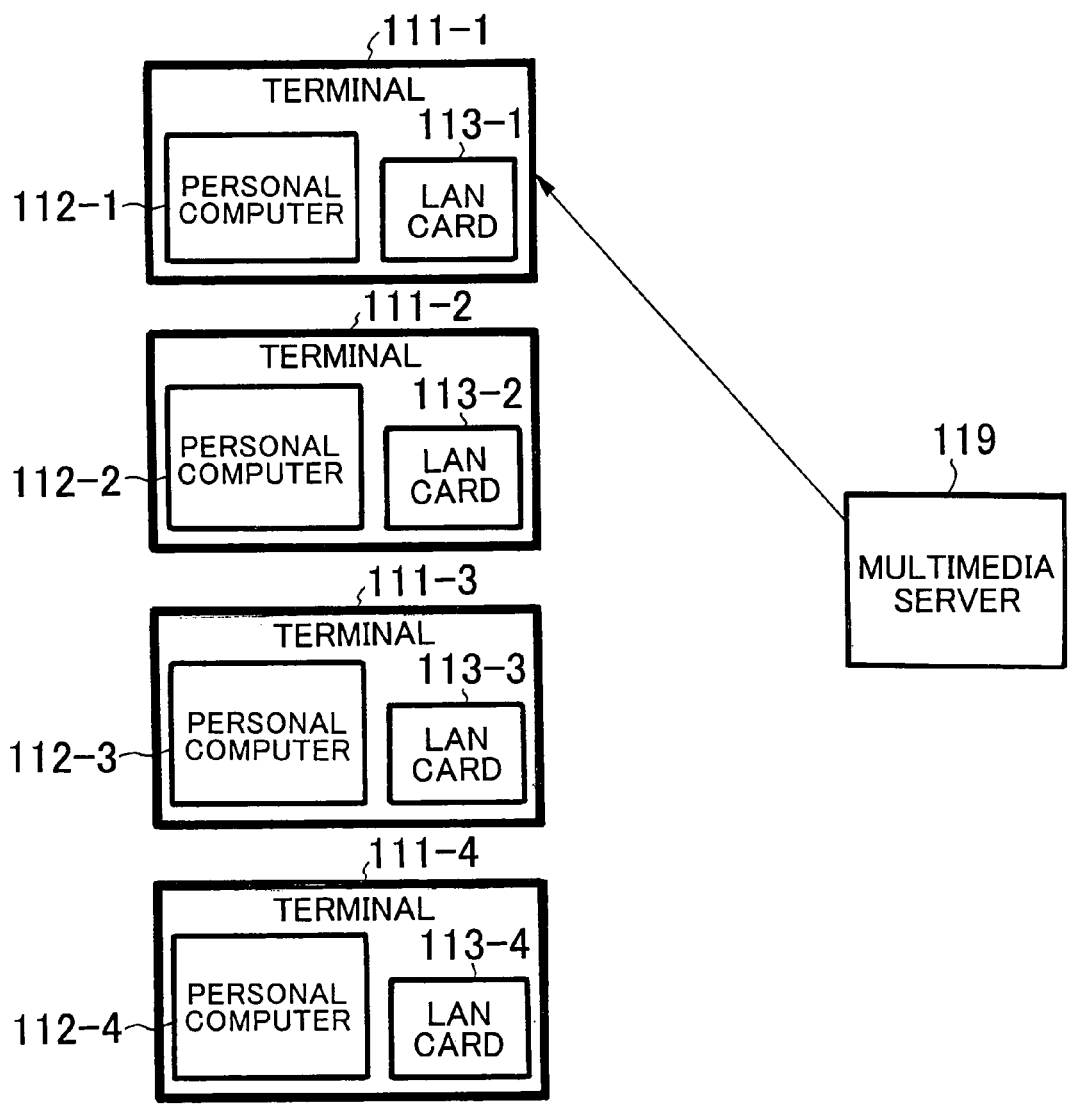
FIG. 37 is a block diagram illustrating the configuration of a system which includes a packet compression system in the seventeenth embodiment of the present invention.

FIG. 37 illustrates the configuration of the system that includes a packet compression system in the seventeenth embodiment. Referring to FIG. 37, the terminal 111-1 is connected to a multimedia server 119.

Figure 38:
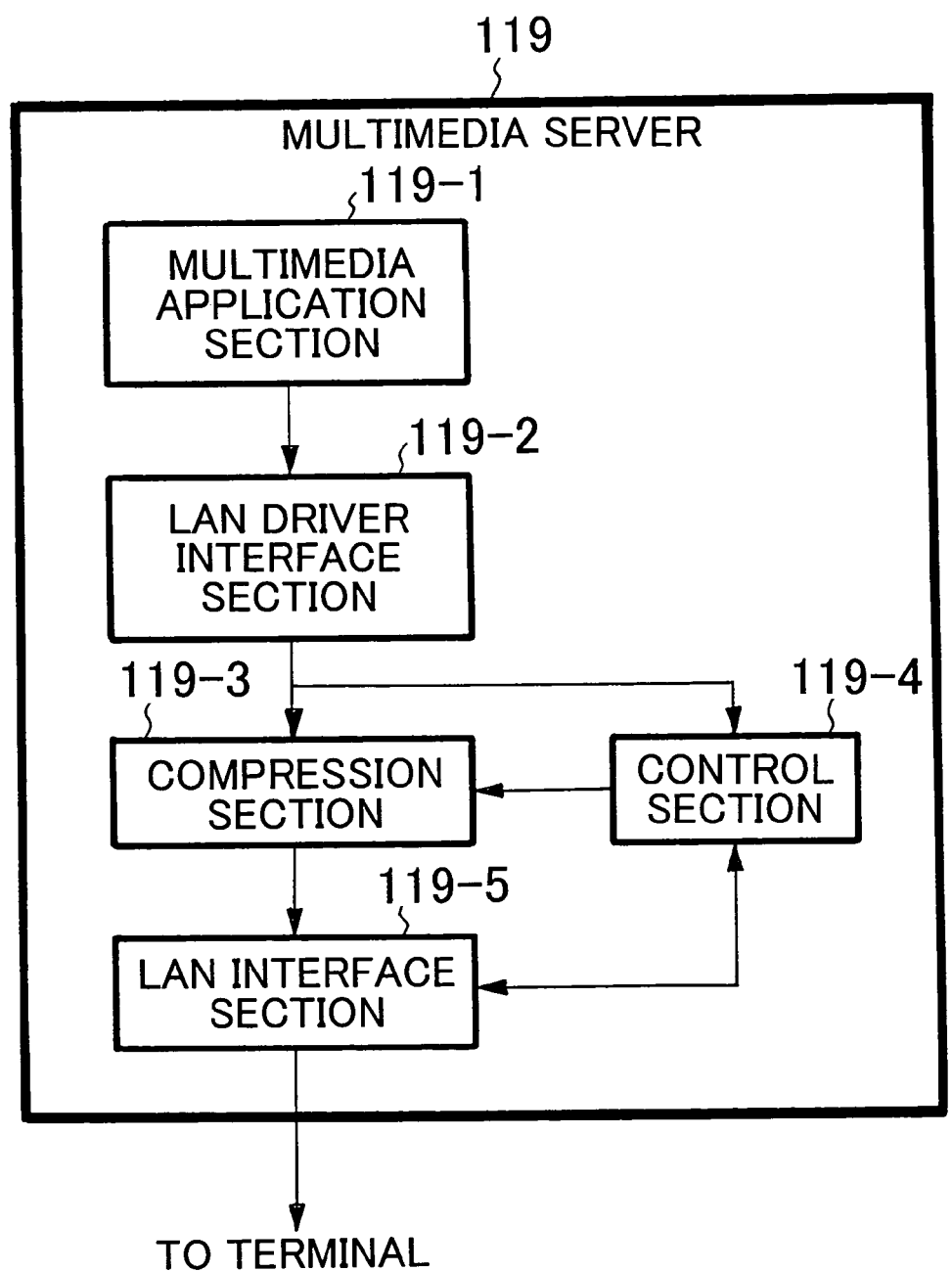
FIG. 38 is a block diagram illustrating the configuration of a multimedia server in the seventeenth embodiment of the present invention.

Similarly to the wireless terminal 101, the terminal 111-1 has the configuration shown in FIG. 4. As shown in FIG. 38, the multimedia server 19 includes a multimedia application section 119-1, a LAN driver interface section 119-2, a compression section 119-3, a control section 119-4, and a LAN interface section 119-5.

Figure 39:
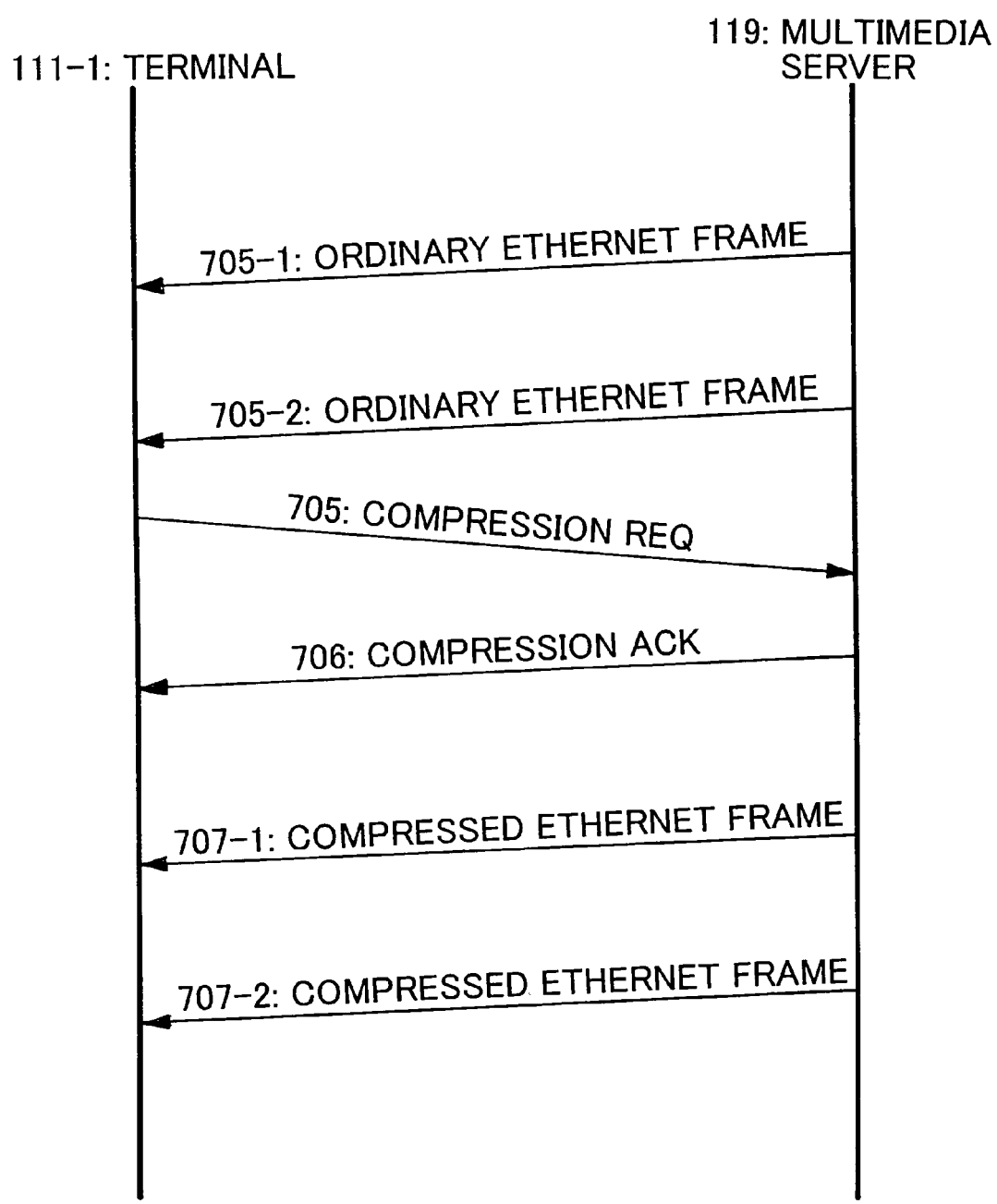
FIG. 39 is a sequence diagram illustrating Ethernet frames transmitted from the multimedia server and signals for a negotiation to start compression in the seventeenth embodiment of the present invention.

Referring to FIG. 39, first, the multimedia server 119 sequentially transmits ordinary Ethernet frames 705-1 and 705-2 to the terminal 111-1. When the terminal 111-1 receives the ordinary Ethernet frames 705-1 and 705-2, the header comparison section 214 (see FIG. 4) of the terminal 111-1 detects whether the ordinary Ethernet frames 705-1 and 705-2 include codec signals based on a header value of at least a part of layers 3 to 5 of the ordinary Ethernet frames 705-1 and 705-2. For example, the header comparison section 214 of the terminal 111-1 detects whether the ordinary Ethernet frames 705-1 and 705-2 include codec signals based on (1) whether it is indicated that a header of the layer 4 is a UDP header and that a packet of the layer 5 is an RTP packet, and (2) whether headers of the layers 3 to 5 of the ordinary Ethernet frame 705-1 coincide with those of the layers 3 to 5 of the ordinary Ethernet frame 705-2.

If the header comparison section 214 (see FIG. 4) of the terminal 111-1 detects that the ordinary Ethernet frames 705-1 and 705-2 include codec signals, the compression request transmission section 212 (see FIG. 4) of the terminal 111-1 transmits a compression request 705 to the control section 119-4 of the multimedia server 119. This compression request includes designation of the IP address and port number of the ordinary Ethernet frames 705-1 and 705-2.

When receiving the compression request 705, the control section 119-4 transmits a compression acknowledgement 706 to the restoration section 213 of the terminal 111-1.

Thereafter, the compression section 119-3 of the multimedia server 119 deletes the IP header and the UDP header of the IP packet and the UDP packet, respectively (including the IP address and port number included in the compression request) transmitted from the multimedia application server 119-1 through the LAN driver interface section 119-2, and extracts codec signals and identifiers (ID's) in the IP headers. The LAN interface section 119-5 sequentially generates compressed Ethernet frames 707-1 and 707-2 in which the codec signals and the identifiers (ID's) transmitted from the compression section 119-3 are directly inserted into payloads, respectively, and transmits the generated compressed Ethernet frames 707-1 and 707-2 to the terminal 111-1. Formats of the compressed Ethernet frames 707-1 and 707-2 are the same as that of the compressed Ethernet frame 605 shown in FIG. 6.

When the terminal 111-1 sequentially receives the compressed Ethernet frames 707-1 and 707-2, the restoration section 213 (see FIG. 4) of the terminal 111-1 restores IP packets based on the IP header (excluding the identifiers (ID's)) and UDP header stored in the header comparison section 214 before the start of compression as well as the identifiers (ID's) and the codec signals included in the compressed Ethernet frames 707-1 and 707-2.

The compression request may include the MAC address of the terminal 111-1 instead of the designation of the IP address and port number. In this case, the multimedia server 119 searches for the latest Ethernet frame among the Ethernet frames each having the MAC address that is included in the compression request as a destination address and including a codec signal, extracts the IP address and port address included in the latest Ethernet frame, and thereafter compresses the Ethernet frame and later Ethernet frames each including the IP address and port number.

Further, the multimedia server 119 may voluntarily start compression instead of starting compression in response to the compression request transmitted from the terminal 111-1. By doing so, it is possible to deal with a case in which the application server 119 does not have a function of instructing the start of compression. In this case, the same section as the header comparison section 214 (see FIG. 4) of the terminal 111-1 is provided in the multimedia server 119 to detect whether the ordinary Ethernet frames 705-1 and 705-2 include codec signals. For example, based on (1) whether it is indicated that the header of the layer 4 has a UDP and that the header of the layer 5 has an RTP, (2) whether it is indicated that both the ordinary Ethernet frames 705-1 and 705-2 include RTP and that both the frames 705-1 and 705-2 are addressed to the same destination (equal in IP address and port number), and (3) whether it is indicated that sockets (IP addresses, protocol number, and port numbers) of the frames are the same, it is detected whether the ordinary Ethernet frames 705-1 and 705-2 include codec signals. This detection may include a determination as to whether a sub-net of the destination IP address is the same as the sub-net to which the multimedia server 119 belongs so as to start only compression within the own sub-net which does not required relay by a router. When it is detected that the ordinary Ethernet frames 705-1 and 705-2 include codec signals, the multimedia server 119 notifies the terminal 111-1 of the start of compression. This notification includes designation of the IP addresses and port numbers of the ordinary Ethernet frames 705-1 and 705-2. The terminal 111-1 that receives this notification specifies the ordinary Ethernet frames 705-1 and 705-2 based on the IP addresses and port numbers included in the notification, and stores the IP header and UDP header of the ordinary Ethernet frame 705-2 that has been temporarily stored in the header storage section 215 (see FIG. 4) after reception of it.

If a packet which is addressed to the other sub-net and therefore requires to be relayed by the router is to be compressed, the IP header including the IP address of the destination terminal and the UDP header are deleted and then the IP header including the IP address of the device which will expand the compressed packet is added. It is thereby possible to transfer the compressed packet between the sub-nets.

When a packet which has the same IP header (excluding the identifier (ID)) and UDP header as the IP header (excluding the identifier (ID)) and UDP header of the packet that have been compressed so far has not transmitted from the multimedia application section 119-1 for a certain period, the control section 119-4 determines that compression should be stopped and causes the compression section 119-3 to stop compression.

The multimedia server 119 may be replaced by a VoIP gateway or a VoIP client. Further, in the above description, the second layer employs the Ethernet. Alternatively, the second layer may employ the PPP, the ATM, the frame relay or the like. In addition, voice or picture multimedia data other than the RTP-based data may be compressed or cyclic data other than the multimedia data may be compressed.

Furthermore, if the LAN driver interface section 119-2 handles not the second OSI layer but the third and fourth OSI layers, the compression section 119-3 and the control section 119-4 are located below the LAN driver interface section 119-2 as shown in FIG. 38. However, if the LAN driver interface section 119-2 handles the second OSI layer, the compression section 119-3 and the control section 119-4 are located above the LAN driver interface section 119-2.

It is permitted that the codec signals supplied from the multimedia application section 119-1 to the compression section 119-3 and the control section 119-4 through the LAN driver interface section 119-2 do not have the UDP and IP headers attached thereto. In this case, the control section 119-4 detects that no UDP/IP header is added to each codec signal, and determines that the codec signal should pass through the compression section 119-3 without being compressed and transmits an instruction of inhibiting compression to the compression section 119-3. In response to this instruction, the compression section 119-3 causes the codec signal to pass through without being compressed.

According to the fourteenth embodiment, communication data quantity can be reduced by deleting the IP headers and UDP headers.

Eighteenth Embodiment

In the seventeenth embodiment, the multimedia server transmits the compressed Ethernet frames only to one terminal. In the eighteenth embodiment, the multimedia server unicasts or multicasts compressed Ethernet frames to a plurality of terminals.

Figure 40:
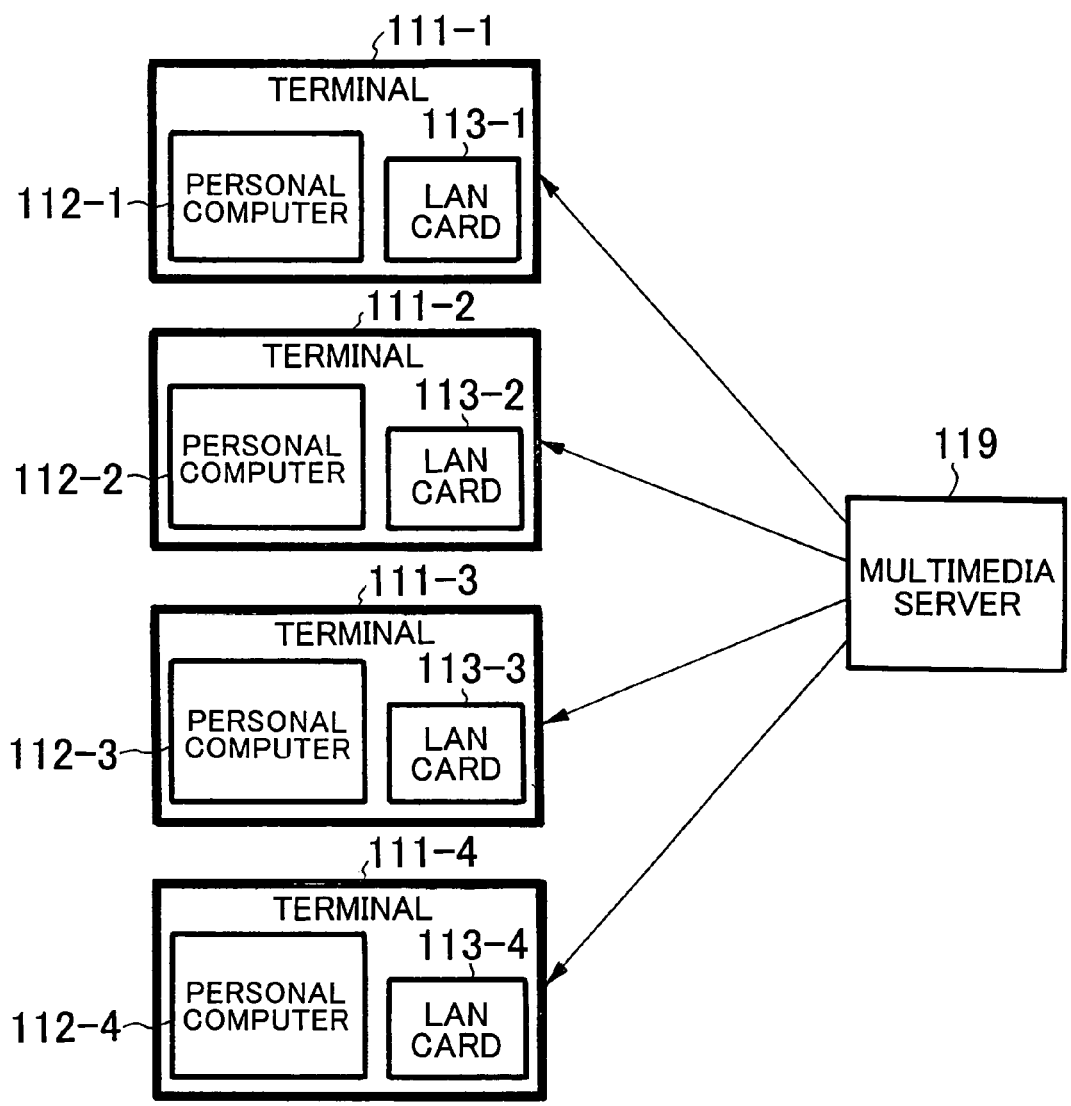
FIG. 40 is a block diagram illustrating the configuration of a system that includes a packet compression system in the eighteenth embodiment of the present invention.

FIG. 40 illustrates the configuration of the system that includes a packet compression system in the eighteenth embodiment. Referring to FIG. 40, the terminals 111-1 to 111-4 are connected to the multimedia server 119.

The terminals 111-1 to 111-4 have the same configuration as the wireless terminal 101 shown in FIG. 4. The multimedia server 119 has the same configuration as that in the fourteenth embodiment shown in FIG. 38.

A format of the compressed Ethernet frame which the multimedia server 119 unicasts or multicasts to the terminals 111-1 to 111-4 is equal to the format of the compressed Ethernet frame 627 shown in FIG. 11.

In the preceding embodiments, the UDP/IP has been described as the third and fourth OSI layers by way of examples. However, the present invention is applicable to any types of the third and fourth OSI layers. For example, the present invention is applicable even if Apple Talk, IEEE1394 over Ethernet or the like is employed as the third and fourth OSI layers. In addition, if TCP/IP is employed instead of the UDP/IP so as to enable retransmission, the UDP in the description is all replaced by the TCP.

It is finally noted that the Ethernet® is the registered trademark.

The present invention can be used for communication between devices using the LAN, the Internet or the like.

What is claimed is:

1. A packet compression system comprising:
reception means for receiving at least one uncompressed packet, the uncompressed packet including a header and a payload of a second OSI layer, the payload of said second OSI layer including a header and a payload of a third OSI layer, the payload of said third OSI layer including a header and a payload of a fourth OSI layer, the payload of said fourth OSI layer including a codec signal;
compression means for generating a compressed packet in which at least one said codec signal is inserted into the payload of said second layer without interposition of said third OSI layer and said fourth OSI layer by deleting the header of said third OSI layer and the header of said fourth OSI layer from said uncompressed packet; and
transmission means for transmitting said compressed packet,
wherein said compression means adjusts the number of codec signals inserted into the payload of said second OSI layer of said compressed packet so that the number of said compressed packets transmitted from said transmission means per unit time does not exceed a predetermined value irrespectively of the number of said uncompressed packets received by said reception means per unit time.

2. The packet compression system according to claim 1, further comprising:
detection means for detecting the uncompressed packet in which the codec signal is inserted into the payload of the fourth OSI layer, wherein
said compression means generates said compressed packet based on the uncompressed packet of which said detection means detects that the codec signal is inserted into the payload of said fourth OSI layer.

3. The packet compression system according to claim 2, wherein
said detection means detects the uncompressed packet of which the codec signal is inserted into the payload of said fourth OSI layer at least based on a content of the header of the third OSI layer of the uncompressed packet and a content of the header of the fourth OSI layer of the uncompressed packet.

4. The packet compression system according to claim 1, further comprising:
notification reception means for receiving a notification of specific information on the uncompressed packet that should be transformed to the compressed packet, from a device comprising a packet restoration system, wherein
said compression means generates said compressed packet based on the uncompressed packet of which the notification is received from the device comprising said packet restoration system.

5. The packet compression system according to claim 1, further comprising:
insertion means for inserting an IP address of a device comprising a packet restoration system into the payload of the second OSI layer of said compressed packet.

6. The packet compression system according to claim 1, wherein said compression means further deletes a fixed part of a header of the codec signal.

7. The packet compression system according to claim 1, wherein
said reception means receives a plurality of uncompressed packets, each of which is addressed to each of a plurality of network terminals,
said compression means generates the compressed packet in which at lest two said codec signals are inserted into the payload of said second OSI layer without interposition of said third OSI layer and said fourth OSI layer, and
said transmission means transmits said compressed packet to the plurality of network terminals.

8. The packet compression system according to claim 1, wherein
said compression means makes the header of said second OSI layer of said compressed packet differ from the header of said second OSI layer of said uncompressed packet.

9. The packet compression system according to claim 8, further comprising:
means for detecting a cycle of said codec signal, wherein information on the detected cycle is inserted into a header other than the header of said second OSI layer of said uncompressed packet.

10. The packet compression system according to claim 1, wherein
said compression means extracts information varying for every uncompressed packet, the extracted information having been included in the header of said third OSI layer of said uncompressed packet, and inserts the extracted information into the payload of said second OSI layer of said compressed packet without interposition of said third OSI layer and said fourth OSI layer.

11. The packet compression system according to claim 1, wherein
the packet compression system is provided in each of a plurality of terminals, and
the packet compression system further comprises adjustment means for adjusting a timing for transmitting said compressed packet between the terminals.

12. The packet compression system according to claim 11, wherein
said adjustment means adjusts the timing for transmitting said compressed packet between the terminals based on a synchronization signal transmitted to each of the terminals and a slot number allocated to each of the terminal.

13. The packet compression system according to claim 1, wherein
said compression means inserts codec signals having different cycles into said compressed packet, inserts cycle information for each of the cycles, and integrates said cycle information and the codec signals for each of the cycles.

14. The packet compression system according to claim 1, wherein
said compression means inserts cycle information indicating a cycle of said codec signal into the payload of said second OSI layer of said compressed packet.

15. The packet compression system according to claim 1, further comprising:
control means for controlling one of a codec section and a VoIP section provided on an uncompressed packet transmission side to decrease a communication volume of said codec signal when the number of said compressed packets transmitted per unit time reaches a predetermined limit thereof and the number of codec signals included in each of the compressed packets reaches a predetermined limit thereof.

16. The packet compression system according to claim 1, wherein
said compression means inserts a call control signal into the payload of said second OSI layer of said compressed packet without interposition of said third OSI layer and said fourth OSI layer.

17. The packet compression system according to claim 1, further comprising:
means for calculating a transmission cycle of said compressed packet based on a reception cycle of said uncompressed packet.

18. The packet compression system according to claim 1, further comprising:
means for making a QoS of said compressed packet correspond to a QoS of said uncompressed packet.

19. A packet compression method comprising:
a reception step of receiving at least one uncompressed packet, the uncompressed packet including a header and a payload of a second OSI layer, the payload of said second OSI layer including a header and a payload of a third OSI layer, the payload of said third OSI layer including a header and a payload of a fourth OSI layer, the payload of said fourth OSI layer including a codec signal;
a compression step of generating a compressed packet in which at least one said codec signal is inserted into the payload of said second layer without interposition of said third OSI layer and said fourth OSI layer by deleting the header of said third OSI layer and the header of said fourth OSI layer from said uncompressed packet; and
a transmission step of transmitting said compressed packet,
wherein in said compression step, the number of codec signals inserted into the payload of said second OSI layer of said compressed packet is changed with passage of time so that the number of said compressed packets transmitted per unit time in said transmission step does not exceed a predetermined value irrespectively of the number of said uncompressed packets received per unit time in said reception step.

20. The packet compression method according to claim 19, further comprising:
a detection step of detecting the uncompressed packet of which the codec signal is inserted into the payload of the fourth OSI layer, wherein in said compression step, said compressed packet is generated based on the uncompressed packet for which said detection means detects that the codec signal is inserted into the payload of said fourth OSI layer.

21. The packet compression method according to claim 19, wherein
in said detection step, the uncompressed packet of which the codec signal is inserted into the payload of said fourth OSI layer is detected at least based on a content of the header of the third OSI layer of the uncompressed packet and a content of the header of the fourth OSI layer of the uncompressed packet.

22. The packet compression method according to claim 19, further comprising:
a notification reception step of receiving a notification of specific information on the uncompressed packet that should be transformed to the compressed packet, from a device comprising a packet restoration system, wherein
in said compression step, said compressed packet is generated based on the uncompressed packet of which the notification is received from the device comprising said packet restoration system.

23. The packet compression method according to claim 19, further comprising:
an insertion step of inserting an IP address of a device comprising a packet restoration system into the payload of the second OSI layer of said compressed packet.

24. The packet compression method according to claim 19, wherein in said compression step, a fixed part of a header of the codec signal is further deleted.

25. The packet compression method according to claim 19, wherein
in said reception step, a plurality of uncompressed packets, each of which is addressed to each of a plurality of network terminals are received,
in said compression step, the compressed packet in which at lest two said codec signals are inserted into the payload of said second OSI layer without interposition of said third OSI layer and said fourth OSI layer is generated, and
in said transmission step, said compressed packet is broadcast or multicast to the plurality of network terminals.

26. The packet compression method according to claim 19, wherein
in said compression step, the header of said second OSI layer of said compressed packet is made different from the header of said second OSI layer of said uncompressed packet.

27. The packet compression method according to claim 26, further comprising:
a step of detecting a cycle of said codec signal, wherein information on the detected cycle is inserted into a header other than the header of said second OSI layer of said uncompressed packet.

28. The packet compression method according to claim 19, wherein
in said compression step, information varying for every uncompressed packets is extracted, the extracted information having been included in the header of said third OSI layer of said uncompressed packet, and inserts the extracted information into the payload of said second OSI layer of said compressed packet without interposition of said third OSI layer and said fourth OSI layer.

29. The packet compression method according to claim 19, wherein
the packet compression method is executed by each of a plurality of terminals, and the packet compression method further comprises an adjustment step of adjusting a timing for transmitting said compressed packet between the terminals.

30. The packet compression method according to claim 29, wherein
in said adjustment step, the timing for transmitting said compressed packet between the terminals is adjusted based on a synchronization signal transmitted to each of the terminals and a slot number allocated to each of the terminal.

31. The packet compression method according to claim 19, wherein
in said compression step, codec signals having different cycles are inserted into said compressed packet.

32. The packet compression method according to claim 19, wherein
in said compression step, cycle information indicating a cycle of said codec signal is inserted into the payload of said second OSI layer of said compressed packet.

33. The packet compression method according to claim 19, further comprising:
a control step of controlling one of a codec section and a VoIP section provided on an uncompressed packet transmission side to decrease a communication volume of said codec signal when the number of said compressed packets transmitted per unit time reaches a predetermined limit thereof and the number of codec signals included in each of the compressed packets reaches a predetermined limit thereof.

34. The packet compression method according to claim 19, wherein
in said compression step, a call control signal is inserted into the payload of said second OSI layer of said compressed packet without interposition of said third OSI layer and said fourth OSI layer.

35. The packet compression method according to claim 19, further comprising:
a step of calculating a transmission cycle of said compressed packet based on a reception cycle of said uncompressed packet.

36. The packet compression method according to claim 19, further comprising:
a step of making a QoS of said compressed packet correspond to a QoS of said uncompressed packet.

* * * * *